United States Patent
Smith et al.

(10) Patent No.: US 7,042,631 B2
(45) Date of Patent: May 9, 2006

(54) POWER SCALABLE OPTICAL SYSTEMS FOR GENERATING, TRANSPORTING, AND DELIVERING HIGH POWER, HIGH QUALITY, LASER BEAMS

(75) Inventors: Duane D. Smith, Louisville, CO (US); Wayne S. Pelouch, McKinney, TX (US); Narasimha S. Prasad, Erie, CO (US); Josef Unternährer, Lafayette, CO (US); John Koroshetz, Broomfield, CO (US); Iain McKinnie, Superior, CO (US)

(73) Assignee: Coherent Technologies, Inc., Louisville, CO (US)

( * ) Notice: Subject to any disclaimer, the term of this patent is extended or adjusted under 35 U.S.C. 154(b) by 57 days.

(21) Appl. No.: 10/117,445

(22) Filed: Apr. 5, 2002

(65) Prior Publication Data

US 2003/0063884 A1 Apr. 3, 2003

Related U.S. Application Data

(63) Continuation-in-part of application No. 09/968,974, filed on Oct. 1, 2001, now Pat. No. 6,894,828.

(60) Provisional application No. 60/259,681, filed on Jan. 4, 2001.

(51) Int. Cl.
*H01S 3/00* (2006.01)
*G02B 6/26* (2006.01)
(52) U.S. Cl. .......................... 359/333; 385/27; 385/39
(58) Field of Classification Search ......... 359/333.349; 385/27, 28, 39
See application file for complete search history.

(56) References Cited

U.S. PATENT DOCUMENTS

| | | | |
|---|---|---|---|
| 3,832,029 A | 8/1974 | Bryngdahl | |
| 3,838,908 A | 10/1974 | Channin | |
| 3,963,310 A | 6/1976 | Giallorenzi et al. | |
| 4,087,159 A | 5/1978 | Ulrich | |
| 4,972,427 A | 11/1990 | Streifer et al. | |
| 5,347,377 A | 9/1994 | Revelli, Jr. et al. | |
| 5,379,354 A * | 1/1995 | Jenkins ........................ | 385/46 |

(Continued)

FOREIGN PATENT DOCUMENTS

EP 0363076 A 4/1990

(Continued)

OTHER PUBLICATIONS

Baker H J et al. "Self-Imaging and high beam quality operation in multi-mode planar waveguide optical amplifiers" Optics Express, Mar. 25, 2002 Opt. Soc. America USA vol. 10.

(Continued)

*Primary Examiner*—Mark Hellner
(74) *Attorney, Agent, or Firm*—Cochran Freund & Young LLC; James R. Young

(57) ABSTRACT

Power scalable, rectangular, multi-mode, self-imaging, waveguide technologies are used with various combination of large aperture configurations, 20, 50, 80, 322, 324, 326, 328, 330, 332, 334, 336, 338, Gaussian 360 and super-Gaussian 350 beam profiles, thermal management configurations 100, flared 240 and tapered 161 waveguide shapes, axial or zig-zag light propagation paths, diffractive wall couplers 304, 306, 308, 310, 312, 314, 316, 318, 320 and phase controller 200, flexibility 210, phased arrays 450, 490, beam combiners 530, 530', and separators 344, 430, and other features to generate, transport, and deliver high power laser beams.

123 Claims, 18 Drawing Sheets

U.S. PATENT DOCUMENTS

| | | | |
|---|---|---|---|
| 5,608,745 A | 3/1997 | Hall et al. | |
| 5,684,820 A | 11/1997 | Jenkins et al. | |
| 5,835,199 A | 11/1998 | Phillips et al. | |
| 6,157,755 A * | 12/2000 | Brauch et al. | 385/31 |
| 6,738,396 B1 * | 5/2004 | Filgas et al. | 372/19 |

FOREIGN PATENT DOCUMENTS

WO     WO 03/087876 A2 * 10/2003

OTHER PUBLICATIONS

Ulrich R et al. "Self-Imaging in Homogeneous planar optics waveguides." Applied Physics Letters, American Institute of Physics -NY,US. vol. 27 No. 6 p. 337-339.

Tidwell S C et al. "Scaling CW Diode-end-pumped ND:Yag lasers to high average power." IEEE Journal of Quantum Electronics, IEEE NY,US. vol. 28 No. 4.

* cited by examiner

POWER SCALABLE OPTICAL SYSTEMS FOR GENERATING, TRANSPORTING, AND DELIVERING HIGH POWER, HIGH QUALITY, LASER BEAMS

CROSS-REFERENCES TO RELATED APPLICATIONS

This patent application is a continuation-in-part of U.S. patent application Ser. No. 09/968,974, filed on Oct. 1, 2001 now U.S. Pat. No. 6,894,828, which is incorporated herein by reference and claims the benefit of U.S. provisional patent application No. 60/259,681, filed on Jan. 4, 2001.

CONTRACTUAL ORIGIN OF THE INVENTION

The United States Government has rights in this invention under Contract No. N68335-00-C-0486 between the United States Department of Defense and Coherent Technologies, Inc., and certain Air Force contracts.

TECHNICAL FIELD

This invention is related generally to laser beam generation, amplification, and delivery systems and, more specifically, to power scalable optical systems for high power laser radar (ladar) applications, such as long-range targeting, imaging, and other applications, and includes light beam amplifiers, laser devices, waveguide technologies, and optical coupling, switching, and beam steering technologies.

BACKGROUND OF THE INVENTION

Long-range laser radar (ladar) systems for ranging, imaging, tracking, and targeting applications need highly spatially and spectrally coherent continuous wave (CW) output or short pulses of high-power, near diffraction limited, beams with high spatial coherency and near transform limited spectral content for accuracy and long range capabilities. Typical platforms for such ladar systems include high-performance aircraft, spacecraft, weapons systems, or portable equipment in which space is limited, but power output, beam quality, and beam control requirements are paramount. There are also many other applications for optical amplifiers, lasers, beam transport systems, and beam input/output and switching controls that are efficient, low mass, and compact in size, yet can be scaled to high average as well as peak powers while producing a high quality, near diffraction limited, beam. For example, laser beams are used extensively in industry for materials processing, cutting, and drilling applications and in medical surgical procedures in which very narrowly focused, high intensity beams produce sharper, cleaner cuts.

A common $TEM_{00}$ beam is one type of beam in which the light energy is spatially coherent (same phase across the thickness or cross-section of the beam) and is the lowest spatial mode of a laser. (Spatial mode in context of spatial coherency refers to the degree to which the laser is spatially coherent and should not be confused with modes of light transmission or propagation in a waveguide, which are also discussed herein.) A $TEM_{00}$ beam has a Gaussian amplitude distribution and can be focused down to the smallest size—much more so than higher modes, thus concentrating the light energy in the beam to a high intensity. A $TEM_{00}$ beam can also be propagated for long distances with minimal spreading or expansion of beam size. For many applications, therefore, it is desirable to pack as much energy as possible into $TEM_{00}$ beams. For example, for cutting materials, packing more energy into a $TEM_{00}$ beam means more power that can be focused to a very small spot to cut better, sharper, and cleaner than, a higher mode, e.g., $TEM_{01}$ or $TEM_{10}$, that has less spatial coherency of the light energy in the beam.

For laser radar (ladar) detection of range (distance away), velocity (speed and direction of travel), and even shapes or images of objects, such as targets, from long distances away, high average power CW lasers or pulses of $TEM_{00}$ beams are preferred for minimizing power loss of beams propagated over such long distances due to beam spreading, scattering, and attenuation in the atmosphere. Further, to maximize the likelihood that light reflected by the target back to the ladar receiver will still be strong enough to be detected in the midst of all other light energy of similar wavelengths in the atmosphere (background noise), which also reaches the range detector, the launched light beam should have a high level of energy. However, if there are several targets or objects close to each other, a long pulse will not allow the range detector to distinguish between light energy reflected from the several targets or objects, respectively, unless high bandwidth amplitude modulated (AM) or frequency modulated (FM) chirp is utilized. Such range discrimination, i.e., the minimum distance separating two reflective surfaces that can be detected separately, is even more critical in laser imaging applications in which the range detector must be able to discriminate between different reflecting surfaces of the same object or target in order to determine its shape. Such imaging along with range detection maybe used, for example, to distinguish between an enemy tank and an adjacent house or to determine if an airplane has the shape of a commercial airliner or a military bomber. Therefore, to detect and image targets at the longest range (distance away), beams of short, high-power, pulses with near diffraction limited, spatial coherency and near transform limited spectral content are most effective, although use of high bandwidth AM, FM, or phase modulated (PM) light followed by an optimized matched filter receiver is also very effective in many applications.

Unfortunately, prior to this invention, typical adverse, non-linear and thermal effects, such as thermal self-focusing and self-phase modulation, stress birefringence, stimulated Rayleigh, Raman, and Brillouin scattering, intermodel dispersion, and the like, limit the amount of power that can be produced by current state-of-the-art waveguide resonators and amplifiers, such as those that use crystalline laser materials in the form of bulk rods or slabs pumped with laser diodes and non-crystalline materials such as glassy optical fibers. However, at high powers, it is difficult to achieve both excellent pump/mode matching with high pump absorption and diffraction-limited beam quality. Longitudinal pumping can result in excellent mode matching, but it is limited in power due to the thermal stress fracture limit, i.e., the medium will crack when it gets too hot [S. Tidwell et al., "Scaling CW Diode-End-Pumped Nd:YAG Lasers to high Average Powers," IEEE J. Quantum Electron, vol. 28, 997 (1992)].

Another common problem in state-of-the-art bulk laser geometries prior to this invention is thermal management—both in the form of heat extraction and dissipation as well as optical distortion due to thermal gradients. The heat build-up results from absorption of high pump energy in a small volume of laser material, and active cooling in the form of bulky heat exchangers or refrigeration systems is usually required to remove the heat. Such active cooling adds severely to the size, weight, and power requirements of the system. Thermal gradients in the laser materials are manifested in the forms of undesirable thermal lensing or self-focusing, due to thermally-induced birefringence, which alters polarization of the light. See, for example, David Brown, "Nonlinear Thermal Distortions in YAG Rod Amplifiers", IEEE j. Quantum Electron, vol. 34, 2383 (1998). Considerable research has been devoted to compensation schemes for these adverse thermal effects. These problems are significant, because there is typically power dependent birefringence, which alters polarization, and bi-focusing, which degrades spatial and temporal coherence. See, James Sherman, "Thermal compensation of a CW-pumped Nd:YAG laser", Appl. Opt., vol. 37, 7789 (1998). One technique that has been tried to alleviate this effect is to use extremely thin laser media ("thin disks") such that thermal gradient is reduced and one-dimensional. See U. Branch et al., "Multiwatt diode-pumped Yb:YAG thin disk laser continuously tunable between 1018 and 1053 nm", Opt. Lett., vol. 20, 713 (1995). However, operation in quasi-three-level laser material (Yb, Er, Tm, Ho) severely exacerbates the thermal problem, since it requires much higher pumping to reach threshold and/or refrigerated cooling to depopulate the thermal laser level. Consequently, there has not been any real solution to the thermal problems when scaling bulk laser materials to high power levels.

Optical fiber lasers and amplifiers overcome some of the thermal problems of bulk laser crystal materials by greatly increasing the length of the gain medium and providing mode confinement, i.e., limiting the size of the fiber core diameter so that it can only propagate the lowest order eigenmode, (so-called "single-mode fibers"). There are several benefits to this approach, including: (i) the long inter-action length between the pump light and the laser beam lead to high gain and efficient operation, even in 3-level lasers in which the terminal laser level is thermally populated; (ii) Heat is distributed over a longer length of laser medium with a larger surface area, so the heat can be dissipated with passive conductive cooling to the atmosphere or to a heat sink; (iii) Operation can be restricted to a single transverse mode, which preserves a $TEM_{00}$ spatial coherence and Gaussian intensity profile for the beam focusability and beam propagation with minimal beam spreading advantages as described above; (iv) The flexible nature of the optical fibers allows compact and novel optical designs; (v) The optical fibers can be directly coupled to other passive or active waveguides for modular functionality; and (vi) Fabrication is suited to large-scale production, which reduces costs. However, power scaling, i.e., scaling up to higher power levels, in such single-mode optical fibers is restricted by inability to make efficient coupling of pump light energy into the optical fiber and by the minute, single-mode core, (10–30 µm diameter) holey or photonic fibers and core cluster fibers, which can only handle so much light energy without overheating, distortion, or suffering catastrophic facet (coupling surface) failure.

This limitation of fiber lasers and amplifiers has been partly overcome by use of a double-clad fiber structure in which the small-diameter, single-mode core is surrounded by an inner cladding region, which, in turn, is surrounded by an outer cladding region. The inner cladding region has a larger numerical aperture than the core, thus can accept more pump light energy in more modes. Therefore, the pump light is optically confined to both the core and inner cladding regions together, while the optical beam is confined to the core alone. However, drawbacks of such double-clad fiber designs for laser resonators and amplifiers include: (i) The pump light energy, while introduced into, and confined by, the core and inner cladding together, is absorbed only in the core region so that the effective absorption coefficient is reduced by approximately the ratio of the core area to the inner cladding area; (ii) The inner cladding size is still very small, even though larger than the core, so that coupling of a laser diode array into the inner cladding region is still quite difficult and not very efficient; and (iii) The outer cladding region must be made with a much lower index of refraction than the inner cladding for optical confinement of the pump light to the inner region, and such lower index of refraction materials are often polymers (plastic), which are much more susceptible to damage than glass, especially from heat.

Essentially, the single-mode or large effective area core diameter of optical fibers is so small (10–30 µm, which is equivalent to $7.8 \times 10^{-7}$ $cm^2$ in cross-sectional area) that a 10 µJ (micro joule) pulse of light has a fluence (energy per unit area) greater than 13 $J/cm^2$ (joules per square centimeter), which is close to the damage threshold of the fiber. Larger core diameter can handle more energy, of course, so that a 10 µJ pulse of light would not be so close to the damage threshold, but larger core diameters result in undesirable eigenmode mixing and resulting loss of polarization, spatial coherence, and temporal coherence, which are significant beam degradations that reduce usability and effectiveness of the beam and should be avoided. Some complex-design, large-area, multi-mode fibers have been reported with reduced mode-mixing and pulse energies up to 500 µJ with $M^2 < 1.2$, ($M^2$ is a measure of divergence relative to diffraction limit and $M^2 = 1$ is diffraction limited) have been reported [see, e.g., H. Offerhaus et al., "High-energy single-transverse mode Q-switched fiber laser based on multimode large-mode-area erbium-doped fiber", Opt. Lett., vol. 23 (1998)], but no truly single-mode ($LP_{01}$) fiber design has been able to break the nanosecond-class, short pulse, 1 mJ (1,000 µJ) barrier, while maintaining spectral and spatial coherence with short temporal pulse widths.

In many applications, including those addressed by this invention, production and amplification of high-power, high quality laser and other light beams is only part of the problem. Transporting such high-power, high-quality beams to points of application, such as the industrial cutting and materials processing, medical, laser radar ranging, imaging, and tracking applications mentioned above, can also present heretofore unsolved problems. For example, in the laser radar (ladar) system described in U.S. Pat. No. 5,835,199, which is incorporated herein by reference, a high-power laser beam is produced for launching from airplanes or other platforms for ranging, imaging, and tracking objects or targets as much as twenty miles away or more. In an airplane, the most effective launch point for such high-power beams may be in the nose cone or in other extremities of the airplane where space is tight and where many electronic and other kinds of equipment also have to fit. Consequently, it is often not possible to place high power laser beam production and amplifying equipment at the most effective launch locations in the airplane. Therefore, it would be very beneficial to have some way of transporting high power laser beams from some other location in the airplane to one or more launch points in the nose cone, fuselage floor, wings, tail, or other structures without degrading beam power, quality, polarization, and the like, and to have an effective way of directing or steering such high power beams at such remote launch points for the best overall ranging, targeting, or imaging results.

Similar beam transport capabilities would also be beneficial in industrial, medical, imaging, directed energy, and other applications of high power laser and other light beams, where space is limited or where it would just be more convenient to place a high powered, high quality beam without all the associated beam production and/or amplification equipment.

Yet, transport of high power, high quality laser beams without degradation of beam power, quality, temporal and spatial coherence, polarization, and the like presents serious problems with many of the same kinds of obstacles as described above for the beam production and amplification. For example, single-mode waveguides, such as single-mode optical fibers, can maintain beam quality, but their very small size for single-mode operation severely limits power transport capabilities. Industrial medical, and even imaging applications would benefit from continuous wave (cw) output power of 100 watts or more, while even higher power laser applications, such as Q-switched or pulsed lasers, may have output power in the megawatt range, such as 10 megawatts or greater. Single-mode waveguides, including fibers, are simply unable to handle that kind of optical power or light energy.

Multi-mode fibers and waveguides are larger than single-mode fibers and waveguides, thus can transport more power, but they do not maintain spatial coherence, polarization, and the like, because of multi-mode interference and other reasons mentioned above. Free-space light transport has its own problems, not the least of which is that the light paths have to be unobstructed and alignment and stability problems in non-laboratory environments are extremely difficult to overcome and are often insurmountable.

Techniques have been previously developed to actively compensate for finite length circular fiber spatial mode deficiencies, including SBS phase conjugation, but these techniques are limited in scope to narrow spectral line width lasers to match the SBS gain bandwidth, enough optical power to provide the nonlinear drive field required, and wavefronts that are not fully reconstructed by phase conjugation. Furthermore, and as previously mentioned, it may be desirable in many waveguide applications to maintain polarization. In circular fibers with a uniform index-of-refraction in both the core and cladding, polarization may not be maintained. To preserve polarization, special polarization-maintaining fiber designs maybe required which essentially create an asymmetric index difference in orthogonal directions. If this index profile is disturbed, potentially as a result of high power operation, the polarization integrity may drift or be lost.

Beam quality issues may arise, for example, related to mode mixing as previously described, or with regard to "bend, buckle and twist" of the waveguide and potentially resulting modification of at least spatial coherence, wherein, for example, a twist of the waveguide could result in beam formation equivalent to a negative lens, and a bend in the waveguide may result in beam formation potentially equivalent to a positive lens. Such applications of waveguide technology have not been adequately addressed in the past attempts previously described or in other previous beam transport technologies.

SUMMARY OF THE INVENTION

Accordingly, it is a general object of this invention to provide an optical system that is scalable to high average and peak power laser beam production, amplification, and control capabilities for ladar, industrial, medical, direct energy (DE) weapons, and other applications.

Another general object of this invention is to provide high power, diffraction limited, laser beams and amplifiers and waveguide systems that are capable of delivering such high power laser beams to one or more points of application without significant degradation of beam quality.

A more specific object of this invention is to provide an optical system for a high power ladar application, including flexible beam transport waveguides with remote controllable wall coupling and beam directing capabilities that are suitable for volume-limited platforms.

Another object of the present invention is to provide an optic amplifier or laser resonator that can be operated at much higher optical powers and Q-switched pulse energies than is possible in single-mode waveguides or fibers, while: (i) also having many of the excellent benefits of single-mode waveguide or fiber amplifiers and lasers, including preservation of polarization and capability of maintaining a $TEM_{00}$ (Gaussian) beam profile (or any other desirable waveform); and (ii) avoiding undesirable nonlinear effects that are inherent in single-mode waveguide or fiber amplifiers and lasers operated at higher intensities, such as stress birefringence and self-phase modulation.

Another general object of the present invention is to provide an apparatus and method for producing high power continuous wave (CW) laser beams with near arbitrary spectral coherence that are capable of maintaining a diffraction limited wavefront for sharp focusing capabilities in industrial materials processing and fabrication, medical surgical applications, and any other application in which sharp focusing of high power beams would be beneficial.

Another general object of the present invention is to provide an apparatus and method for producing high power, pulsed laser beams for packing higher energy into shorter pulses for longer ranging and higher resolution target acquisition and imaging applications.

Another object of the present invention is to provide a high power optical amplifier or laser resonator that has efficient heat dissipation and that can be mated easily and effectively to one or more heat sinks.

Still another object of the present invention is to provide a high power, yet compact and lightweight optical amplifier or laser resonator.

A further specific object of the present invention is to provide a high pulse energy or high average power quasi-continuous-wave (QCW) or high repetition rate macro-pulse laser which can be frequency converted to any band, including Band IV, for defense infra-red countermeasure applications.

A still further specific object of the present invention is to provide a few Hz to multi-GHz-class repetition rate laser source that can be pumped efficiently quasi-cw or low cost, continuous wave, diode laser and which can be frequency converted to eye-safe wavelengths for target identification and ranging and unconventional active imaging architectures.

Another specific object of the present invention is to provide a method of frequency shifting and/or amplifying a guided wave in a self-imaging waveguide.

Another specific object of the invention is to provide a method for stabilizing an internal propagating mode by compensating linear or non-linear dispersion terms (e.g., achromatization and solution formation) by using linear or non-linear, (e.g., intensity dependent), index of refraction media in the waveguide core.

A more specific object of the present invention is to mitigate undesirable effects of thermal focusing in high power optical amplifiers so that one waveguide design can be used for various average powers and pulse formats for a variety of applications, thereby making it feasible for one design to span many applications.

Another object is to provide spectral and spatial coherence control that is adequate for use of waveguides, both hollow and solid, e.g., dielectric, beam transport, and especially directed energy applications such as high power weapon applications as elements of an optical phased array, which is typically defined as near diffraction limited ensemble wavefronts with optical phase control to less than one-tenth of a wave.

Another specific object of the present invention is to provide low cost and efficient coupling of laser diode arrays into an active optical amplifier medium or laser resonator for high conversion efficiency.

Still another specific object of the present invention is to provide a high power scalable optical amplifier or laser resonator that has excellent pump light to beam overlap and high energy extraction efficiency.

Yet another specific object of the present invention is to provide a high power optical amplifier or laser resonator in which the active medium has non-deleterious thermal gradients while pump light energy is distributed over a large volume and surface area.

Another general object of the present invention is to provide guided wave systems and beam transport providing desirable capability for high power applications. It is a goal of the present invention, therefore, to provide guided wave systems, beam transports, or waveguides that provide for particular beam types, particular output power requirements of desirable waveguide and beam transport applications, and desirable levels of beam quality.

Yet another object of the present invention is to provide self-imaging guided wave systems and beam transport while achieving desirable levels of beam quality and capability for high power applications. It is one goal of the present invention, therefore, to provide guided wave systems and beam transport providing desirable polarization and spatial, spectral, and temporal coherence characteristics. Furthermore, it is a goal of the present invention to provide self-imaging guided wave systems and beam transport while minimizing or eliminating potential optical damage to the waveguide and nonlinear optical effects.

Still another object of the present invention is to provide guided wave systems and beam transport that may be applicable, and potentially comprise, one or more potentially desirable beam transport features. A corresponding goal, therefore, is to provide guided wave systems and beam transport that may be applicable, and potentially comprise, one or more features such as synthetic aperture, distributed aperture, beam forming, beam steering, beam combining, power sampling, power combining and power splitting, among other features.

A further object of the present invention is to provide guided wave systems and beam transport that may be applicable to one or more fields, including telemetry, aeronautical and space applications, directed energy systems, object imaging systems, object positioning and tracking systems, detection systems, fiber optics, machine fabrication, and medical systems, among others.

Yet another object of the present invention is to provide guided wave systems and beam transport that are adapted to aeronautical applications, and aircraft applications. A goal of the present invention, therefore, is to provide guided wave systems and beam transport comprising a configuration particularly directed to directed energy systems, object imaging systems, object positioning and tracking systems, and detection systems for aircraft and other aeronautical and space applications, while maintaining desirable beam quality and high power characteristics. A further related goal is to provide for "bend, buckle, and twist" characteristics of the guided wave systems and beam transport, while either maintaining or providing for resulting modification of spatial coherence and applications thereof.

Additional objects, advantages, and novel features of the invention are set forth in part in the description that follows and will become apparent to those skilled in the art upon examination and understanding of the following description and figures or may be learned by the practice of the invention. Further, the objects and the advantages of the invention may be realized and attained by means of the instrumentalities and in combinations particularly pointed out in the appended claims.

To achieve the foregoing and other objects and in accordance with the purposes of the present invention, as broadly embodied and described herein, the high power optical amplifier and/or laser resonator of this invention may comprise an optic amplifier for a laser beam and/or a laser resonator that includes a solid-state, multi-mode, self-imaging rectangular, waveguide with a core comprising a solid gain medium, which can be excited or pumped with energy and can impart such energy to a light beam propagating through such solid waveguide core. The amplifier or laser resonator includes optical components that focus or otherwise provide a desired beam spatial profile, such as super-Gaussian, on a face or aperture of the solid, rectangular waveguide, and the waveguide length coincides with a waveguide self-imaging period (WSIP) of the rectangular waveguide or some non-zero, ¼-period or integer multiple thereof, in order to produce that same spatial profile in an amplified output beam. The multi-mode, rectangular, waveguide core may be unclad, partially clad in sandwich cladding, or fully clad in or fully enveloped by cladding. Rectangular-shaped cladding is particularly beneficial for heat sink mountings, electrical excitation, and optical pumping with elongated, stacked laser diodes, although rectangular waveguide cores clad in optical fibers with circular, oval, or other cross-sectional shapes are also useful in various applications of this invention. A zig-zag waveguide optical path, which increases effective energy extraction in a smaller overall length, is particularly adaptable to one-dimensional, or quasi-one-dimensional, solid-state, multi-mode waveguide cores according to this invention.

Embodiments of the invention may also comprise passive, hollow and dielectric core multi-mode, guided wave, beam transport systems. Embodiments may include rectangular or square cross-section waveguides, and preferably maintaining spatial profile of an input beam, such as a Gaussian or super-Gaussian beam, through the self-imaging period of the waveguide. Additional aspects of the present invention may be provided either separately or in conjunction with the self-imaging guide of the present invention; for example, transport, amplification, phase/frequency control or modulation, deflection, conversion, synthetic aperture, distributed aperture, beam forming, beam steering, beam combining, power sampling, power combining and power splitting, among other features.

To further achieve the foregoing and other objects and, in accordance with purposes of the present invention, and as broadly embodied and described herein, a method of providing a high power, diffraction limited laser beam to a desired application comprises producing a high power beam with a desired spatial profile, coupling the beam into an elongated, multi-mode, self-imaging, transport waveguide that has a least one output aperture positioned at a self-imaging plane, and coupling the beam out of the output aperture for a desired application. According to one aspect of the invention, a high power laser beam can be produced by an advantageous combination of a rectangular (preferably one-dimensional), multi-mode, self-imaging, solid core, amplifier waveguide with a heat sink in thermally conductive contact with at least one, and preferably two, of the large aspect (waveguiding) sides of the waveguide. While this combination works with any desired beam profile, another advantageous addition to the combination, thus inventive feature, is to condition the beam to have a super-Gaussian (preferably a low order super-Gaussian) profile, which can enhance scalability to high power levels while delivering high quality, diffraction limited, beams. At the same time, the self-imaging feature of the waveguide, thus ability to use larger aperture waveguides, also facilitates scaling to high power levels, even though such larger aperture waveguides are multi-mode. Scaling to high power levels is also facilitated by the flat, thin, elongated, rectangular, cross-sectional profile of a rectangular (especially one-dimensional), multi-mode, self-imaging, waveguide core, which provides efficient heat dissipation from the core. Delivering the high power laser beam through an elongated, multi-mode, rectangular, self-imaging, transport waveguide (preferably, but not necessarily, hollow) can include twisting and/or bending the transport waveguide to route the outlet aperture to a desired position. Changing index of refraction of a window, such as a diffraction grating, liquid crystal, or other material at a re-imaging plane provides an outlet aperture for some or all of the beam with the desired spatial profile. A grating (preferably comprising numerous spaced-apart strips of the liquid crystal material) can direct or steer the beam. The output beam of one transport waveguide can be coupled into another multi-mode, rectangular, self-imaging, transport waveguide, or it can be combined with another, phase-matched, beam to produce an even higher power beam with the desired spatial profile.

Embodiments of the present invention may provide a self-imaging, multimode waveguide as disclosed and claimed herein, and self-imaging guided wave systems and beam transport. Embodiments of the present invention may further provide a method of self-imaging, multimode beam transport, as disclosed and claimed herein, and other self-imaging wave guidance techniques. Other embodiments of the present invention may also be disclosed and claimed herein.

BRIEF DESCRIPTION OF THE DRAWINGS

The accompanying drawings, which are incorporated in and form a part of the specification, illustrate the preferred embodiments of the present invention, and together with the descriptions serve to explain the principles and enabling embodiments of the invention.

In the Drawings.

DETAILED DESCRIPTION OF THE INVENTION

Figure 1:
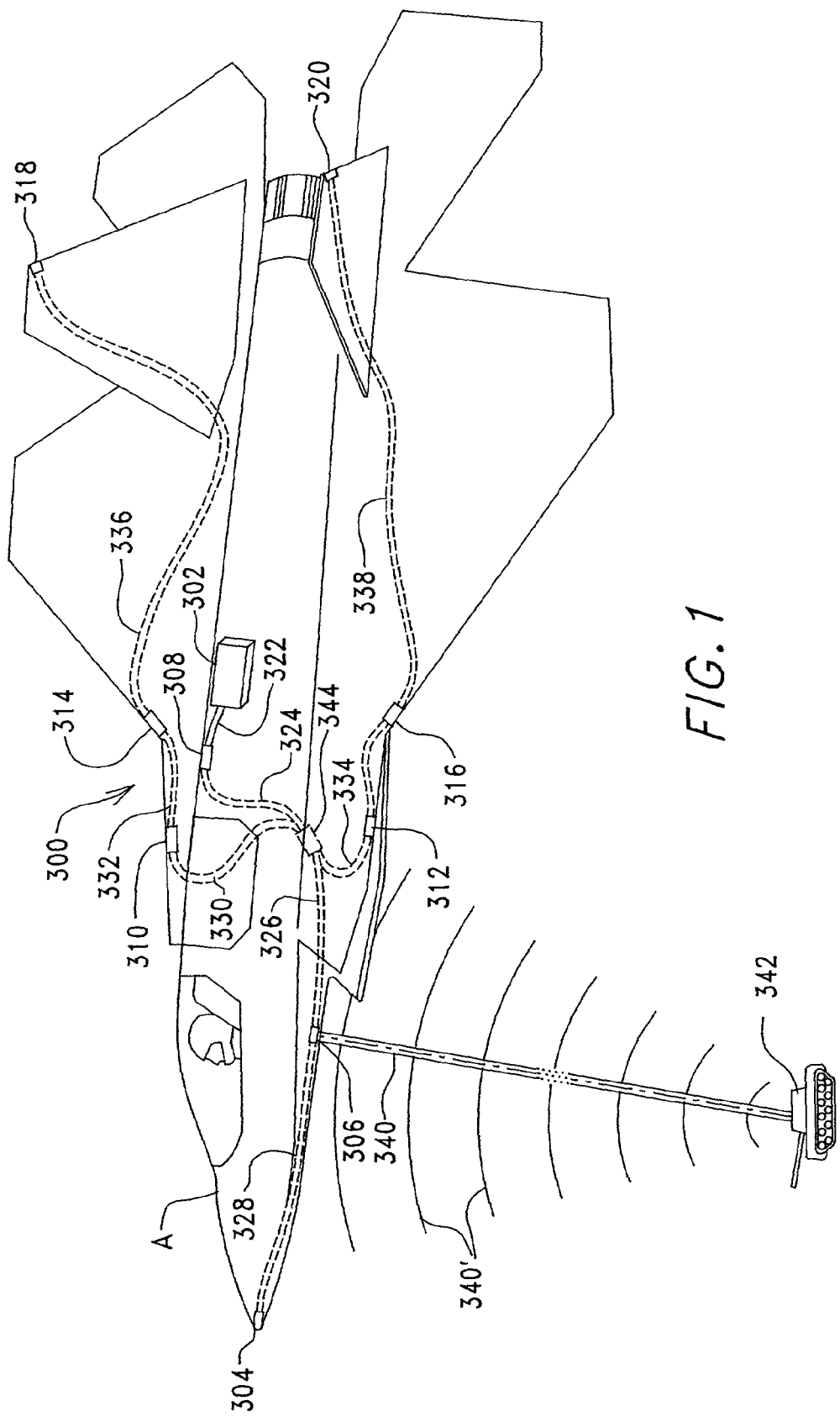
FIG. 1 is a diagrammatic, perspective view of an airplane equipped with a high power optical system of this invention for ladar ranging, targeting, or imaging applications.

A high power optical system 300 according to this invention is illustrated in FIG. 1 as applied, for example, to laser radar (ladar) ranging, targeting, or imaging applications in a high performance airplane A. As shown in FIG. 1, a ladar beam generator 302 is shown diagrammatically as mounted in an accessible location, such as about mid-fuselage near an access door, while a plurality of individually controllable beam launch apertures 304, 306, 308, 310, 312, 314, 316, 318, 320 are positioned at strategic, remote extremities or locations of the airplane A. The beam launch apertures 304, 306, 308, 310, 312, 314, 316, 318, 320 are connected by large aperture, multi-mode, self-imaging waveguides 322, 324, 326, 328, 330, 332, 334, 336, 338 to the ladar beam generator 302, so that the high power ladar beams, such as beam 340, can be directed to targets 342 or other objects to be ranged, targeted, or imaged. Back-scattered wavefronts 341' reflected or scattered from the target 342 can be coupled back into the transport waveguide 328 via aperture 306 or into any other aperture and waveguide for transport to target imaging or analysis equipment (not part of this invention). As will be described in more detail below, the launch apertures 304, 306, 308, 310, 312, 314, 316, 318, 320 can be controlled individually to turn the beams 342 on and off, and even to direct or steer them in relation to the airplane A. As will also be described below, wall couplers, such as coupler 344, can connect adjacent waveguides optically to each other optically in a remote controllable manner, as will be described in more detail below.

Of course, the high power optical system 300 can be mounted and used on many different platforms other than an airplane A, can be configured in a variety of ways, and can be put to many uses other than targeting, ranging, and imaging. However, the airplane A platform mounting of the high-power optical system 300 in FIG. 1 is exemplary of important features and benefits of this invention, which will be described in more detail below.

For weapons-class applications, the high power optical system 300 can produce and deliver high power, continuous wave (CW), or Q-switched (pulsed), diffraction limited, laser beams, such as beam 340 in FIG. 1, with peak power in the range of 5–20 megawatts or more. Other high power, weapons-class applications of the power scalable optical system of this invention may have average power operations capabilities in the range of 1–3 megawatts or more. For example, 0.1 Joules per 10 nanoseconds is $10^7$ watts. High power, continuous wave (CW), laser operating ranges of the optical systems of the present invention for medical, industrial, imaging, communications, and other applications can be scaled up to average power levels of 10–20 kilowatts or even 100 kilowatts or more, with high quality, spatially and temporally coherent, polarized laser beams for optimal focusing and power usage.

Because a primary purpose of this invention is to provide laser amplifier, resonator, beam transport, and beam launching systems that are scalable to high power levels for such uses as those described above and for other uses, it is helpful to provide some definition of high power as used in describing this invention. High average power as used herein in relation to waveguides for spatially coherent, continuous wave (CW), laser beam means about 10–100 watts per waveguide. Very high average power as used herein in relation to waveguides means a spatially coherent, continuous wave (CW), laser beam of about 100–1,000 watts or more per waveguide. High peak power as used herein in relation to waveguides means spatially coherent, pulsed laser beam with peak power in a range of about 1–10 megawatts per waveguide. Very high peak power as used herein in relation to waveguides means spatially coherent, pulsed laser beam with peak power in a range of about 100–1,000 megawatts or more per waveguide. High power, as used herein, means high average power, very high average power, high peak power, and/or very high peak power, as defined above. Of course, multiple waveguides can be stacked into arrays, as discussed further below, to handle even higher power levels than single waveguides. For example, stacked arrays comprising a plurality of multi-mode, self-imaging waveguides are described below. In general, the power handling capability of a large aperture, multi-mode, self-imaging waveguide in this invention is limited only by thresholds of optical damage or thermal loading of the walls, which can be actively cooled according to this invention, or by optically induced breakdown of air or gas medium in the waveguide.

A combination of rectangular, multi-mode, self-imaging, waveguide technology with large aperture beam input and output and super-Gaussian beam profiles enables power-scaling optical systems, according to this invention, up to and beyond the high power ranges described above for production and/or delivery of high power, spatially coherent, diffraction limited laser beams, as will be described in more detail below. While some principles of rectangular, self-imaging, technology, including its use in image transmissions, laser resonators, and amplifiers, are well-known, as in, for example, U.S. Pat. No. 3,832,029 issued to O. Bryndahl, U.S. Pat. No. 4,087,159 issued to R. Ulrich, and U.S. Pat. No. 5,684,820 issued to R. Jenkins et al, applications and adaptations of such technologies to high power optical systems according to this invention are new.

Figure 2:
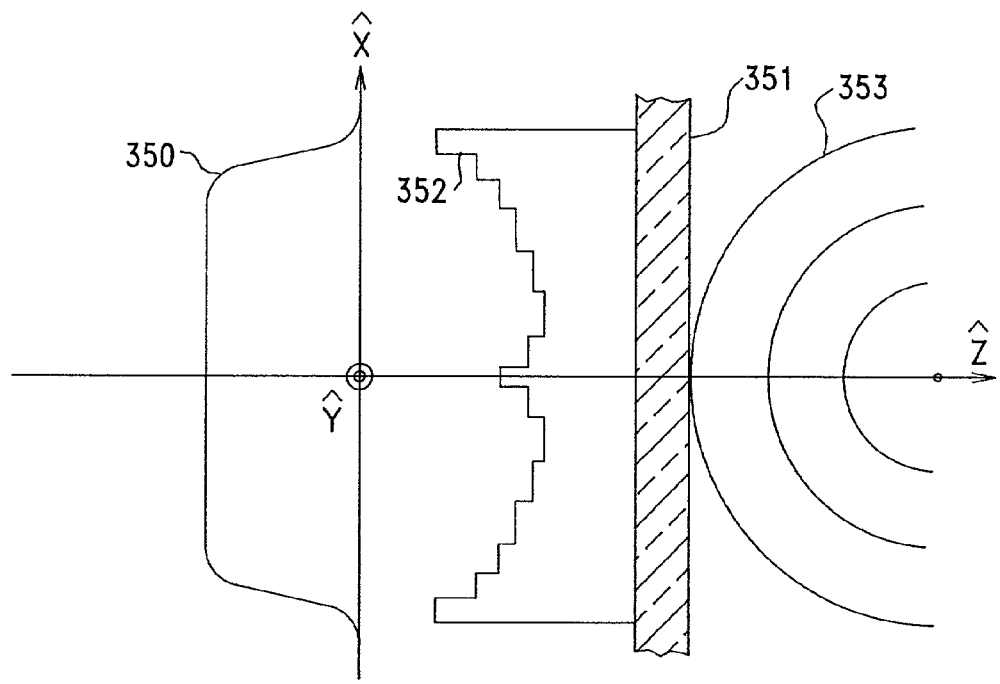
FIG. 2 is an example super-Gaussian amplitude spatial profile.
Figure 3:
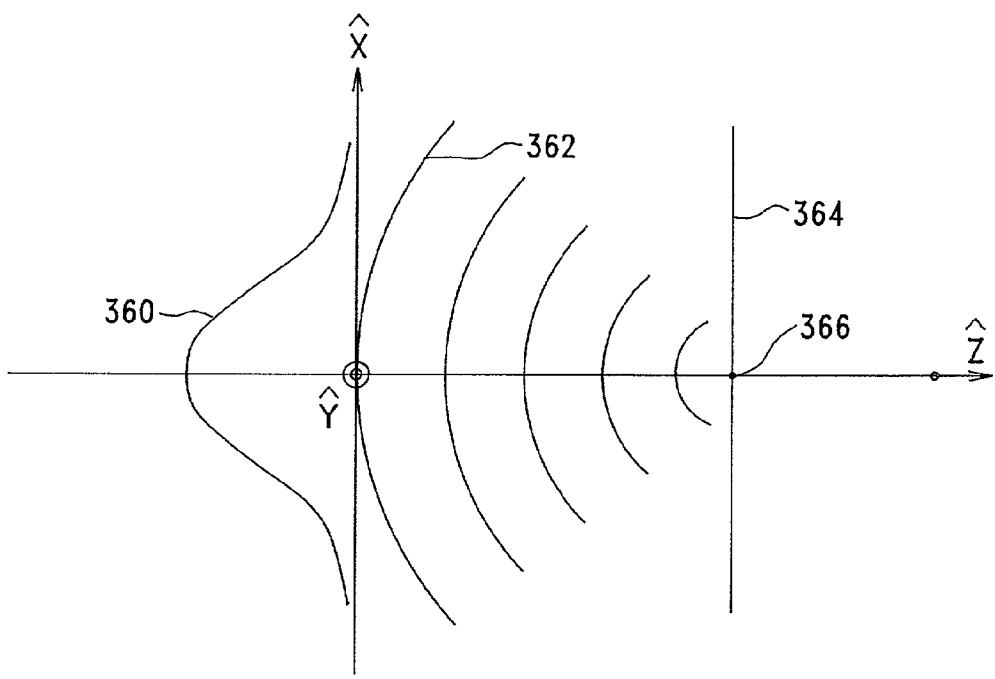
FIG. 3 is an example $TEM_{00}$ Gaussian amplitude spatial profile for comparison to the super-Gaussian profile of FIG. 2.

An example super-Gaussian beam amplitude profile 350 and corresponding phase front 352 is illustrated in FIG. 2, as compared to a common $TEM_{00}$ Gaussian beam amplitude spatial profile 360, and corresponding wave front 362 illustrated in FIG. 3. The Gaussian beam amplitude spatial profile 360 is typical of any diametric cross section of the beam and is a function of spherical wave or phase fronts 362. As explained above, a $TEM_{00}$ Gaussian beam is spatially coherent, i.e., the same phase, across any transverse cross-section of the beam, and super-Gaussian beams can also have that attribute. However, super-Gaussian beams have different intensity, or amplitude, spatial profiles than Gaussian, which can enable super-Gaussian beams to carry more power than Gaussian beams of the same cross-sectional size and shape.

In general, Gaussian, as well as super-Gaussian, beams can have circular distribution, square distribution, elliptical distribution, or rectangular distribution of the light energy across a transverse cross-section of the beam. The light intensity or amplitude spatial profile, $I(x,y)$, of such beams can generally be described as follows, where x is the x-direction of the waveguide, y is the orthogonal space axis, and $W_x$ is the width of the waist in the x-direction, $W_y$ is the width of the waist in the y-direction, and $W_0$ is the diameter of the waist in the circular distribution case:

$$\text{Circular distribution } I(x, y) \propto \exp\left[-\left(\left[\frac{x^2 + y^2}{W_0^2}\right]\right)^{Sgxp}\right], \quad (1)$$

$$\text{Square distribution } I(x, y) \propto \exp\left[-\left(\left[\frac{x^2}{W_x^2}\right]\right)^{Sgxp} - \left(\left[\frac{y^2}{W_x^2}\right]\right)^{Sgxp}\right], \quad (2)$$

$$\text{Elliptical distribution } I(x, y) \propto \exp\left[-\left[\frac{x^2}{W_x^2} + \frac{y^2}{W_y^2}\right]^{Sgxp}\right], \quad (3)$$

$$\text{Rectangular distribution } I(x, y) \propto \quad (4)$$
$$\exp\left[-\left(\left[\frac{x^2}{W_x^2}\right]\right)^{Sgxp} - \left(\left[\frac{y^2}{W_y^2}\right]\right)^{Sgyp}\right].$$

In the above formulae (1)–(4), Sgxp is the super-Gaussian order in the x-direction, and Sgyp is the super-Gaussian order in the y-direction, and implicit are variations of the elliptical super-Gaussian to possess different orders in the x and y directions.

If Sgxp=1 and Sgyp=1, then one obtains circular, square, elliptical, or rectangular Gaussians from the above formulae (1)–(4).

A super-Gaussian beam can have circular, square, elliptical, or rectangular light energy distributions described by formulae (1), (2), (3), or (4) above, and Sgxp can, but does not necessarily have to, equal Sgyp, but either Sgxp or Sgyp, or both, is greater than one. As can be seen from a comparison of the Gaussian intensity profile 360 in FIG. 3 with the super-Gaussian profile 350 in FIG. 2, the super-Gaussian beam 350 has potentially more energy in a cross-section than the Gaussian beam 360. Super-Gaussian beams also provide better energy extraction and higher power as well as more uniform target illumination than Gaussian beams. Lower order super-Gaussian beams also retain spectral and spatial coherence across the cross-section, thus are diffraction limited, more efficient, less chirped, and more desirable than even $TEM_{00}$ Gaussian beams for many applications, such as, for example, coherent laser radar and phased radar operations, according to this invention. Spatial intensity variations in higher order, super-Gaussian beams can lead to spatial ringing and nonlinearly induced differences in complex index of refraction and, therefore, to distortion of spectral coherence. Similarly, variations of the intensity across a Gaussian beam lead to intensity dependent index of refraction changes, which impact chirp and wavefront quality. At some point, depending on the specific dimensions of the self-imaging waveguide aperture, such propagation distortions will become less acceptable. Because of such aperture size dependence and nonlinearly induced differences, it is difficult to quantify a specific line of demarcation between desirable, lower order super-Gaussian beams and less desirable, higher order super-Gaussian beams, in which the propagation distortions become unacceptable. However, in general, super-Gaussian beams in which both Sgxp and Sgyp are less than 7 can be considered lower order super-Gaussian and function in applications of this invention without excessive distortion of either spectral coherence or spatial coherence.

Super-Gaussian beams, including, but not limited to, lower order super-Gaussian beams according to these parameters, can be created in a variety of ways, including, but not limited to, amplitude and/or phase modifications to another beam format that is being injected into an optical amplifier or laser resonator via binary optics, such as phase plates, or any other optical component to accomplish such modifications, as would be understood by, and would be well within the capabilities of, persons skilled in the art, once they understand the principles of this invention. However, to illustrate such a phase modification generally, a step relief, phase modification plate 351 in transmissive mode is illustrated diagrammatically in FIG. 2 as it may be used to modify a spherical phase front 353 to produce a modified phase front 352 in order to produce a super-Gaussian amplitude profile 350. While a phase modification plate can be stepped relief and transmissive, as shown in FIG. 2, it could also be stepped relief and reflective, continuous relief and transmissive, or continuous relief and reflective. Other examples of suitable optical components for such amplitude and/or phase modifications of beams may include spatial light modulators, Demann gratings, modans, kineforms, and many others well-known to persons skilled in the art, all of which would work for purposes of this invention.

An optic amplifier 10 based on a rectangular, multi-mode, self-imaging, waveguide 20 with large, rectangular, input and output apertures or opposite end faces 26, 28 that can support a super-Gaussian beam 14 according to this invention is shown diagrammatically in FIG. 4 in a single-pass embodiment for illustrating basic features, while a double-pass embodiment is described below and shown in a subsequent illustration. An important feature of this invention is the use of a rectangular, multi-mode, self-imaging waveguide 20, with large input and output apertures 26, 28, as the gain medium for the high-power, optical amplifier 10, so that the amplifier 10 can deliver a high power beam with a wide range of spatial profile modes up to the spatial frequency limit of the input aperture as defined by its optical transfer function, such as the highly desirable super-Gaussian, diffraction limited, beam described above or a conventional Gaussian beam, without being confined in power through-put by the constraints of a single-mode waveguide.

More specifically, the internal dimensions of a multi-mode wave guide core, including the smaller dimension width or thickness "a" (see FIG. 5), are large enough to support multiple eigenmodes of light propagation, as opposed to being so narrow as to support only one light propagation eigenmode as in a so-called single-mode waveguide. Any input beam 12 of a particular wavelength, including, for example, a super-Gaussian beam, will quickly break up into as many eigenmodes of propagation as allowed for that wavelength by the multi-mode waveguide 20 size, shape, and numerical aperture. Accordingly, for purposes of this invention, a multi-mode waveguide is one that does not restrict light propagation to only one mode in a dimension. Thus, a single-mode waveguide is not considered to be included in the scope of the term multi-mode.

In general, for multi-mode waveguides (not including multi-mode, self-imaging waveguides), each light propagation mode has a different path through the waveguide 20 and travels a different distance from the entrance face 26 to the exit face 28 than other modes, so the multiple modes mix and interfere with each other, which degrades beam quality and quickly destroys the spatial coherence and super-Gaussian profile or any other amplitude profile or distribution of the entering beam 12. Single-mode waveguides do not suffer from such interference and resulting degradation of beam quality, thus are capable of preserving and delivering a high quality, spatially coherent, beam profiles at their output apertures, but single-mode waveguides cannot handle the scaled up power levels of the larger, multi-mode waveguides.

However, according to a well-known reimaging characteristic of rectangular and other parallelepiped waveguides, the optical interference patterns in the waveguide re-phase and reconstruct an input image at periodic distances along the waveguide. The distance for such periodic re-imaging, sometimes called the waveguide self-imaging period (WSIP) and sometimes symbolized as $D_w$ for distance between successive focal planes or waists, is related to the index of refraction (n) of the waveguide propagation medium, the width or thickness (a) of the waveguide propagation medium, and the wavelength ($\lambda$) of the light being propagated. In general, WSIP=$4na^2/\lambda$, although in the special case where the beam is symmetric with respect to the center of the waveguide, i.e., the beam profile is identical with its mirror image, WSIP=$na^2/\lambda$. See, e.g., Bryngdahl, J. Opt. Soc. Am 63, 416 (1973); Ulrich, R. and Aukele, G., Appl. Phys. Lett., 27, 337 (1975).

This invention utilizes that re-imaging principle of rectangular and other parallelepiped waveguides to construct the high-power optic amplifier 10 in a manner that can deliver a high-power, diffraction limited, output beam 14 with a desired spatial coherence and amplitude profile, preferably lower order super-Gaussian, as described above. The input beam 12 with the desired spatial coherence and amplitude profile is injected at an entrance face 26 into the rectangular, multi-mode, waveguide 20, which has a core 22 comprising an optical gain medium or a 3- or 4-wave mixing, nonlinear medium, i.e., a material that can be excited or populated with additional energy that then gets added to the light energy in a beam that passes through the material (hereinafter sometimes referred to generally and interchangeably as a "gain medium" or "mixing medium"). Therefore, the input beam 12, upon entering the rectangular, multi-mode, waveguide core 22, breaks into as many eigenmodes as the width or thickness (a) and numerical aperture of the waveguide 20 will allow for the light wavelength, while it gets amplified with the additional energy. Input of the additional energy to the core 22 can be accomplished with any of a number of well-known techniques, which are symbolized generically by the energy input arrows 30, 32 in FIG. 4. Therefore, while the multi-mode propagation of the light beam 12 through the waveguide 20 degrades in beam quality as various modes of propagation mix and interfere in the waveguide 20, the light beam 12 never-the-less gets amplified with additional energy acquired from the excitation or pump energy 30, 32 in the gain medium of the core 22. However, according to the re-imaging characteristic of rectangular waveguides described above, the input spatial profile of the beam 12 is reproduced periodically at specific distances of propagation, i.e., WSIP=$4na^2/\lambda$ (or WISP=$na^2/\lambda$ in the symmetric case), and such reproduction of the desired spatial profile occurs even though the beam is amplified with additional energy acquired in the gain medium of the core 22. Therefore, the exit plane or aperture 28 of the multi-mode, rectangular waveguide core 22 is positioned, according to this invention, to coincide with a re-imaging plane of the waveguide 20, i.e., at some positive, non-zero integer (i) multiple of the waveguide self-imaging period (WSIP). Consequently, the length of core 22 of the waveguide 20 extending between the entrance face 26 and the exit face 28 is equal to WSIP×i, where i a positive, non-zero integer, such as 1, 2, 3, . . . , etc. The result is an amplified output beam 14 at the exit face 28 with the same spatial profile as the input beam 12 at the entrance face 26. Effective thermal management and other power scaling features and capabilities of such devices, according to this invention, will be discussed in more detail below.

Since the cross-sectional area of the core 22 of a multi-mode waveguide 20 can be so much (orders of magnitude) larger than the cross-sectional area of a single-mode waveguide (not shown) the energy inputs 30, 32 and resulting beam amplification in the optical amplifier 10 can be much greater than would be possible in a typical single-mode waveguide optical amplifier. Yet, the highly amplified output beam 14 of the high-power optical amplifier 10 of this invention can retain the desired input beam 12 wavefront and spatial intensity profile, for example, a spatially coherent, lower order super-Gaussian profile.

Further, the ability to use a much larger cross-sectional area for the core 22 of the multi-mode, rectangular optical amplifier 10 of this invention accommodates much higher power amplification capabilities without the adverse nonlinear effects of, for example, stimulated Brillouin scattering, stimulated Raman scattering, thermally-induced photoelastic effects, self-phase modulation, and four wave-mixing, which are typically encountered in single-mode waveguide amplifiers. The ability to provide superior thermal management with rectangular, multi-mode waveguides 20, as will be discussed in more detail below, also mitigates stress birefringence, which otherwise degrades polarization of the propagating light beam, and self-phase modulation degrades temporal and spatial coherency of the beam. For example, polarization maintenance in large effective core and double clad filter amplifiers is intrinsically difficult due to the circular geometry and radial thermal profiles. Therefore, the ability to provide high-power optical amplification with the amplifier 10 of this invention, while strongly mitigating the adverse effects of stress birefringence and nonlinear optical distortion, enables the amplifier 10 to produce a high intensity output beam 26 that not only retains temporal and spatial coherence of the input beam 12, but that also retains any polarization of the input beam 12, which is important for many signal processing, beam steering, industrial cutting, optical phased arrays, and other applications of high intensity laser beams.

Figure 4:
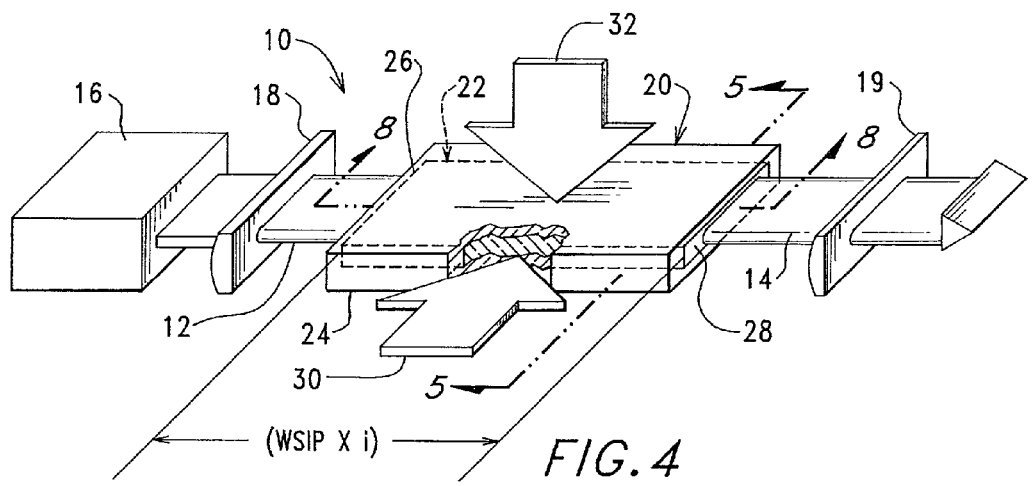
FIG. 4 is a diagrammatic, isometric view of a single-pass high power optical amplifier of this invention with a portion of the rectangular, multi-mode, self-imaging, waveguide cut away to reveal the core and cladding structure.

The beam source 16, input lens 18, and output lens 19 in FIG. 4 are shown only to illustrate, in a symbolic manner, a typical optical input/output arrangement for an optical amplifier and are not intended to be limiting in any way, since persons skilled in the art are well aware of, and capable of providing, myriad such input/output systems and configurations. Suffice it to say that operation of the amplifier 10 requires an input beam 12 from some source 16, which could be a laser diode or any other light beam producing apparatus or simply a light beam being transmitted by an associated system, such as a free-space system, optical fiber, or other waveguide propagated beam that is to be coupled into, and amplified by, the amplifier 10 of this invention. In the case of an amplifier that is outfitted with resonator optics to use the amplifier as a laser resonator, the input beam may comprise the portion of the light that is reflected by the resonator optics back into the amplifier, as will be described in more detail below, for example, in relation to FIG. 11. The input lens 18 in FIG. 4 is symbolic of any optical components or system that shapes, conditions, and/or focuses the input beam 12 with the desired spatial coherence and amplitude profile on the aperture or entrance face 26 of the core 22. An output lens 19 is not really required for an amplifier 10, but is shown here only as symbolic of any of myriad optical components or systems that may be used to couple the amplified output beam 14 to an optic transport system, such as the connecting waveguide 322 in FIG. 1, or other devices, or to project the amplified output beam 14 into free space.

The large cross-sectional area of the core 22 also accommodates a wide variety of energy input or pumping systems, which are indicated symbolically in FIG. 4 by arrows 30, 32, and from any side or end of the core 22, although side pumping, as indicated by arrow 30 is particularly advantageous and preferred according to this invention, as will be discussed in more detail below. The gain medium of core 22 can even be optically pumped by poor beam quality optical sources, such as a broad-stripe laser diode emitter or array coupled into a lateral side of the waveguide 20, as indicated by arrow 30, since the pump beam does not have to be focused into the entrance aperture or face 26, as would be required for a single-mode waveguide.

Optical confinement in the rectangular, multi-mode, waveguide 20 can be provided by any of myriad well-known waveguiding techniques. For example, total internal reflection by a cladding 24 with a lower index of refraction than the core 22 is one typical waveguiding technique, as is reflective surfaces on waveguide walls (not shown in FIG. 4). A particularly advantageous non-clad core 22 embodiment will also be described in more detail below.

Figure 8:
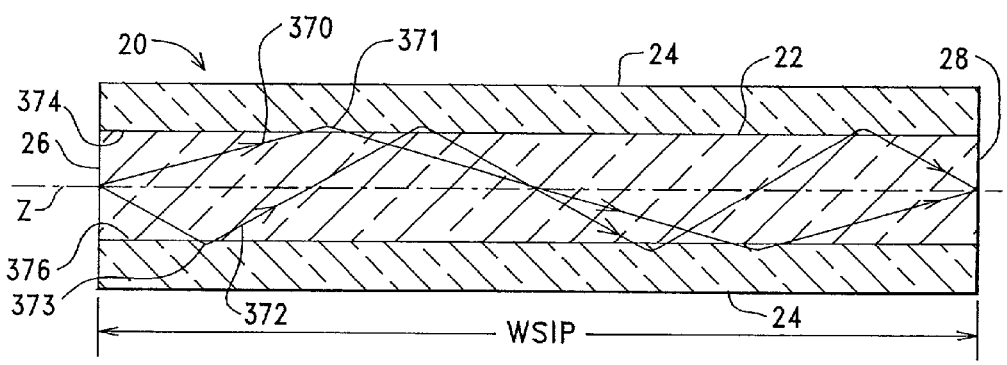
FIG. 8 is a longitudinal cross-sectional view of an example rectangular, multi-mode, self-imaging waveguide taken along section line 8—8 of FIG. 4 to illustrate evanescent field or propagation effects on length of waveguide self-imaging period (WSIP)

Evanescent field leakage or propagation effects also have to be considered in determining the distance (WSIP×i) between input and output apertures or end faces 26, 28 of dielectric core, self-imaging waveguides 20. As illustrated in FIG. 8, light in various propagation modes, for example modes 370, 372, propagating through the waveguide 20 generally in the direction of the longitudinal axis Z are turned by Talbot refraction at the interfaces 374, 376 of the core 22 with the cladding 24 when the index of refraction of the core 22 is less than the index of refraction of the cladding 24. However, such Talbot refraction is not the same as perfect reflection and does not occur completely at a particular point for any particular ray 370, 372. Instead, there is some evanescent leakage 371, 373 into the cladding 24, which can cause the re-phasing distance along the longitudinal axis Z, i.e., WSIP, to be slightly shorter than if there was total reflection at discrete points at the interfaces 374, 376. Such change in re-phasing distance is due to increase of length of travel for the light in the evanescent field of the cladding 24, as indicated at 371, 373. The extent of such re-phasing distance change due to evanescent effects will vary depending on the core 22 and cladding 24 materials and their respective indices of refraction, wavelength of the light, and dimensions of the waveguide 20.

Opposing waveguide walls do not have to be strictly parallel, although so-called tapered waveguides would have continuously variable imaging periods. Therefore, there would be more than one WSIP for a tapered waveguide. Consequently, placement of an exit face 28 of a tapered waveguide at some integer multiple of one WSIP, as described above for parallel waveguide walls, might miss positioning the exit face 28 at a re-image plane, thus would not be appropriate or effective. However, by knowing any particular degree of taper, the location of a re-image plane can be determined, and the exit face 28 can be positioned in such a re-image plane according to this invention. Therefore, use of a tapered waveguide with a rectangular cross-section for a beam amplifier and positioning the exit face at any re-image plane is considered to be equivalent and part of this invention, even if the exit face position might not be at a simple integer multiple of a WSIP in a tapered waveguide embodiment. A tapered, self-imaging waveguide can be useful in power scaling and coupling dissimilar self-imaging waveguides.

The waveguide core 22 can comprise any gas, liquid, or solid gain medium, although a solid gain medium is preferred for high energy density and thermal conductivity, which are essential for scaling up to high powers in laser amplifiers and resonators. However, gas thermal conductivity is about $10^{-2}$ to $10^{-3}$ less than thermal conductivity of solids. Therefore, as gain media, such as the system disclosed and described in U.S. Pat. No. 5,684,820, issued to Jenkins et al., are ill-suited for such purposes according to this invention, because they cannot dissipate heat efficiently enough to handle the high power levels for which this invention is designed and, further, because the dimensions are not generally amenable to high gas flow rates that could enhance heat exchange. Essentially, a gain or mixing medium is a material that can impart energy to a light beam that propagates through it. Since many such gain or mixing media are well-known to persons skilled in the art, it is not necessary to further explain or describe them for an understanding of this invention. Several examples will suffice, such as Nd:YAG (yttrium aluminum garnet doped with neodymium), Nd:YLF, or homologous materials, AlGaAs, In GaAsP, or various semiconductor materials, Nd-doped phosphate glasses, or $CS_2$, which is a well-known nonlinear optical response liquid that is often used for super-continuum generation.

Figure 5:
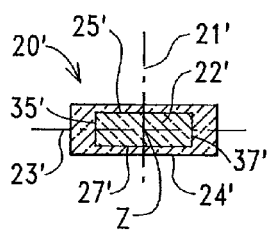
FIG. 5 is a transverse cross-section view of an example large aspect-ratio rectangular or "quasi-one-dimensional" waveguide taken substantially along section line 5—5 of FIG. 4.

The quasi-one-dimensional, rectangular waveguide 20 geometry illustrated in FIGS. 4 and 5 is particularly attractive for high-power waveguide applications, since the aperture 26, 28 and shape of the core 22 is conducive to the desired lower order super-Gaussian amplitude profile 350 (FIG. 2) described above, and since the aperture area of the entrance face 26 can be over ten thousand (10,000) times larger than that of a typical single-mode optical fiber, which allows for high-power operation of the amplifier 10 of this invention at intensities and fluences that are well below the threshold for optical damage and nonlinear optical effects in the waveguide 20, while still maintaining polarization and beam spatial coherence and amplitude profile, as discussed above. The potential for peak power scaling, i.e., scaling up to high-power operation, is proportional to the waveguide aperture area at the core face 26, which, as mentioned above, is not restricted in this rectangular, multi-mode, waveguide 20 by typical single-mode aperture constraints. Additionally, the ability to scale average power to high levels is dependent to a large extent on the thermal conductivity and surface area of the core 22 and cladding 24, and the flat-sided, rectangular shape of these rectangular, self-imaging, waveguides are advantageous for thermal management and heat dissipation according to this invention. The quasi-one-dimensional waveguide 20 geometry of FIGS. 4 and 5 is particularly attractive for high-power waveguide amplifier applications, since this geometry has: (i) an end or side aperture that can be coupled to one or more laser diode arrays allowing optical pumping with high coupling efficiency, which will be described in more detail below in relation to FIG. 8; (ii) a high surface-to-volume ratio for efficient heat dissipation, as will also be described in more detail below in relation to FIG. 13; and (iii) low thermal gradients that are essentially one-dimensional due to thin waveguide 20 geometry. For example, a 1-cm long, one-dimensional, laser diode array for high coupling efficiency of the laser diode output to the waveguide, as defined by getting the majority of the diode pump light, preferably waveguide 95% or more, into the core. The ability to use materials, such as sapphire and yttrium aluminum garnet (YAG) in the rectangular, self-imaging waveguides of this invention, as opposed to the silicate, germinate, or phosphate glasses used in fibers, also enhances the thermal management and heat dissipating abilities for power scaling according to this invention, as will be described in more detail below.

A quasi-one-dimensional waveguide 20 geometry, such as that illustrated in FIG. 5, sometimes simply called "one-dimensional" for short, is generally considered to be one in which there is self-imaging waveguiding in the direction of only one transverse axis 21 and simply free-space propagation along the unguided direction or transverse axis 23. In other words, the waveguide width or thickness (a) along one transverse axis 21 (the distance between core/cladding interfaces 25, 27) is much smaller than the width along the other transverse direction or axis 23 (the distance between core/cladding interfaces 35, 37). When there is enough difference between the direction 21 width or thickness and the direction 23 width or thickness so that the beam width in the core 22 is always smaller than the 23 direction width, and when the beam divergence along the short axis 21 is large enough compared to the waveguide width in the direction of axis 21 that the beam spreads and reflects from interfaces 25, 27 causing imaging along axis 21, the waveguide 20 is considered to be quasi-one-dimensional. In other words, if the length of the waveguide is such that self-imaging obtains in one direction and substantially free space propagation (or very long re-phasing distances) describes the other direction, then quasi-one-dimensional waveguides are appropriate. As such, a one-dimensional waveguide can also have a core 22 sandwiched between two cladding pieces, such as the top piece 24a and 24b of FIG. 5, without the wrap-around, edge cladding pieces 24c and 24d.

Figure 6:
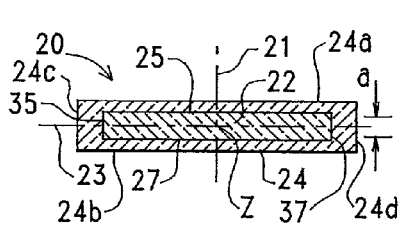
FIG. 6 is a transverse cross-section view of an example rectangular, multi-mode waveguide similar to FIG. 5, but with the aspect ratio smaller or "two-dimensional" so that the sides are also effectively optically confined by the cladding.

A two-dimensional, rectangular waveguide 20 cross-section is shown in FIG. 6. The core 22' is surrounded by a reflective cladding 24' to confine the light beam to the core region 22'. The cladding 24' can be, for example, a medium of lower index of refraction than the core region 22', for achieving total internal reflection. It could also be a medium of intrinsic reflectivity at the beam propagation wavelength, such as metal, air, vacuum, or one or more dielectric coatings that reflect the propagation wavelength. Reflections along one transverse direction or axis 21' occur at the opposite core/cladding interfaces 25', 27', while reflections along the other transverse direction or axis 23' occur at the opposing waveguide interfaces 35', 37'. The waveguide self-imaging period (WSIP) from each set of opposing waveguide interfaces 25', 27' and 35', 37' will be different, if the rectangular core 22 cross-section is not a square. On most applications, it is desirable that the re-phasing or re-imaging distances (WSIP×i) for the two waveguide axes 21', 23' match at the waveguide aperture or faces 26, 28. However it may be useful in certain situations to have one of the waveguide axes be at a "fractional Talbot distance" in order to split the exit beam into multiple, power-divided replicas of the input beam.

Figure 7:
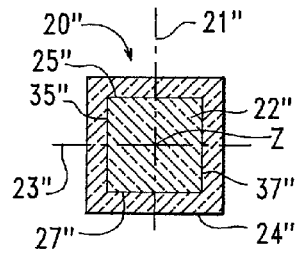
FIG. 7 is a transverse cross-section view similar to FIG. 5, but illustrating an example square waveguide core, which is a special case of a rectangular waveguide.

An illustration of a square cross-section waveguide 20" is shown in FIG. 7. In this embodiment, the waveguide width along its vertical axis 21", i.e., the distance between core/cladding interfaces 25", 27", and the width along horizontal axis 23", i.e., distance between core/cladding interfaces 35", 37", are equal. Therefore, the waveguide self-imaging period (WSIP) relative to each of these axis 21", 23" is the same.

References herein to rectangular waveguides and rectangular apertures also apply to square cross-sections and square apertures as well as to one-dimensional or quasi-one-dimensional waveguides and apertures, unless otherwise noted, and any of which maybe rigid structures, slabs, ribbons, thin films, hexagons, parallelepipeds, and other self-imaging structures, such as polygons with parallel opposing sides of equal dimensions, but to all sides necessarily being the same length. Also, apertures refer to the end faces, e.g., entrance and exit faces 26, 28 (FIG. 4) of the core 22, which are essentially the surfaces or optical "openings", where light beams 12, 14 enter and exit the core 22. In other embodiments of this invention described below, apertures or launch apertures may also refer to openings or devices in lateral sides, tops, or bottoms of waveguides as well as end faces or openings where light is coupled, propagated, or launched into or out of the waveguide.

As explained above, spatially coherent, lower order super-Gaussian, beams are particularly desirable for the power scalable, rectangular, self-imaging, waveguide optical systems of this invention, because they can have more light energy than common $TEM_{00}$ Gaussian beams of similar size, and they can be adapted to utilize more fully the rectangular cross-section of rectangular waveguides, especially one-dimensional rectangular waveguides. For example, waveguides with thicknesses in the range of 100 μm to 1 cm or more combined with a super-Gaussian beam can be scaled up to produce and/or transport the high power levels discussed above according to this invention. A preferred example very high peak power self-imaging waveguide according to this invention is a 1 cm×1 cm core with a lower order super-Gaussian beam. A spatially coherent, lower order super-Gaussian beam 12 for focusing on a rectangular input aperture 26, such as that shown in FIG. 4, can be provided by amplitude or phase modification of another beam format being injected into an optical amplifier or laser resonator via binary optics, as described above, by an apodized plane wave injection source, by a super-Gaussian mode resonator master oscillator, or by other methods or devices known to persons skilled in the art. A phase modification plate 351 is illustrated in the input beam 42 of the amplifier 40 in FIG. 9 and the amplifier 40' in FIG. 10 along with an amplitude modification plate 351'. Either one, both, or more of such plates 351, 351' can be used to modify the beam amplitude format or profile of input beam 42 to a suitable super-Gaussian amplitude profile for amplified output beam 44, as explained above and as would be understood by persons skilled in the art. Such a phase modification plate 351 is also shown positioned in beam 72 of the laser resonator 70 in FIG. 11 to produce a super-Gaussian output laser beam 74. Again, an amplitude modification plate could be used in beam 72, and such an amplitude and/or phase modification plate could also be positioned in beam 72' in addition to, or instead of, the phase modification plate 351 or amplitude modification plate (not shown) in beam 72. While such binary optics as phase modification plate 351 and/or amplitude modification plate 351' are illustrated only in the amplifier 40 in FIG. 9, in the amplifier 40' embodiment of FIG. 10 and in the resonator embodiment 70 of FIG. 11, they or any other appropriate beam modifying devices can be used in conjunction with any other laser amplifier or resonator configuration described herein or otherwise known in the art to produce super-Gaussian beams for purposes described in relation to this invention. Also, appropriate positions of phase modification plate 351 and/or amplitude modification plate 351' are not limited to those shown or described in FIGS. 9, 10, and 11, since the beam can be modified to super-Gaussian in many locations in relation to other optical components associated with laser amplifier and resonator devices either before or after passing the beam through the core or gain medium.

Of course, as mentioned above, additional considerations and designs with appropriate materials, thermal management and heat extraction or dissipation are also important for average power scaling according to this invention. For example, a one-dimensional parabolic thermal lens will form in the self-imaging waveguide core, if the core is too large. If the thermal lens focal length becomes shorter than, or commensurate with, the re-phasing distance, then the self-imaging propagation can be corrupted. Therefore, the most advantageous self-imaging waveguide dimensions for average power scaling are a complex combination of gain media, thermal-optic properties, pump conditions, and heat extraction design. For example, Nd:YAG and Yb:YAG waveguides typically would have different absorption and stimulated emission cross sections, as would be understood and well within the capabilities of persons skilled in the art.

Figure 9:
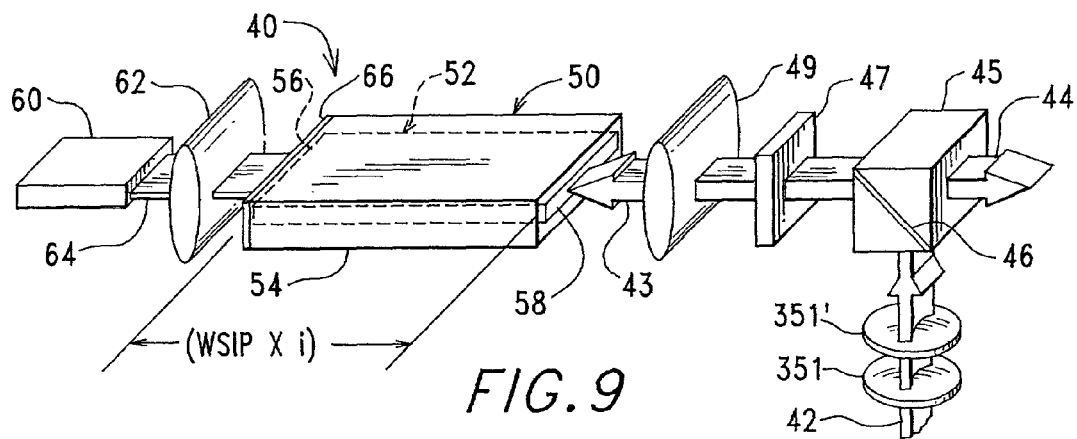
FIG. 9 is a diagrammatic, isometric view of a double-pass, high-power optical amplifier of this invention with a reflective end face.

The high-power optical amplifier 10 of this invention shown in FIG. 4 and described above is one simple embodiment illustrating the use of a multi-mode, rectangular, re-imaging waveguide with a core comprising a gain or mixing medium for amplifying a light beam 12 or mixing with other beams. There are, of course, many other useful amplifier configurations and embodiments that will occur to persons skilled in the art, once they understand the principles of this invention. For example, as shown in FIG. 9, a double-pass optical amplifier embodiment 40, in which the light beam 42 being amplified is passed twice through the rectangular, multi-mode, self-imaging, waveguide 50 to thereby extract even more energy from the gain medium in the waveguide core 52. In this example, the gain medium that comprises the core 22, such as Nd:YAG, is pumped with light energy 64 with, for example, a laser diode 60 coupled into the core 22 by a lens focusing system 59, which focuses the light 64 produced by the laser diode 60 onto the end face of aperture 56 of the core 52. The end face 56 is coated or covered with a dichroic material or combination of materials 66 that is highly transmissive of the wavelength of light 64 produced by the laser diode 60, but highly reflective of the light 42 that is to be amplified. Such dichroic filters 66 are well-known in the art and will be selected based on the wavelengths of the pump light 64 and the input beam 42.

The input beam 42 follows the same path 43 into and out of the waveguide 50, so the amplified output beam 44 has to be separated from the input beam 42. A common, well-known system for combining an input light beam 42 and output beam 44 of the same optical path 43 and then separating them includes a polarizing beam splitter 45, which comprises a birefringent prism or other layer of material 46, which reflects light that is polarized in one plane, e.g., the s-polarization plane, and transmits light that is polarized in the orthogonal plane, e.g., the p-polarization plane. Thus, the input beam 42, in this example, may be s-polarized so that the polarization selective layer 46 in the beam splitter 45, reflects the input beam 42 into the optic path 43, which is aligned with the face or aperture 58 of the waveguide core 52. A birefringent, ¼-wave retarder 47 is positioned in the beam path 43, so that the reflected input beam 42 has to pass through the ¼-wave retarder 47 on its way to the waveguide 50. The ¼-wave retarder 47 converts the s-polarization of the input beam 42 to circular polarization. The lens system 49 focuses the input beam 42 onto the aperture or face 58 of the core 52, again, with whatever spatial profile is desired. The lens system 49 is symbolic of any desired lens system that could be used for any desired beam profile, including, but not limited to, the desirable spatially coherent, lower order super-Gaussian amplitude profile described above.

As the input beam 42 propagates through the gain medium of the core 52 of the multi-mode waveguide 50, it breaks into as many modes of propagation as the size and numerical aperture of the rectangular core 52 permits for the wavelength of the light in the beam 42, and it acquires or extracts energy from the gain medium in the core 52 that is supplied by the pump light 64, thereby being amplified. At the same time, as described above, the rectangular waveguide periodically reconstructs or re-images the input beam spatial profile that is focused by the lens system 49 onto the aperture or face 58 at non-zero, positive integer (i) multiples of the waveguide self-imaging period (WSIP), i.e., at WSIP×i. Therefore, as described above, the apertures or faces 56, 58 of the core 52 are positioned at locations that coincide with re-image planes and spaced apart from each other by a distance equal to WSIP×i. The reflecting surface 56 could also be at a fraction of a WSIP distance as long as the total distance between faces 56, 58 and back again is WSIP×i. Upon reaching the end face 56, the amplified input beam 42 is reflected by the dichroic coating material 66 for another pass back through the core 52, where it continues to acquire or extract even more energy from the gain medium of the core 52. Therefore, the beam is amplified again on this second pass through the core 52. Again, with proper spacing of the faces 56, 58, the twice amplified beam is re-imaged at face or aperture 58 with the same spatial profile as it had when it entered aperture or face 58. Therefore, the amplified output beam 44 has a gain modified spatial profile, for example, a spatially coherent, lower order super-Gaussian beam, as the input beam 42, according to this invention. In some cases, a regular Gaussian beam input can emerge as super-Gaussian due to gain saturation, which is also within the scope of this invention.

Again, the amplified output beam 44 emanates from the waveguide 50 along the same optical path 43 as the input beam 42, so it has to be separated from the input beam 42 in order to direct it to whatever application (not shown in FIG. 5) for which it is amplified. Such separation is accomplished by the ¼-wave retarder 47 and polarizing beam splitter 46. Since one of the attributes of this invention is that the light beam 43 maintains its polarization as it gets amplified in the multi-mode, rectangular waveguide 50, it emerges from the aperture or face 58 with the same circular polarization that was imparted to the input beam 42 by the ¼-wave retarder 47, as described above. Upon re-passing back through the ¼-wave retarder 47, the polarization of the light beam is rotated again to polarization in the p-polarization plane, which is orthogonal to the s-polarization plane of the input beam 42. Therefore, the now p-polarized output beam 44 is transmitted, instead of reflected, by the polarization selective layer 46 in polarizing beam splitter 45, and it emerges from the polarization beam splitter 45 on a different output path than the path of the input beam 42. Of course, persons skilled in the art will recognize that an input beam with p-polarization and the output beam with s-polarization can also be used to the same effect, and there are other suitable optic arrangements for feeding input beams into and extracting output beams from state-of-the-art optic amplifiers and other optic components that would work with the rectangular, multi-mode, self-imaging, waveguide amplifier 40 of this invention. Moreover, differences or variations in WSIP distances due to differences in evanescent field penetration in the cladding usually only results in small residual wavefront astigmatism and curvatures that can be corrected or removed easily with mode matching optics, as would be understood by persons skilled in the art.

Figure 10:
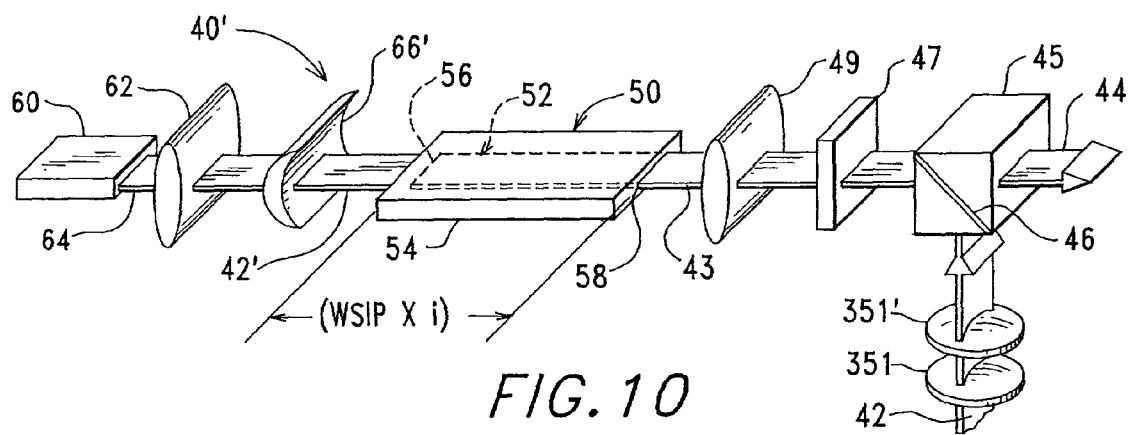
FIG. 10 is a diagrammatic, isometric view of a double-pass, high-power optical amplifier similar to FIG. 9, but with an external end reflector.

The double-pass amplifier embodiment 40' shown in FIG. 10 is similar to the FIG. 9 amplifier embodiment 40 described above, except that a curved, dichroic mirror 66' is used instead of the dichroic coating 66 in the FIG. 9 embodiment to admit pump light 64 into the gain medium of core 52 and to reflect the once-amplified input beam 42' back into the waveguide 50 for a second amplification pass through the gain medium of core 52. The curved, dichroic mirror 66' is spaced a distance away from the aperture or face 56 and is curved to re-focus the once-amplified beam 42' emerging from face 56 back into the aperture or face 56 with the desired spatial profile, allowing optical devices, such as electro-optic switches (not shown) and saturable absorbers (not shown) to be inserted. As would be understood by persons skilled in the art, the dichroic mirror 66' in FIG. 10 or the dichroic coating 66 in FIG. 9 could be constructed to perform some or all of the beam modifications necessary to produce a super-Gaussian output beam 44 instead of, or in addition to, the phase modification plate 351 and/or the amplitude modification plate 351', if desired. The same can be said for other optical components, such as the lens 49, retarder 47, or beam splitter 45.

As is well-known in the art, a laser resonator is quite similar to, and can be considered a special category or application of, an optical amplifier. To use an optic amplifier as a laser resonator, reflectors are used at opposite ends of an amplifier gain medium to reflect amplified light back and forth through the amplifier gain medium for additional re-amplification. Therefore, a rectangular, multi-mode, self-imaging, waveguide can also be used according to this invention to provide power scalable, multi-mode, laser resonators that produce output beams with desired spatial profiles, e.g., with lower order super-Gaussian or common $TEM_{00}$ Gaussian output beam profiles.

Figure 11:
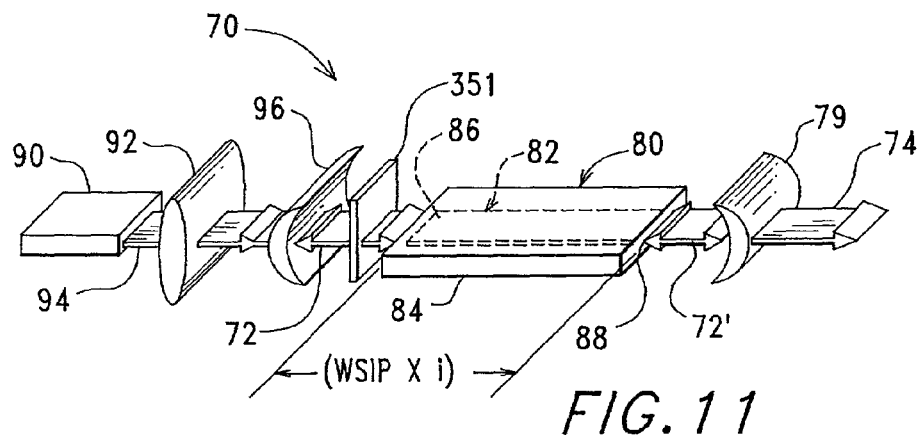
FIG. 11 is a diagrammatic, isometric view of a high-power laser resonator according to this invention.

An example laser resonator 70, which includes a multi-mode, rectangular, self-imaging waveguide 80 amplifier according to this invention, is shown in FIG. 11. Essentially, a multi-mode, rectangular, self-imaging waveguide 80 with a core 82 comprising an optical gain medium, such as Nd:YAG or any other suitable gain medium material, is excited or pumped to emit light energy 72, 72' from opposite faces or apertures 86, 88 of the core 82. The gain medium of core 82 can be excited or pumped optically with light energy from a laser diode 90, as shown in FIG. 11, or from any of myriad other know light energy sources, or, if the gain medium is a laser diode compatible material, it can be excited electrically to emit light energy 72, 72'. A laser diode compatible material and structure is one in which electrically pumped gain medium produces optical gain and thereby coherent light as an output. Persons skilled in the art are aware of, and capable of implementing, such excitation or pumping techniques, so it is not necessary to explain them here for an understanding of this invention. In the laser resonator 70 illustrated diagrammatically in FIG. 11, the pump light 94 from laser diode 90 is focused into the aperture or face 86 of the core 82 by a lens system 92, although it could be coupled into the core 82 through any other side surface, as explained above in relation to the optical amplifier illustrated in FIG. 4.

The curved mirror or reflector 96 is dichroic in this FIG. 11 arrangement, similar to the reflector 66' in FIG. 10, to transmit pump light 94 of a wavelength produced by the laser diode 90, but to reflect light energy 72 of a wavelength emitted by the core 82 of waveguide 80. Therefore, light energy 72 emitted from the aperture or face 86 of core 82 is reflected by the mirror 96 back into the core 82.

The curved mirror or reflector 79 adjacent the opposite face or aperture 88 is partially reflective of light energy 72' of a wavelength emitted by the gain medium of core 82. For example, but not for limitation, the mirror 79 may be fabricated to reflect about 80 to 90 percent of the light energy 72' and to transmit about 10 to 20 percent of such light energy as output beam 74. Thus, about 80 to 90 percent of the light energy 72, 72' emitted by the core 82 will be reflected or resonated back and forth through the gain medium of core 82 many times, and with each such pass through the gain medium of core 82, the light energy 72, 72' is further amplified with energy derived by the pump light 94. Therefore, the light beams 72, 72' become very intense, and, the output beam 74 also becomes very intense. According to this invention, the waveguide 80 is multi-mode, so the core 82 can be very large, which enables it to handle high energy levels and still maintain its optical and structural integrity. Either the totally reflected beam 72 or the portion of the beam 72', or both, can be considered an input beam to the amplifier core 82 and either or both of such reflected or input beams 72, 72' can be conditioned or modified to produce a super-Gaussian, a common $TEM_{00}$ Gaussian, or any other desired beam profile.

Also, according to this invention, the curved mirrors and/or phase plates 96, 79 are shaped and spaced from the respective core apertures or faces 86, 88 in such a manner as to condition and focus the light energy 72, 72' onto the faces 86, 88 with a desired spatial profile, for example, a preferred, spatially coherent, lower order super-Gaussian beam profile or a common $TEM_{00}$ Gaussian profile. For a preferred, spatially coherent, lower order super-Gaussian beam, an optical system similar to that described above for amplifiers can be used for this and other laser resonators. Also, either of the mirrors or phase plates 96, 79 can be constructed to perform the phase and/or amplitude modifications necessary to produce a desired super-Gaussian profile instead of, or in addition to, the phase modification plate 351. Further, according to this invention, the core 82 length extending between opposite faces 56, 58 is a non-zero, positive integer multiple of the waveguide self-imaging period (WSIP), i.e., a length equal to WSIP×i. Therefore, even though the light energy 72, 72' reflected back into the waveguide 82 breaks into as many modes of propagation as the dimensions and numerical aperture of the rectangular waveguide 80 will allow for the wavelength of light being produced, thus interferes and changes spatial profile as it is being amplified in the gain medium of the core 82, it always re-images for emission at the apertures or faces 86, 88 with the same desired spatial profile as was shaped for input by the mirrors 96, 79. Therefore, the intense, highly amplified, output laser beam 74 will have spatial as well as temporal coherence with a desired spatial profile, such as the preferred super-Gaussian or the common $TEM_{00}$ Gaussian beam.

While it is not shown, the dichroic mirror 96 in FIG. 11 could be replaced by a dichroic coating, such as the dichroic coating 66 shown in the amplifier in FIG. 9, on aperture or face 86, or the partially reflective mirror 79 could be replaced by a partially reflective coating (not shown) on the aperture or face 88. However, something on or adjacent at least one of the ends or faces 86, 88 has to focus or otherwise provide the desired beam spatial profile on at least one of the faces or apertures 86, 88. Therefore, at least one of the curved mirrors 96, 79 is needed to provide free-space focusing of a beam 72, 72' on a core face or aperture 86, 88, or some other optic arrangement to provide the desired spatial profile on an aperture or face 86, 88 would have to be provided. For example, one or both of the reflective coatings discussed above could be graded reflectively across its surface to reflect only a super-Gaussian spatial profile back into the core 82.

Figure 12:
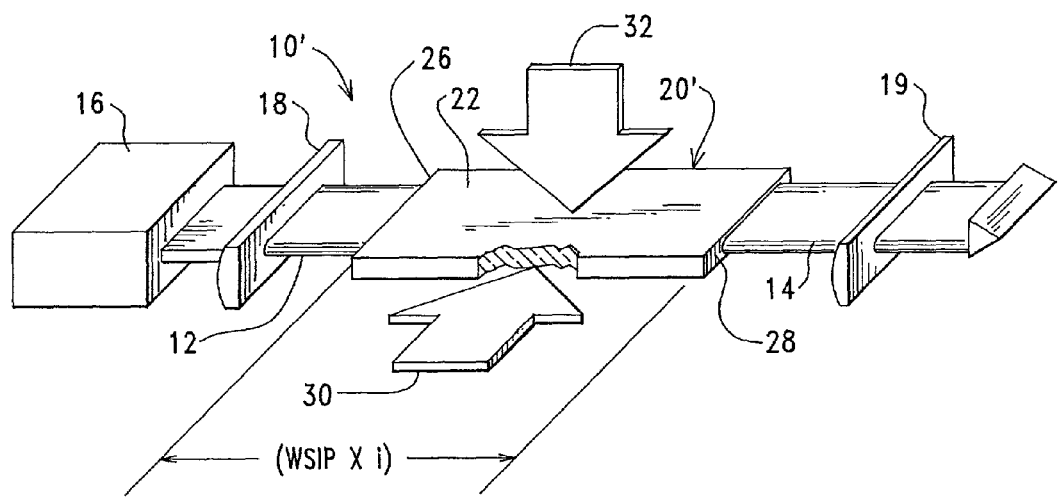
FIG. 12 is a diagrammatic view of a non-clad, multi-mode, rectangular waveguide in an amplifier laser resonator embodiment of this invention.

An alternate embodiment optical amplifier shown diagrammatically in FIG. 12 illustrates use of a rectangular, multi-mode, self-imaging, waveguide 20' in an amplifier 10' that is similar to the amplifier 10 in FIG. 4, but with a non-clad core 22, which can also be used with any of the input/output optics and laser resonator equipment and processed described above. For example, a core 22 comprising a gain medium of Nd-doped phosphate glass has an index of refraction that is high enough in relation to air or a gas (1.0), such as argon or nitrogen, at atmospheric pressure to provide total confinement of a light beam 12 in the core 22 positioned in such an atmosphere without any other solid or liquid cladding or reflective material on the surfaces of the core 22. Other core materials that are transparent to the light beam 12 and have a high enough index of refraction to provide such total confinement in a gas atmosphere could also be used in this manner. Any of the amplifier or laser resonators disclosed in FIGS. 1–11 and described above can be implemented with the non-clad core 22 shown in FIG. 12. Such amplifiers and laser resonators are particularly advantageous for heat dissipation, because the core is not covered by cladding, which can inhibit heat flow out of the core 22, where the heat is created from absorbed light energy. However, mechanical robustness and fabrication considerations favor clad self-imaging waveguides, especially in larger power scaled configurations.

For the rectangular waveguides 20, 50, 80 of the amplifiers and laser resonators described above and shown in FIGS. 1, 5, 6, and 7, to function effectively and reliably at high power levels, waveguide materials are important. A dopable, solid, gain material for the core 22, 52, 82 can be either a doped dielectric or doped semiconductor. A dielectric material is generally considered to have a bandgap of more than 3 eV at room temperature, and common semiconductor materials are generally considered to have a bandgap in the range of 0.25 to 1.1 eV, although many semiconductor materials are also available with bandgaps higher than 1.1 eV and reaching as much as 3.0 eV. For clad waveguides 20, 50, 80, the core material 22, 52, 82 is preferably combined with a cladding material 24, 54, 84 that not only has a lower index of refraction for reflectivity and wave guidance as explained above, but which also has a comparable coefficient of the thermal expansion, comparable thermal conductivity, high tensile strength, and capability of bonding to the core material in order to withstand thermal effects while dissipating heat. In general, oxides, such as YAG (yttrium aluminum oxide), are bondable to other oxides, such as sapphire ($Al_2O_3$), and chalcogenides are bondable to other chalcogenides. However, fluorides are not generally bondable to oxides.

The thermal conductivity of both the solid core material 22, 52, 82 and the cladding material 24, 54, 84 should be high, e.g., about 1 watt/cm·K, which is orders of magnitude more conductive than a gas core. However, in order to dissipate heat produced in the core 22, 52, 82 efficiently and to prevent hot spots of local heat concentrations, it is also important that the conductivity of the core and cladding match or nearly match each other. As a general guide, heat conductivity difference between the core material 22, 52, 82 and the cladding material 24, 54, 84 should be no more than about 25 percent of the cladding material conductivity in order to avoid thermally-induced, interfacial stresses that cause optical distortions and ultimately, can lead to material failure.

As the power increases, there is an ever increasing need for a match or near match between coefficient of thermal expansion of the core material 22, 52, 82 and coefficient of thermal expansion of the cladding material 24, 54, 84 in order to avoid excessive stress and resulting separation of the cladding material from the core material and/or breakage of either the core material or the cladding material during heating and cooling. Again, as the power increases, any difference in coefficients of thermal expansion between the core material and the cladding should be a low percent, e.g., 20 percent or less, of the coefficient of thermal expansion of the core material. Core and cladding materials with high tensile strength, such as at least 100 megapascals, e.g., YAG, also reduces likelihood of fracture or breakage during heating and cooling. If the core material 22, 52, 82 comprises a semiconductor material that is pumped electrically to produce pump light energy, the cladding material 24, 54, 84 may also have to be an electrically conductive material to serve as an electric contact.

In a preferred embodiment, the core material 22, 52, 82 comprises a neodymium-doped yttrium aluminum garnet (Nd:YAG) dielectric material clad by aluminum oxide ($Al_2O_3$), also known as sapphire. The Nd:YAG, often a bulk slab about 100 μm thick, has a coefficient of thermal expansion of about $7.5 \times 10^{-6}/°$ C. and tensile strength in the range of 125–200 megapascals. Sapphire has a coefficient of thermal expansion in the A crystal lattice direction of $6.65 \times 10^{-6}/°$ C. and $7.15 \times 10^{-6}/°$ C. in the C crystal lattice direction. Therefore, for purposes of this preferred embodiment, the cladding material slabs are each cut from bulk sapphire along the C lattice direction and is laminated onto the Nd:YAG core material with the sapphire C direction oriented in the length L dimension of the core to minimize thermal stress. Sapphire has a tensile strength of about 300 megapascals.

As mentioned above, good thermal management of optical systems, such as laser amplifiers, resonators, and transport waveguides, is essential for scaling to high optical power levels of operation, and the rectangular, multi-mode, self-imaging, waveguide amplifiers and laser resonators 10, 40, 50 70, and 10' are especially adaptable to excellent heat dissipation and thermal control according to this invention. Heat is generated primarily by energy absorbed from light in the cores 22, 52, 82, of those amplifiers and laser resonators. The more light energy that is pumped into, or created in, such cores, the more heat will be generated. If such heat is not dissipated, but allowed to build in the core to unacceptable levels, performance is adversely affected, first, because of optical distortions due to thermal gradients in the core material, and, ultimately, catastrophic (structural) failure due to melting and/or vaporization of the core material, especially at the apertures or other focal planes where light energy is most concentrated.

As already mentioned above, solid core materials, such as sapphire, have thermal conductivities that are orders of magnitude higher than gaseous core materials, thus are much more conducive to scaling up to high power levels. Also, as mentioned above, a claddingless core 22, as illustrated in FIG. 12 may be better able to dissipate heat, because heat transfer is not inhibited by a surrounding cladding, although such inhibition can be mitigated in clad structures by providing cladding that has thermal conductivity at least as great the thermal conductivity of the core.

Figure 13:
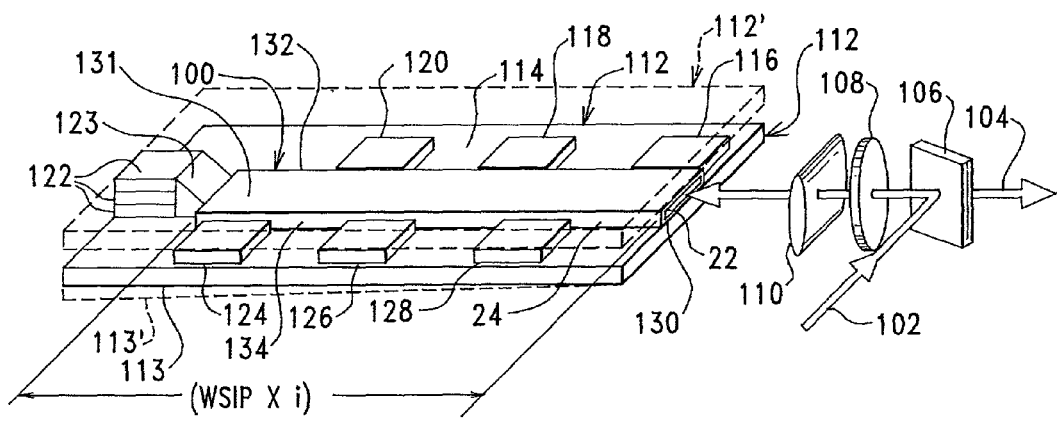
FIG. 13 is a diagrammatic, isometric view of a side-pumped and end-pumped high-power optical amplifier according to this invention mounted on a heat sink with phantom lines illustrating optional double-faced heat sink couplings.

However, in addition to the advantages of solid core materials for heat dissipation, the flat-sided shapes and dimensions of rectangular, multi-mode, self-imaging, waveguide cores are very well-adapted to heat dissipation according to this invention. For example, as illustrated in FIG. 13, the large surface area of the waveguide (or cladding) walls 130, 131, which may or may not be optically transparent to the pump and laser wavelengths, facilitate coupling heat sinks 112, 112' for thermal management of the amplifier 100 by enhancing removal of heat from the core 22. Therefore, the term heat sink, as used herein, means, generally, any device by means of which heat is absorbed in or removed from the core 22 (and cladding in clad amplifier embodiments). It can be a traditional heat sink in the sense of a body or environment having a greater heat capacity and a lower temperature than the core (cladding, ifthe core is clad) with which it is in contact. It can also include heat spreaders (e.g., diamond), optically transparent cladding, or opaque, actively cooled heat sinks. The spreader, cladding, or heat sink can be used alone or in combination to achieve thermal management of the core 22. Moreover, the thickness of the spreader, cladding, and/or heat sink can be varied across the waveguide surface to produce a more uniform temperature profile across the waveguide. For example, the bottom surface 113 of the heat sink 112 can be tapered, as indicated at 113' in FIG. 13, to extract more heat from the portion of the core 22 that is near the thicker end of a tapered heat sink 112 than from the portion of the core 22 that is near the thinner end of a tapered heat sink 112. If the waveguide amplifier 100 produces more heat adjacent the thicker end, such as due to more pump light 122 energy or some other heat build-up cause, the higher heat extraction capability of the thicker end of the heat sink 112 can help to maintain a more uniform temperature profile in the length of the waveguide core 22. Other shapes than the taper can be used, such as curved bottom surface 113', abrupt changes in heat sink thicknesses, or other thickness profiles, depending on the heat extraction profile desired. Alternatively or in addition, the cladding 24 on any or all of the surfaces of the core 22 could be made with various and/or varying thicknesses (not shown) to enhance or profile heat extraction from the core 22.

It may be preferable for the heat sink 112 to comprise a material that has a higher coefficient of thermal conduction than the core 22 in order to avoid a problem of inability of the heat sink 112 to conduct heat away from the core 22 at least as fast as the heat is produced in the core. However, a heat spreader can also be used beneficially as a heat sink, even though it may have a lower coefficient of thermal conduction than the core 22, if such heat spreader can pull heat away from the core 22 efficiently enough to keep the core 22 from overheating. Synthetic diamond is a good heat spreader for this purpose.

As illustrated in FIG. 13, a broad heat sink 112 with a flat surface 114 can be used to mount and support an elongated, multi-mode, rectangular waveguide amplifier 100 as well as a number of laser diode pump light sources 116, 118, 120, 122, 124, 126, 128. The top flat surface 114 of the heat sink 112 is coupled by thermal conduction to a flat bottom surface of the rectangular waveguide 100. As mentioned above, quasi-one-dimensional waveguides or other rectangular waveguides with a large aspect ratio of transverse widths or thicknesses, i.e., much wider in the direction of one axis 23 than in the direction of the other axis 21 (see FIG. 5 and related discussion above), result in nearly one-dimensional heat flow from the core 22 in the one or both directions (up and/or down) of the vertical axis 21 (FIG. 5) and, if clad, through the cladding 24. Therefore, such a broad aspect ratio is particularly beneficial for thermal coupling of a broad, flat side 130 of the waveguide 102 to the heat sink 112 for efficient dissipation of heat from the waveguide 102 to the heat sink 112. Likewise, the flat sides of the laser diode pump sources 116, 118, 120, 122, 124, 126, 128 are conducive to such efficient thermal coupling and heat dissipation to the heat sink 112. For a heat sink 112 on a non-clad amplifier core, such as the unclad core 20' of FIG. 12, an intervening layer of a heat conducting material (not shown) with a low enough index of refraction to not interfere with the waveguiding of light in the core 20' can be used to conduct heat from the core 20' to the heat sink 112. Such an intervening layer may comprise, for example, a fluoropolymer material or a silico-oxide material.

Also, the elongated, narrow sides of the waveguide 102 accommodate optical coupling of wide-beam, laser diode pump sources 116, 118, 120, 124, 126, 128 to the waveguide core 22 without significant light energy losses or need for focusing systems, although stacked laser diodes 122 with condensing optics, such as lens duct 123, or micro-optic arrays can also be accommodated, if desired, for more pumping power. The stacked diodes 122 and condensing duct 123 are illustrated in FIG. 13 positioned at an end of the waveguide 102 for example only. Such stacked diodes could be used anywhere along any side or end and in any number desired.

Basically, the cladding 24 can be a material that is transparent to the pump light, as long as it has a lower index of refraction than the core 22 material, is desirable, but not required, to confine light in the waveguide according to well-known principles as described above. The pump light can be injected exclusively into and trapped by the core 22. As shown in FIG. 13, laser diodes 116, 118, 120 coupled to one lateral side 132 of waveguide 102 can be offset in relation to the laser diodes 124, 126, 128 coupled to the other side 134 of the waveguide in order to spread the pump light evenly along the whole length of the waveguide 102 for more efficient absorption of the pump light in the core 22. Of course, unstaggered pump diode mounting configurations are also possible to increase the pump light population of the device, but they tend to be less energy-efficient.

An optional second heat sink 112' illustrated in phantom lines in FIG. 13 can be placed on the flat, top side 131 of the rectangular waveguide 102 to further increase heat dissipation from the waveguide 102. Of course, the heat sinks 112, 112' can also be used with laser resonators as well as amplifiers to dissipate heat.

The heat sinks 112, 112' can be passive or active. Passive heat sinks are preferably fabricated of one or more material that has high thermal conductivity, such as carbon-carbon composite, which has a thermal conductivity of 20 watts/cm·K. Active heat sinks, such as silicon or copper micro/ mini channel fluidic heat sinks are capable of extracting approximately 1 kilowatt/cm² of thermal flux.

A rectangular, multi-mode self-imaging, waveguide with a clad, solid, dielectric, core comprising Nd:YAG and sized 200 μm×2 cm in an amplifier or laser resonator, according to this invention, can operate at pulse energies of 100 mJ for 10 nanoseconds full width at half-maximum pulses while maintaining a safety margin of one-fourth to one-half the optical damage threshold. With proper thermal control, as described above, and careful design and sizing of the self-imaging waveguide length, pulse energies can be scaled up to 250 mJ, which is useable for a wide variety of commercial applications.

A particularly attractive preferred embodiment is a sapphire ($Al_2O_3$) clad 24, one-dimensional rectangular self-imaging YAG waveguide core 22, as described above, with silicon or copper microchannel cooled heat extractors 112, 112' with a plurality of side pump diodes, as illustrated in FIG. 13. The one-dimensional core 22 ensures a short heat dissipation path through the core 22 to the cladding 24. The sapphire cladding 24 has very high heat conductivity and a high damage threshold, as well as being a very high quality, optically transparent crystal material, so it transmits pump light to the core 22. Also, the cladding 24 is preferably no thicker than about 1 mm so that there is little, if any, absorption of pump light energy in the cladding 24, and so that the heat conduction path through the cladding 24 to the heat extractors 112, 112' is minimal. As mentioned above, the silicon or copper microchannel cooled heat extractors 112, 112' can reach 1,000 watts/cm² or more heat extraction.

Figure 14:
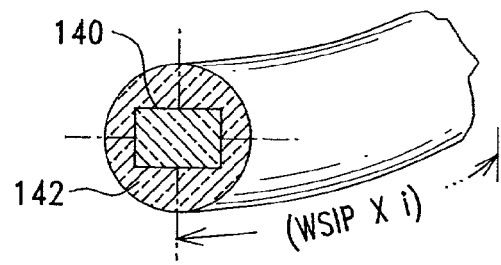
FIG. 14 illustrates a multi-mode, rectangular, waveguide clad in an optical fiber embodiment for use in an optic amplifier, laser resonator, beam transport, or other application of this invention.

The rectangular, multi-mode, self-imaging, waveguide for amplifier or laser applications according to this invention can also have optical fiber cladding 142, as illustrated in FIG. 14, since the cladding 142 does not have to be rectangular as long as it surrounds the rectangular core 140 and optically confines the light in the core 140, such as by having a lower index of refraction, as described above. The opposite aperture or face of the optical fiber is not shown, but, again, would be positioned to provide a waveguide length equal to WSIP×i for the reasons described above. Pump light can be injected into the cladding 142 to pump the core 140. Input and output light beam coupling for amplifier applications or resonator optics for laser resonator applications can be described above.

Figure 15:
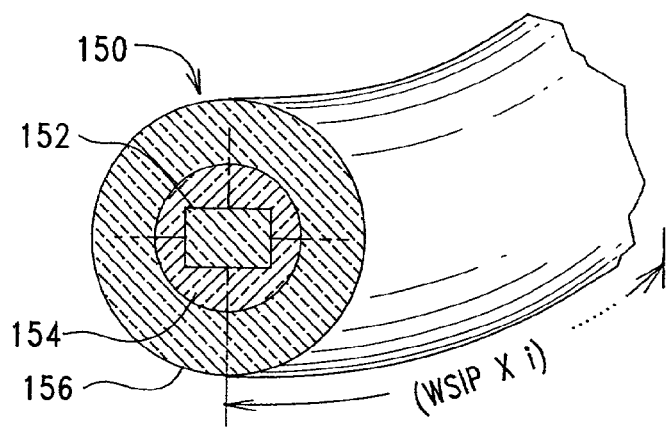
FIG. 15 illustrates a multi-mode, rectangular waveguide that is double-clad in an optical fiber embodiment that is particularly useful for providing pump light energy through the intermediate cladding layer to the multi-mode, rectangular waveguide core in amplifier or laser resonator applications of this invention.

A double-clad fiber optic amplifier or laser structure 150 is shown diagrammatically in FIG. 15, wherein the rectangular, multi-mode, self-imaging, waveguide core 152 is surrounded by a first cladding 154 that carries pump light energy to the core 152. The first cladding 154 is surrounded by a second cladding 156 to confine the pump light in the first cladding 154. Therefore, the first cladding 154 has an index of refraction less than the core 152 in order to confine the amplified light in the core 152, and the second cladding 156 has an index of refraction less than the first cladding 154 to confine the pump light in the first cladding 154. This "double-clad" configuration 150 is generally more desirable than the single-clad configuration just described, because contact induced pump light losses can be practically eliminated. The pump light enters the core 152 at virtually all angles allowed by cladding total internal reflection, thus providing efficient saturation of the core 152 with pump light energy. Of course, the length of the waveguide 152 between its two faces (not shown) is equal to WSIP×i, as described above. Input and output light beam coupling for amplifier applications or resonator optics for laser resonator applications can be as described above.

Figure 16:
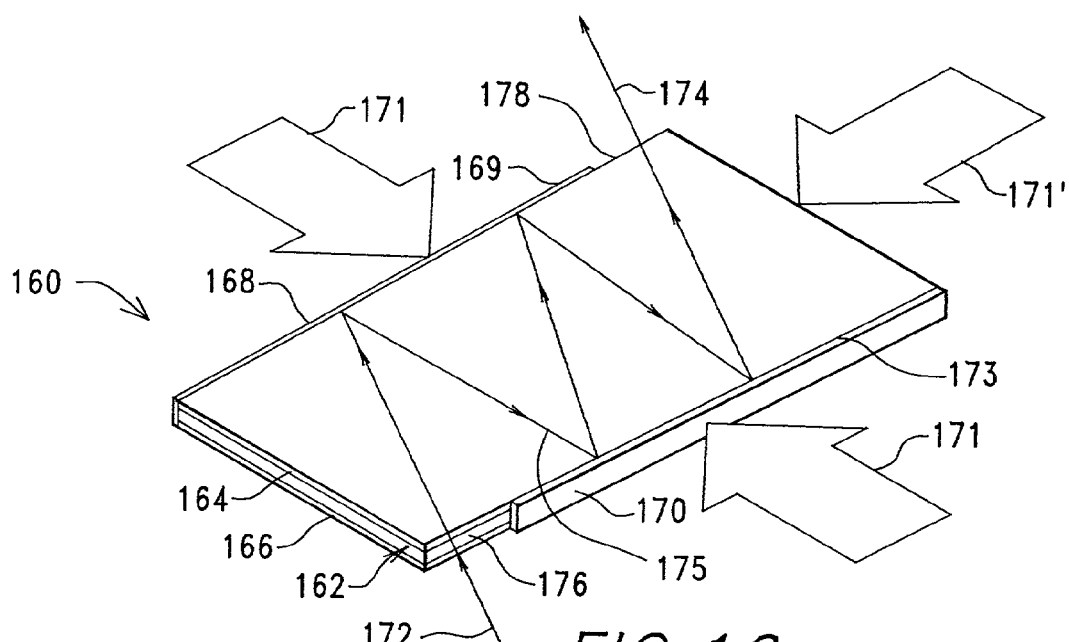
FIG. 16 is an isometric, diagrammatic view of a multi-mode, rectangular waveguide embodiment in which a beam is propagated in a zig-zag path to increase amplification and energy extraction efficiency.

In another rectangular, multi-mode, self-imaging, waveguide embodiment 160, illustrated in FIG. 16, which waveguide 160 can be used according to this invention for both optical amplifier and laser resonator applications, the waveguide 160 comprises a core 162 comprising gain medium sandwiched between two cladding layers 164, 166. Two dichroic mirrors or reflective coatings 168, 170 cover portions of the lateral edges 169, 173 of the waveguide 160, and the input beam 172 is directed at an angle into the first waveguide aperture or face 176 toward the opposite reflective coating 168, while pump light 171 is directed through the dichroic mirrors or coatings 168, 170 into the core 162. Pump light can also be injected directly into an end of the core 162, as shown diagrammatically at 171'. The beam 172 is reflected by coating or mirror 170, which also reflects it back toward mirror 168, etc. Consequently, the beam 172 propagates through the waveguide 160 in a zig-zag path, which is much longer than a straight path through the waveguide 160. Eventually, the beam emerges as an output beam 174 from a second aperture or face 178 that is not covered by the reflector 168. The longer path of the beam 172 through the waveguide 160 allows more amplification of the beam 172 and more extraction of energy from whatever pump light 171, 171' or other apparatus or method (not shown in FIG. 11) is used to excite or pump the gain medium of core 172. In this case, the effective waveguide length between the first face 176 and the second face 178 is the length of the zig-zag path of the beam 172 through the waveguide 160, not a straight line length from the first face 176 to the second face 178. Therefore, the zig-zag length would have to be equal to WSIP×i, according to this invention. This zig-zag embodiment 160 is particularly adaptable to a one-dimensional or quasi-one-dimensional multi-mode waveguide configuration, as described above. It could also be tapered, as explained elsewhere in this specification, and it could be unclad rather than clad, as explained above.

Figure 17:
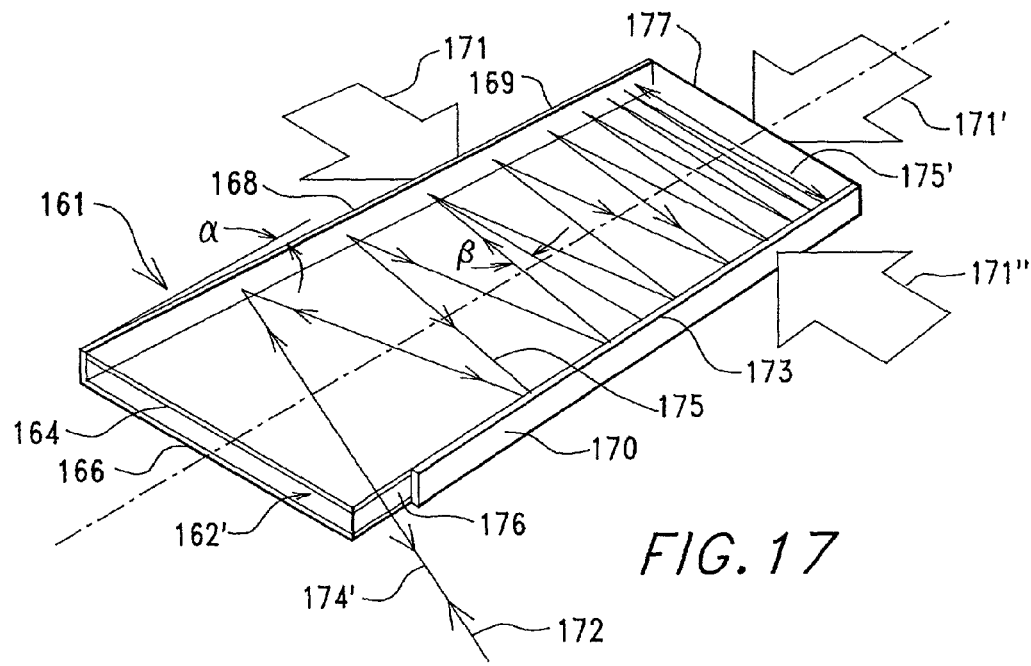
FIG. 17 is an isometric, diagrammatic view of a variation of the zig-zag optical path waveguide embodiment of FIG. 16, but with tapered side edges for higher zig-zag path density near one end and return propagation back through the waveguide.

Another embodiment of amplifier or laser resonator according to this invention with a zig-zag optical path 175 through a one-dimensional or quasi-one-dimensional, multi-mode waveguide is the so-called "light box" embodiment 161, illustrated in FIG. 17, wherein one or both of the lateral edges 169, 173 are tapered inwardly toward the longitudinal axis Z of the waveguide 161. As a result, the zig-zag path 175 of the beam in the waveguide has a progressively smaller incident angle β with the edges 169, 173, thus becomes more and more dense, until it reaches a terminal path segment 175' at a maximum distance from the input aperture 176, where it reaches a terminal path segment 175' at a maximum distance from the input aperture 176, where it reverses itself and retraces its zig-zag path 175 back through the waveguide 161 to emerge as an amplified beam 174' in the same path as the input beam 172. Therefore, the outlet aperture 178 of the FIG. 16 embodiment 160 is not needed in this lightbox embodiment 161. There are several advantages in this lightbox embodiment 161, including more density in the zig-zag path 175 in which the beam extracts pump light energy, especially as it approaches the terminal path segment 175', and such zig-zag path is effectively doubled for even more energy extraction by its propagation in the reverse direction, back toward the inlet aperture 176. Therefore, extraction of pump light energy with the input beam 172 as it propagates through the waveguide core 162' to emerge as the amplified output beam 174' is very efficient. Of course, input/output optics (not shown in FIG. 17, but similar to those described above in relation to FIGS. 9, 10, and 13), would be required for coupling input beam 172 into, and output beam 174' out of the waveguide 161.

Also, the total optical path length 175 from the input aperture 176, to the terminal optical path segment 175', and back to the input aperture 176 has to be WSIPxi for the input beam 172 profile to be preserved in the amplified output beam 174', as explained above. The pump light sources can be positioned to couple pump light energy into any one or more of the lateral sides 169, 173, as indicated by the arrows 171, 171" in FIG. 17, and/or into the end 177, as indicated by arrow 171'. Since the highest densities of the optical path 175 occur as it approaches the terminal optical path segment 175', positioning the pump light source for end pumping 171' and/or for side pumping near the end 177, as illustrated by arrow 171" can be particularly beneficial.

A portion of the benefits of the light box 161 of FIG. 17 could be obtained with the FIG. 16 embodiment 160, of course, by merely reflecting the output beam 174 back into the waveguide 160, but it would not get the benefit of the higher density portions of the zig-zag beam path 175 of the light box embodiment 161 in FIG. 17. More density may be obtainable in the waveguide 160 of FIG. 16, by adjusting the angle of incidence, but that variation would not have the benefit of positioning the higher density paths near one end for more efficient end-pumping 171'.

In FIG. 17, both of the lateral edges 169, 173 are shown as straight and tapered at an angle α in relation to the longitudinal axis Z. Specific angles α and angles of incidence for a desired waveguide 161 and optical path 175 geometries will depend on wavelength of the light beam, index of refraction, and other factors, but can be determined empirically or mathematically by persons skilled in the art, once they understand the principles of this invention. Also, one or both of them could be curved or could have different portions tapered at different angles to achieve the same advantages and results.

Figure 18:
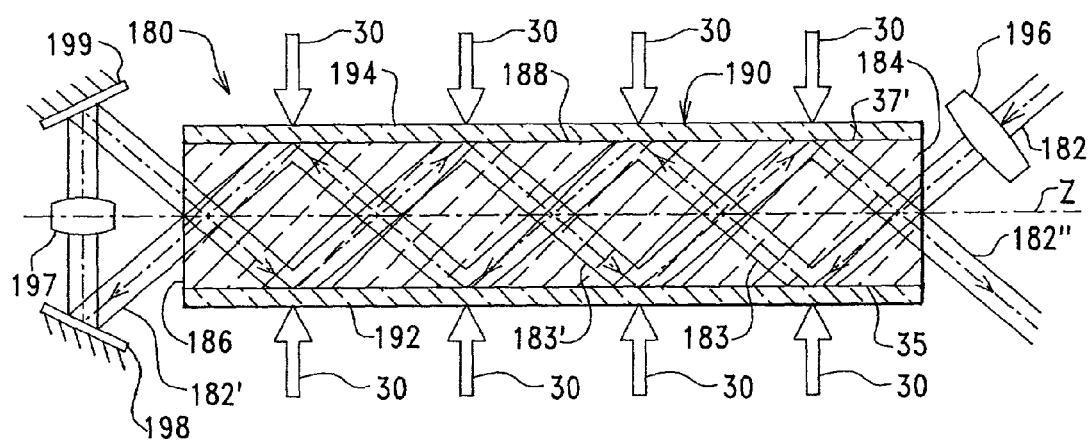
FIG. 18 is a cross-sectional view of a zig-zag, double-pass, beam path in a rectangular, multi-mode, self-imaging waveguide amplifier according to this invention.

Another zig-zag or "tilt" beam path embodiment, double-pass amplifier 180 is illustrated in FIG. 18, wherein the input beam 182 is directed into the end face or aperture 184 in an off-axis orientation, i.e., not parallel to the longitudinal axis Z of the waveguide core 188. The waveguide 190 is rectangular and multi-mode, preferably with a cross-section similar to that shown in FIG. 5 or FIG. 6, although the square cross-section of FIG. 7 would also work. Therefore, for purposes of illustration, but not for limitation, the waveguide 190 cross-section illustrated in FIG. 18 corresponds with a cross-section taken substantially along the horizontal axis 23 in FIG. 5. Thus, the interface 35 between the core 188 and lateral side cladding 192 in FIG. 18 corresponds with the core/cladding interface 35 in FIG. 5, and the interface 37 between core 188 and lateral cladding 194 in FIG. 18 corresponds with the core/cladding interface 37 in FIG. 5. The top and bottom cladding cannot be seen in FIG. 18, but is there, as taught above and as shown in FIGS. 5–7. A lens system represented symbolically by the lens 196 is any suitable optical system that focuses the incoming beam in the off-axis orientation desired onto the end face or aperture 184. An image relay lens 197 can be used, if necessary, to focus and condition the beam 182'. The core 188 and cladding have respective indices of refraction that confine the beam 182' in the core 188, as explained above, and a non-clad core described in relation to FIG. 12 would also work for this embodiment 180. Pump light or energy, represented symbolically by arrows 30 can be provided in core 188 by any method or apparatus known in the art, such as the laser diodes shown in FIG. 12 for a dielectric core, electrically if the core is a semiconductor, and the like.

As the light beam 182 traverses the core 188 in the first leg 183 of the zig-zag pattern or path shown in FIG. 18, it is amplified by the pump light or energy 30 in the gain medium of core 188 to emerge from end face or aperture 186 as a partially amplified beam 182'. The partially amplified beam is redirected by any suitable optical system, for example, the pair of spectral mirrors 198, 199, back into the aperture 186 for another pass through the core 188 for further amplification by extraction of pump light energy with the beam 182. The second pass is also preferably, but not necessarily, oriented off-axis to traverse a second leg 183' of the zig-zag path, through the core 188. It is preferable, but not necessary, for the second pass or leg 183' of the beam 182' through the core 188 to follow a different path than the first leg 183 in order to increase energy extraction from the core 188 as well as to distribute the thermal load more evenly and thereby avoid localized extreme thermal gradients that can produce optical distortions in the core, as described above. Therefore, the twice-amplified beam 182" emerges from the end face or aperture 184 in a different path than the incoming beam 182. Therefore, the end face 184 functions as both an input aperture for input beam 182 and an output aperture for the amplified output beam 182", and more complex input/output optical systems, such as the polarizing beam splitter and ¼-wave retarder in FIGS. 9 and 10, can be avoided.

If the input beam 182 is tilted from the longitudinal axis F of the waveguide 180 by an angle of more than wavelength divided by aperture (λ/a) (i.e., the angular extent of the central diffraction lobe due to the waveguide aperture), the re-phasing or self-imaging requires four times the propagation distance as non-tilted beams due to broken symmetry, and the injected and recovered beams can easily be separated. Again, it is not necessary for re-imaging to occur at the end face or aperture 186, as long as the total distance traveled by the beam in both passes through the core 188 is equal to WSIPxi at the end face or aperture 184.

Figure 20:
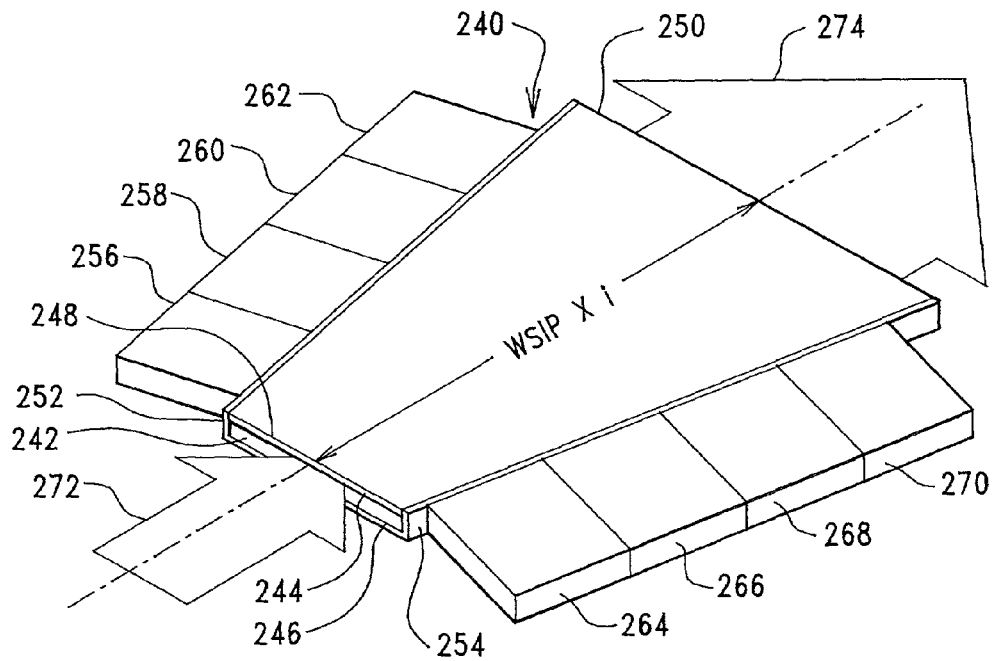
FIG. 20 is an isometric view of an amplifier embodiment of this invention that is flared in the non-imaging (transverse) direction.

Another amplifier embodiment 240 of the present invention shown in FIG. 20, like other embodiments described above, utilizes a multi-mode, one-dimensional, rectangular, self-imaging, waveguide with a length equal to WSIPxi, but which is flared in the non-imaging (transverse) direction. A core 242, sandwich-clad by cladding 244, 246, is narrower in transverse width, i.e., transverse to the longitudinal axis 243, at the inlet aperture 248 than at the outlet aperture end 250. The core 242 is side-pumped by a plurality of laser diode pump sources 256, 258, 260, 262, 264, 266, 268, 270, for example, preferably coupled through anti-reflective (AR) coatings or by dichroic mirrors 252, 254 to lateral sides of the core 242 to accommodate double pass, multiple wavelength, pumping. This flared configuration is particularly adapted to provide increasing cross-sectional areas of the core 242 as the input beam 272 propagates through the core 242 and picks up more and more energy from the pump light to produce the amplified output beam 274. If desired, the laser diode pump sources can be higher power lasers toward the output aperture end 250, where the core 242 has larger cross-sections, as compared to lower power lasers for those nearer the input aperture end 248. Of course, the thermal management and heat dissipation materials and components, super-Gaussian beams, and other features discussed above, can also be used in this flared amplifier embodiment 240.

Figure 19:
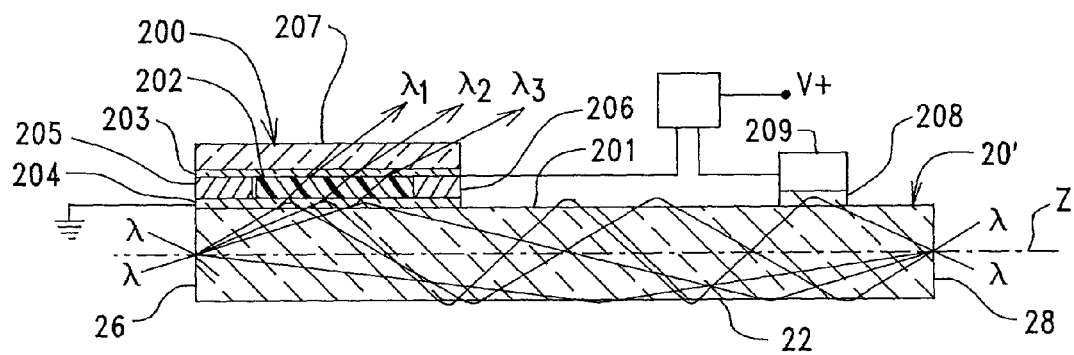
FIG. 19 is a cross-sectional view of a diffractive coupler, e.g., liquid crystal modulator, for wavelength and phase control on a rectangular, multi-mode, self-imaging, waveguide amplifier or laser resonator according to this invention.

Wavelength and phase control for amplifiers and laser resonators can be controlled in the rectangular, multi-mode, self-imaging, waveguides of such amplifiers and resonators by utilization of diffractive modulators 200, such as the liquid crystal modulator illustrated in FIG. 19. A static external grating, embedded photo-reactive grating, or any other form of periodic phase or amplitude grating could be used instead of the liquid crystal modulator 200. The optical components for coupling light into and out of the waveguide 20' are not shown in FIG. 19 in order to avoid unnecessary complexity in the drawing. The example diffractive, liquid crystal modulator 200 is illustrated diagrammatically on the unclad core 22 of the waveguide 20' of FIG. 19, but it can also be applied to clad amplifier and laser resonator waveguides described herein. Essentially, there are many liquid crystal materials, such as nematic, smectic, cholesteric, or ferroelectric liquid crystals, that can be set up in such a was as to change index of refraction in response to change of voltage across such liquid crystal materials, and change of index of refraction of a material that interfaces with the waveguide core affects the light confinement effectiveness of the waveguide for various wavelengths of light. Therefore, with the liquid crystal modulator 200 mounted on a surface 201 of the core 22, the effective index of refraction of the liquid crystal material 202 adjacent the core 22 can be varied by varying the voltage across the liquid crystal material.

A liquid crystal modulator 200 can be constructed in many ways, as is well within the capabilities of persons skilled in that art once they understand the principles of this invention, but one such example structure is shown in cross-section in FIG. 19. Essentially, the liquid crystal material 202 is placed between two transparent conductive oxide films 203, 204, which function as electric contacts on opposite sides of the liquid crystal material 202 and which are brushed in a manner that imposes a directional alignment of liquid crystals that contact them. One transparent conductive oxide film 204 can be deposited on the surface 201 of the core 22, and the other transparent conductive oxide film 203 can be deposited on a cover plate 207 of glass or other transparent material. Lateral supports 205, 206 contain the liquid crystal material 202 and support the cover plate 207.

In operation, a voltage applied across the liquid crystal material 202 is preferably set at a level that makes the effective index of refraction of the liquid crystal modulator 200 at a value that confines the desired light wavelength $\lambda$ in the core 22, but which couples out other light wavelengths, such as $\lambda_1$, $\lambda_2$, $\lambda_3$ in FIG. 19. If desired a light sampling window 208 can be provided to extract a sample of light from the core 22 to monitor the intensity of light of different, unwanted, wavelengths, for example, $\lambda_1$, $\lambda_2$, $\lambda_3$. A wavelength monitor 209 coupled to the window 208 can be used to monitor such other unwanted wavelengths $\lambda_1$, $\lambda_2$, $\lambda_3$, which are commonly produced by wider band gain materials, for example Nd:YAG. Such wavelength monitors are well-known and commercially available, such as Fabry-Perot etalons, or can be made with dichroic light filters and photodetectors to admit and detect certain wavelengths $\lambda_1$, $\lambda_2$, $\lambda_3$, etc. With input from the wavelength monitor 209, a controller 211 can function in as feedback loop to vary the voltage across the liquid crystal material 202 in a manner that optimizes coupling of such unwanted wavelengths $\lambda_1$, $\lambda_2$, $\lambda_3$ out of the core 22. By changing the index of refraction of the proximal modulator 200 uniformly, rather than in a periodic fashion, phase shifting of the self-imaging waveguide 20' output at high average powers can be implemented, which has clear power scaling and performance advantages over transmissive phase shifters in series with a self-imaging waveguide. Additional modulators 200 can be added to the waveguide 20' on either the top side or the bottom side, or both, if desired.

The diffraction grating 200, however implemented, acts as a spectral filter, either in transmission or reflection mode, with its spectral bandwidth and transmission determined by the grating shape, modulation depth, length, and depth relief with respect to the self-imaging waveguide 102' walls. The wavelength-selective reflection and transmission filter could also be implemented with gratings embedded in more than one of the self-imaging waveguide 20' walls. The grating can serve as wavelength-selective reflectors on waveguide stubs from T-junctions and as wavelength-dependent phase shifters. The optical "stub" wavelength-dependent reflectors can also be used to construct waveguide circulators in direct analog to the microwave circulators, which are well-known to persons skilled in the art.

It is also worth mentioning that squeezing a core of a self-imaging waveguide can also phase shift light propagating therein, thus can be used with some applications of this invention. This technique works for both hollow and solid, dielectric cores.

The power scalable devices, components, and methods described above in relation to FIGS. 1–19 are primarily for amplifiers, including laser resonators, that are provided for creation of the high power beams needed for various applications, for example, the ladar ranging, targeting, or imaging system 300 in FIG. 1. However, the rectangular, multi-mode, self-imaging, waveguide principles described above can also be applied to passive transport of such high power beams to points of launch or application of such beams to industrial, medical, imaging, ranging, tracking, and the like, while maintaining desired beam quality, temporal and spatial coherence and profile, polarization, phasing, etc. To illustrate some of the capabilities and features of beam transport and delivery methods and apparatus based on rectangular, multi-mode, self-imaging, waveguide technologies according to this invention, reference is made to FIG. 21, which is an enlarged, perspective, diagrammatic view of portions of the high power optical system 300 from FIG. 1

Figure 21:
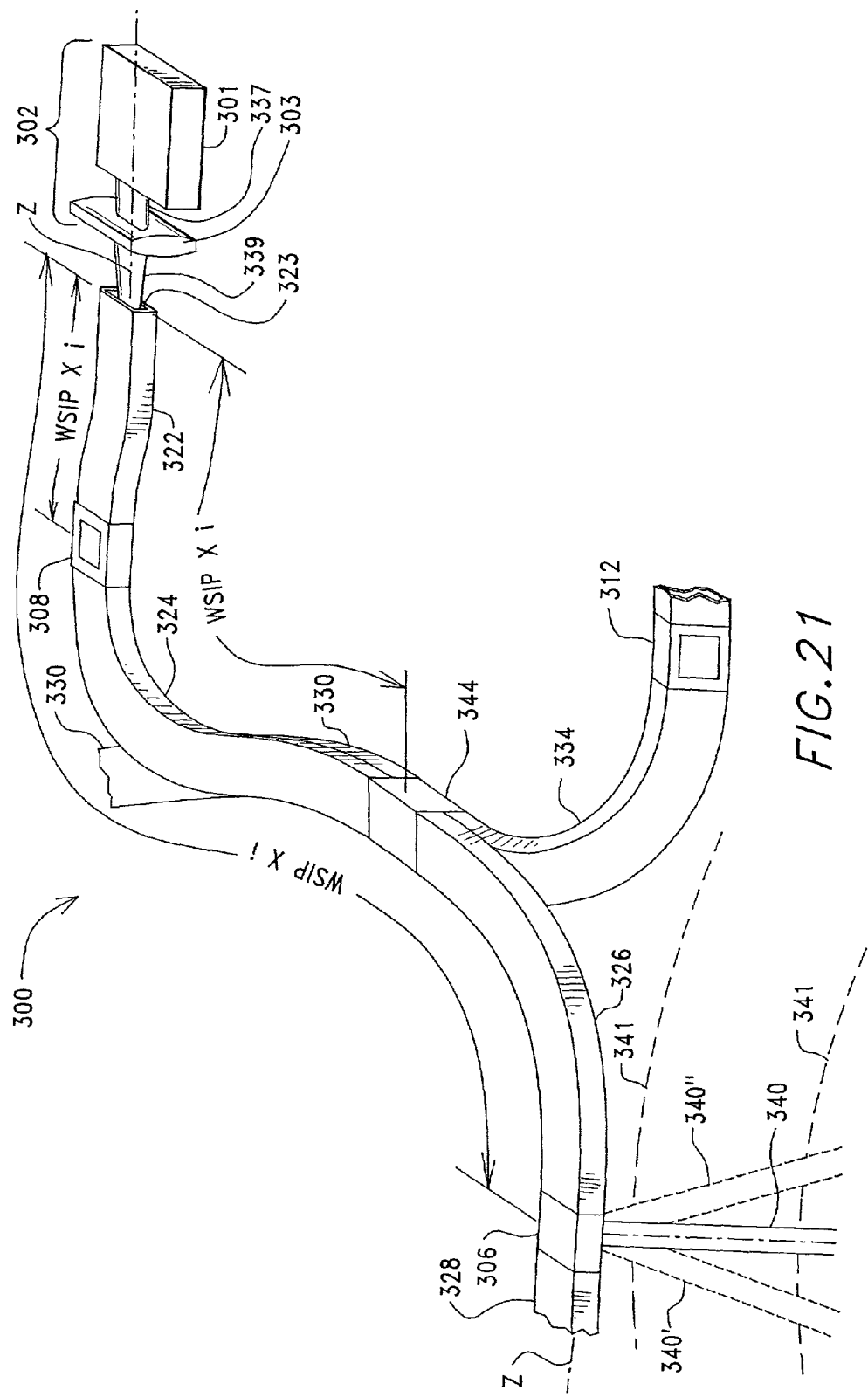
FIG. 21 is an enlarged, perspective view of portions of the high-power beam generator and transport system of FIG. 1.

The ladar beam generator 302 in FIG. 21 can include any laser amplifier and/or resonator equipment 301 that can produce a high power beam 337 with a desired spatial profile, preferably a lower order super-Gaussian beam produced with one or more of the laser amplifiers, including, but not limited to, laser resonators, of this invention, as described above. Other components needed for a functioning ladar beam generator, such as frequency and pulse controllers, pump light sources, beam sampling and heterodyne components, and the like, are well-known to persons skilled in the art and not part of this invention, thus are not shown or described herein. A lens system for focusing the ladar beam 337 onto the aperture 323 is represented symbolically by the lens 303, but can include any appropriate optical system for coupling the ladar beam 337 to the waveguide 322 in a manner that focuses the beam 323 at or inside the aperture 323. Alternatively, while not shown in FIG. 21, the laser resonator and/or amplifier 301 can be fabricated as an integral part of, or inside of, the self-imaging waveguides 322, so that the laserbeam 337 is emitted by such a laser resonator and/or amplifier 301 inside the self-imaging waveguide.

The rectangular, multi-mode, self-imaging, waveguides 322, 324, 326, 330, 334 are sized to transmit the high power laserbeam 339 to the various launch apertures 306, 308, 312, etc., where it can be coupled out or launched for the desired ranging, targeting, imaging, or any industrial, medical, or other application, as illustrated symbolically by the beam 340 in FIG. 21. Backscatter wavefronts 341, which are reflected or scattered by a target or scene area (not shown in FIG. 21) illuminated by the beam 340, can be received back into the waveguide 326 via the same launch aperture 306 or by other apertures into the same waveguide or into different waveguides. A coupler 344 can also couple the laser beam from one waveguide 324 into other waveguides 330, 334, and the like, as will be explained in more detail below.

To launch the beam 340 with the desired spatial profile, such as the preferred, lower order super-Gaussian profile described above, the launch apertures 306, 308, 312, etc., should be positioned at a distance WSIP×i from the initial focal plane, e.g., the inlet aperture 323 if the beam 339 is focused at the inlet aperture 339, as explained above, so that the beam being transported in the waveguides 322, 324, 326, etc., re-phases at the launch aperture 306, 308, 312, etc. Because of the self-imaging or re-phasing characteristic of the rectangular waveguide geometry, the aperture 323 and cross-sectional area of the waveguides 322, 324, 326, etc., can be orders-of-magnitude larger than a single-mode aperture area or cross-section of core, thus can transport and deliver much higher power beams than single-mode waveguides and still deliver the desired beam profile, e.g., lower order super-Gaussian, at the output or launch aperture, which is not possible in conventional, multi-mode optical fiber waveguides with circular, oval or other conventional core cross-sectional shapes. Such rectangular configuration results in the re-construction of the input spatial profile, generally, or that of the input complex amplitude profile. If the rectangular waveguide core is comprised of a gas, gases, air, or vacuum, and has highly reflective waveguide walls, then nonlinear distortions of the spatial, spectral, and temporal coherence due to heat build-up or thermal gradients can be largely avoided up to the breakdown limits of the waveguide walls or cladding. Thus, for corresponding intensity limits, the guided wave, high power, beam transport systems of the present invention can handle optical powers that may be orders-of-magnitude larger than single-mode waveguide systems while still reproducing and delivering the same input beam or image at the output. The increase of power handling capability may correspond to the increase in waveguide aperture area, as more particularly described below.

The rectangular geometry of the waveguides 322, 324, 326, etc., also preserves beam polarization with either uniform or non-uniform index profiles in either transverse direction, as further described below. Such polarization preservation, without the need for additional polarization components or materials, is important for energy conservation and thermal management purposes, because such polarization components and materials in conventional, multi-mode, optical fiber beam transport systems absorb substantial amounts of light beam energy, which is largely converted to heat. Also, polarization preservation is important to many beam input/output systems, beam analysis systems, beam steering, and efficient, sharp cutting applications, etc.

The high power, beam transport waveguides 322, 324, 326 of the present invention can be fabricated of various materials in accordance with traditional techniques in the art, for example, fabricated as a flexible, hollow, rectangular duct or as a stiff, crystalline core that is either clad or unclad as described above in regard to the laser resonator and amplifier embodiments of this invention. Hollow waveguides of the present invention may be further formed, embossed, coated or otherwise fabricated with various coatings, and in some instances fabricated with dielectric coatings, including reflective interior coatings, depending on the desired characteristics of the wave guide and the particular application or applications to which the waveguide is to be applied.

Hollow waveguide embodiments can function with some bending and twisting, and still re-phase or re-image periodically. Such bending or twisting can sometimes cause small perturbations of the periodic self-imaging properties, but corrections can be made so that they do not affect the overall system behavior. For example, a twist can have an optical effect similar to incorporation of a negative lens, while a bend can have an optical effect similar to incorporation of a positive lens. However, compensation for those effects can typically be implemented by spherical and stigmatic optics at the input and output ends of the self-imaging waveguide.

Figure 22:
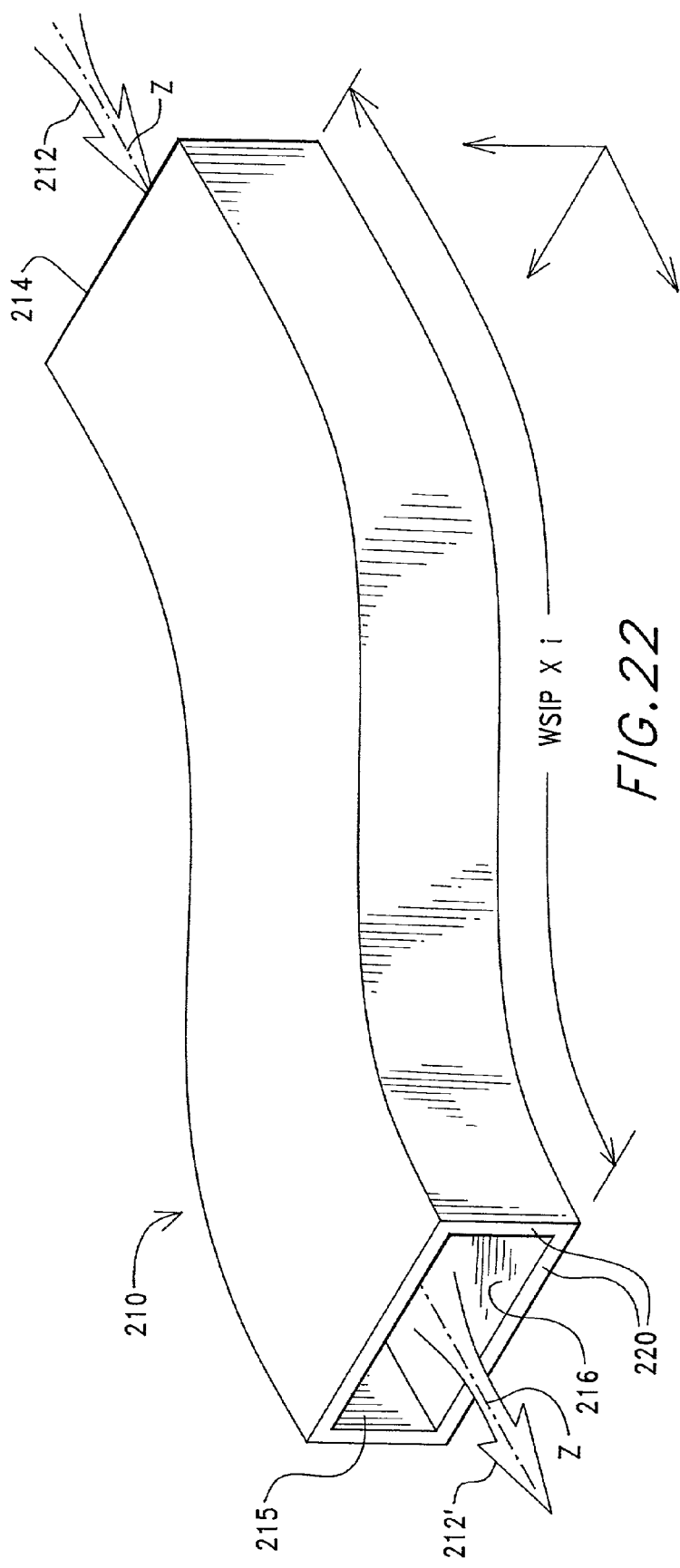
FIG. 22 is an enlarged, perspective view of a high power beam transport waveguide used as part of the invention.

An enlarged example of a hollow, rectangular multimode, self-imaging, waveguide beam transport device 210 in FIG. 22 is similar to the waveguide portions 322, 324, 326, 330, 334 of FIG. 21 and is representative of waveguide transport devices of this invention for purposes of explanation. An input beam 212, represented as an arrow, is introduced to an optical aperture, entrance face, or cross-section 214 of the waveguide 210. In some embodiments, one or a plurality of lens (not shown in FIG. 22) or abutment joints may be used to input, inject, or otherwise introduce the input beam 212 to the interior region or core 216. One or a plurality of lens (not shown in FIG. 22) or abutment joints may be used to output an output beam 212' from the interior region or core 216 at the end face or output aperture 215. Embodiments may also provide a coupling of a waveguide of the present invention with another waveguide for either input, injection, or other introduction of an input beam 212 into, or an output beam 212' from such other waveguide. If another waveguide is used to input a beam 212 into a rectangular, self-imaging waveguide 210 of the present invention 212' from a waveguide or to receive an output beam 210 of this invention such other waveguide may, but need not necessarily, comprise a rectangular, self-imaging waveguide. Abutment couplings, not shown in FIG. 22, can also be used to couple beams 212 from an optical amplifier or laser resonator of this invention as described above into the multi-mode, rectangular beam transport waveguide 210. The waveguide interior or core 216 is preferably hollow, as shown in FIG. 22 and filled with air or a gas that has a high breakdown threshold, such as helium, or it can be evacuated. Alternatively, the core 216 could comprise a solid or liquid (not depicted in FIG. 22). However, for low dispersion, high or very high power beam transport applications, a hollow core 216 is best. The walls of the waveguide 212 can be actively cooled with an air or liquid cooling medium (now shown), if necessary, for high or very high power beam transport applications.

The multi-mode waveguide re-phases or self-images the spatial profile beam 212 at the determined self-imaging period (WSIP) in the manner previously described. The wave guide length is chosen such that the optical path length is an integral multiple of the wavelength self-imaging period, i.e., WISP×i, for re-phasing or re-imaging the input beam 212 profile at the output aperture 215, as also explained above. The beam 212 can be coupled, injected, or otherwise introduced into the waveguide 210 to travel along a central propagation axis Z, and exits the waveguide at an exit face or cross-section 215 at an opposite end of the waveguide or through wall launch apertures 306, 308, 312, as described above. However, as an alternative, the input beam 212 can be directed to travel at a non-zero angle relative to the central axis 217 of the waveguide 210, in which case the optical path or effective waveguide length WSIP×i will differ from the length of the waveguide 210, as explained above in relation to FIGS. 16, 17, and 18. However, it may be noted that indices of refraction for solid, dielectric cores are greater than one, and, for some dielectric materials, can be substantially greater than one, e.g., zinc selenite, which has an index of refraction greater than 2.0 at 1.06 micron wavelength. Therefore, the numerical aperture, thus also angle of acceptance, is greater for solid, dielectric cores than for hollow core waveguides. Consequently, solid core waveguides can be more compact, but hollow core waveguides for high power beam transport have the advantages of minimal dispersion, minimal nonlinear optical distortion, minimal heating, and excellent mechanical flexibility for routing around curves and through places where available space is limited.

Furthermore, the hollow core 216 is surrounded by walls or cladding to provide optical confinement of the beam 212 in the hollow core 216. The optical confinement can be provided by reflective cladding walls 220 or by other techniques, such as internal reflection from cladding layers 220 that have a lower index of refraction than the core 216 material. If the core 216 is a solid with a high enough index of refraction, such as phosphate glass, no cladding 216 is necessary, as described above in relation to FIG. 12. Walls or cladding 220 may have a shape distinct from the cross-sectional shape or aperture of the waveguide, for example, as shown by the optical fiber in FIGS. 14 and 15. Additional regions exterior to the cladding may be provided in some embodiments to increase structural robustness.

Cladding 220 may form a reflective region, and some embodiments may provide cladding composed of a medium of a lower index of refraction as compared to core 216, to provide for total-internal-reflection, a medium of intrinsic reflectivity at the propagation wavelength of a beam, such as metal, or one or more dielectric coatings that reflect the beam of a particular wavelength, among others. However, hollow, passive systems may, in some embodiments, avoid dielectric coatings such that hydroscopic delinquence or other effects capable of damaging the waveguide 210 can be avoided.

Reflections of rays or modes of the beam 212 propagating in the direction of the longitudinal waveguide axis Z, occur at opposing core/cladding interfaces explained above. The waveguide 210 can be shaped and sized to provide a high power beam transport that is multi-mode in one transverse direction or in two dimensions, as described above.

The effects of self-imaging waveguide deformation are largely the same for dielectric and hollow core waveguides, aside from the higher index of refraction in the dielectric self-imaging waveguides. A hollow or dielectric ribbon waveguide that is bent, twisted, and/or buckled is optically equivalent, in the first approximation, to a straight waveguide of ideally flat walls, which is occupied by an effective optically inhomogeneous index of refraction profile. These waveguide distortions result in phase distortions of the propagating modes or self-imaging wavefronts. While sharp distortions result in propagation losses, their effects within certain limits can be acceptable. The analytic expressions for wavefront changes due to bending, buckling, and/or twisting are quite complex and are not necessary for an understanding of this invention, because it is quite easy to determine empirically when such distortions become too sharp for self-imaging propagation or when propagation losses become unacceptable for particular waveguide sizes, wavelengths, and applications.

Only a bend has a simple analytic form, and only under gentle bend conditions. Bending corresponds to linear gradients of an effective index across either of the transverse coordinates, i.e., perpendicular to the optical axis of the self-imaging waveguide 210. Therefore, such bending leads to an effective linear tilt of the wavefront inside of the self-imaging waveguide 210, but that tilt is only acceptable up to the bend radius limits shown below. Specifically, pure bending not accompanied by twists or buckles has a critical bending radius limit given by $$\rho \geq a^3/\lambda^2,$$

where a is the aperture height and $\lambda$ is the wavelength. The bending results in tilting the wavefront of the propagating wave and results in more than approximately quarter wave of r.m.s. wavefront error for a half circle bend, which is fiducially referred to as unacceptable wavefront error.

Buckling has reference to the dependence of waveguide height on local coordinates. Buckling can also be modeled as a variation in the effective refractive index, whether the self-imaging waveguide 210 is hollow or not. Local variations of the ribbon thickness relate to proportional variations of the refractive index. Buckling the ribbon waveguide results in a focusing effect, in the contrast to twisting, which leads a defocusing effect. The strength of focusing strongly depends on the index number of the classical eigenmodes.

Twisted portions of a rectangular self-imaging waveguide 210 induces path differences for the propagating rays and results in defocusing. The effects of twists and buckling in a ribbon waveguide 210 are of the opposite sign, which means that there exists a possibility of canceling one effect by the other. For example, if the twist rate is less than 30 degrees over one meter length in a waveguide 210 that was a rectangular cross-section of 1 cm×0.1 mm, the wavefront deformations remained less than 0.1 wave r.m.s. at 2 micron wavelength. On the other hand, if the twist rate was increased to 90 degrees per meter, the wavefront splits into more than one spatial mode, which can be detrimental to applications requiring spatial coherence.

The sidewall launch apertures 306, 308, 312, etc., of FIGS. 1 and 21 for extracting or coupling portions or all of the light energy out of, or into, the waveguides 322, 324, 326, 328, 330, 334, etc., can be provided and constructed in a number of ways, including technologies that can change the index of refraction of the cladding of the waveguide at the location of the aperture in a manner that allows light in the waveguide to leak out or escape the core. One example sidewall launch aperture 306 is illustrated diagrammatically in longitudinal cross-section in FIG. 23, wherein a sidewall window 380 comprising an electrically addressable liquid crystal material 382 can be actuated to change the effective index of refraction of the window 380 to enable or disable evanescent leakage of light energy out of the core 384 of the sidewall launch aperture 306. The sidewall launch aperture 306 can be constructed, for example, with a body 385 shaped on its interior to enclose a rectangular, multi-mode, waveguide core 384 with dimensions to match the core 216 of the waveguide 326, and it can include a reflective interior coating 389, if necessary, to ensure the necessary reflectivity to propagate the light 339 through the core 384. The liquid crystal material 382 is sandwiched between a transparent substrate 386 and a transparent cover plate 388, each of which has a transparent conductive oxide layer 390, 392 brushed to impose a boundary layer crystal orientation, as is well-known and understood by persons skilled in the art of liquid crystal light modulators. The liquid crystal material 382 has an index of refraction that varies as a function of voltage applied across the liquid crystal material 382. The voltage is applied via the transparent conducting oxide layers 390, 392, which are convected to a voltage controller (not shown) by wires 393, 394 or other conductors. Myriad suitable voltage controllers are available or well within the capabilities of persons skilled in the art and are not part of the invention, thus need not be described here. Contact posts 396, 398 can be used to connect the wires 393, 394 electrically to the transparent conductive oxide layers 390, 392, and, if the body 385 is plastic or some other non-conductive material, no further electrical insulation is needed.

By setting the voltage across the liquid crystal material 382 at a value where the effective index of refraction of the window 380 causes Talbot refraction containment of virtually all of the light of a particular wavelength of the light beam 339 in the core 384, such light does not escape through the window 380. However, a suitable grating, such as spatially periodic change of voltage across the liquid crystal material 382, causes a change in index of refraction of the window 380 to allow evanescent leakage or coupling of light energy 340 out of the sidewall aperture 308, where it can be focused or columnated in a beam with appropriate optical components (not shown) for a particular application, such as ranging, targeting, imaging, cutting, and the like. Such focusing or columnating optical components are not part of this invention, but can be easily designed and implemented by persons skilled in the art.

For launching a beam 340 with the desired spatial profile that is injected or focused into the waveguide, for example, a lower order super-Gaussian beam, as described above, the sidewall launch aperture 306 should be positioned at an integer multiple of the wave guide self-imaging period (WSIP×i) so that the window 380 is aligned with an imaging plane, as also described above and illustrated in FIG. 21. Surprisingly, but as has been shown in comprehensive laboratory measurements, a wall out-coupling grating or aperture 306, as described above, as long as one-fourth of a WSIP still out-couples a near diffraction limited (1/10 wave peak to valley) wavefront Gaussian profile laser beam. However, the fractional out-coupling of a wall coupler, such as the grating or aperture 306, needs to remain low, such as about ten percent or less per ¼-Talbot period, in order not to overly distort the wavefront of the remaining energy flowing in the self-imaging waveguide. The voltage across the liquid crystal material 282 can also be varied to couple out selected proportions of the light energy 339 anywhere in the range extending from none to all of such light energy. Since the window 380 is controlled by voltage, as described above, it is very conducive to convenient remote control.

Figure 24A:
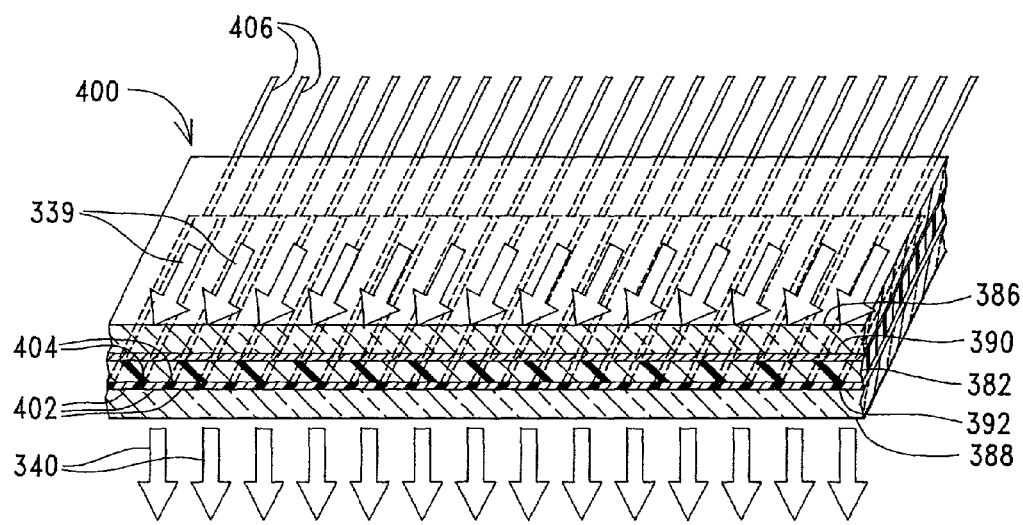
FIGS. 24a–c are cross-sectional views illustrating diagrammatically a liquid crystal window grating for beam directing or steering according to this invention.
Figure 24B:
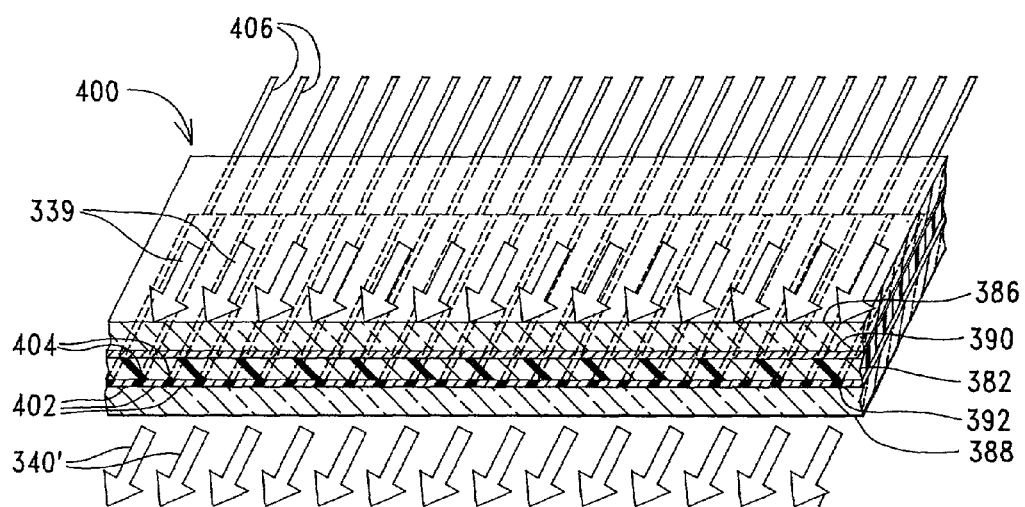
Figure 24C:
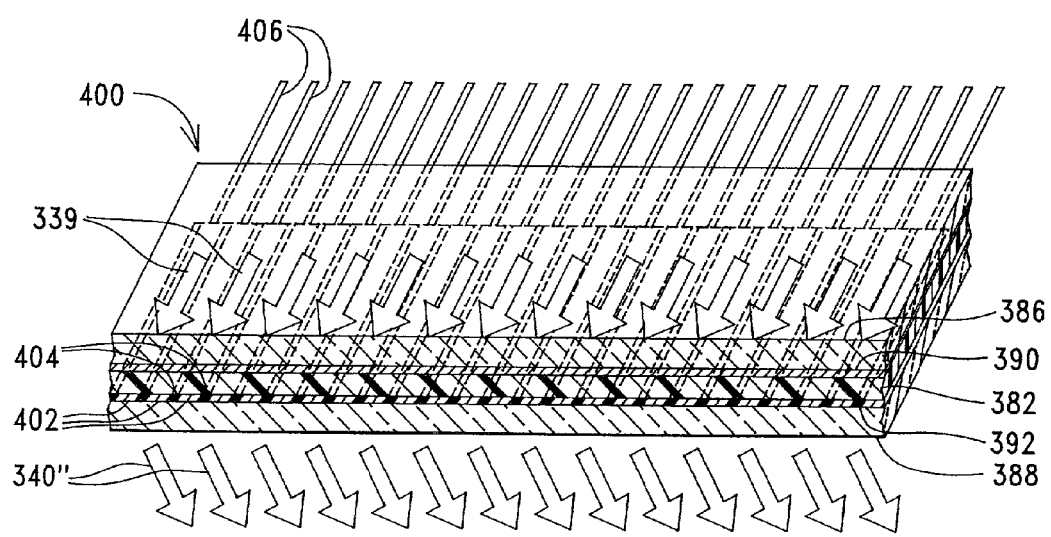

An alternate, grating window, embodiment 400 can be used in place of the window 380 in the sidewall launch aperture 306 to provide steering of the output beam 340, as illustrated diagrammatically in FIG. 1, and as 340' and 340" in FIGS. 24a–c. With initial reference to FIG. 24, a small portion of a grating window 400 is shown in an enlarged cross-section. Essentially, the grating window 400 can be any diffraction outcoupler embodiment, as explained above, but in a grating format. Fixed and programmable diffractive incouplers/outcouplers can be achieved via processes, such as (i) liquid crystals; (ii) semiconductor gratings—either etched or electrically programmable; (iii) photorefractive gratings—either electrically or optically written; (iv) photochromic and/or electrochromic gratings; or (v) etched relief gratings. Moreover, the diffractive grating structure can be curved, linear, chirped, or any combination of these features.

An example grating window 400 is similar to the window 380. It has liquid crystal material 382 sandwiched between the substrate 386 and the cover plate 388, but the transparent conductive oxide (TCO) layer on either the cover plate 388 or the substrate 386 is divided into a plurality of juxtaposed, narrow, elongated TCO strips or contacts 402. Each of the strips 402 is separated from each other by a dielectric or electrically insulative material 404 and is electrically addressable individually, for example, via individual wires or conductor traces 406 connected to respective ones of the TCO strips or contacts 402. Therefore, different voltages can be applied across corresponding portions of the liquid crystal material 382 that are juxtaposed to the respective TCO strips 402 and thereby vary index of refraction of such respective, juxtaposed portions of liquid crystal material 382 individually. Again, as explained above, such change of index of refraction of the liquid crystal material 382 effectively turns on and off light energy leakage or transmission through the window 400, and the ability to turn alternate individual strips of the window 400 on and off effectively creates an optical grating. The density of the juxtaposed, alternate on and off, strips of the window 400 determine the angle or direction at which the output light is diffracted or propagated by the grating. Since the TCO strips 402 can be on the order of several micrometers wide and are addressable individually, the effective grating density of window 400 can be set as desired for a wide range of output light diffraction angles or propagation directions. For example, one grating density can be provided by turning on and off alternate bands of five (5) TCO strips 402 apiece, and another grating density can be provided by turning on and off alternate bands of ten (10) TCO strips 402 apiece. Other patterns or groupings of TCO strips 402 create grating characteristics and densities as desired or needed. The particular grating line densities needed for particular desired angles or propagation directions depends on the particular wavelength of the light and diffraction indices of materials being used, but they can be determined empirically and/or analytically by persons skilled in the art with well-known technologies and formulae.

As illustrated in FIG. 24a, the light energy of beam 339 in the rectangular waveguide of the sidewall launch aperture 306 (FIG. 23), is incident on the grating window 400. The arrows 339 are only generally representative of incident light energy on the grating window 400 and are not intended to indicate any particular beam 339 propagation mode or ray direction in the waveguide. However, the arrows that are indicative of the light energy in output beam 340 in FIG. 24a do illustrate one of many possible output diffraction angles or beam propagation directions. In the illustration of FIG. 24a the selected grating window density propagates the output beam 340 at an angle about perpendicular to the grating window 400. Two different propagation directions of beam outputs 340', 340" produced by two other grating window 400 densities are illustrated in FIG. 24b and FIG. 24c.

While not illustrated, it is worth noting that the individual TCO strips 402 could be curved to also provide grating induced focusing of the output beams 340, 340', 340". Also, two or more grating windows, such as window 400, can be stacked or cascaded, one on the other, for several desirable effects. For example, two grating windows 400 stacked with their TCO strips 402 extending in the same direction can effect more output beam angular adjustment capabilities in one direction. On the other hand, stacking two grating windows 400 with the TCO strips 402 of one of the windows 400 oriented perpendicular to the TCO strips 402 of the other window 400 provides beam output angular adjustment capabilities in two directions, as long as the appropriate polarizations are presented to the gratings, either by intrinsic self-imaging waveguide propagation or by use of appropriate wave retarder plates, as is well understood and withing the capabilities of persons skilled in the art.

Figure 23:
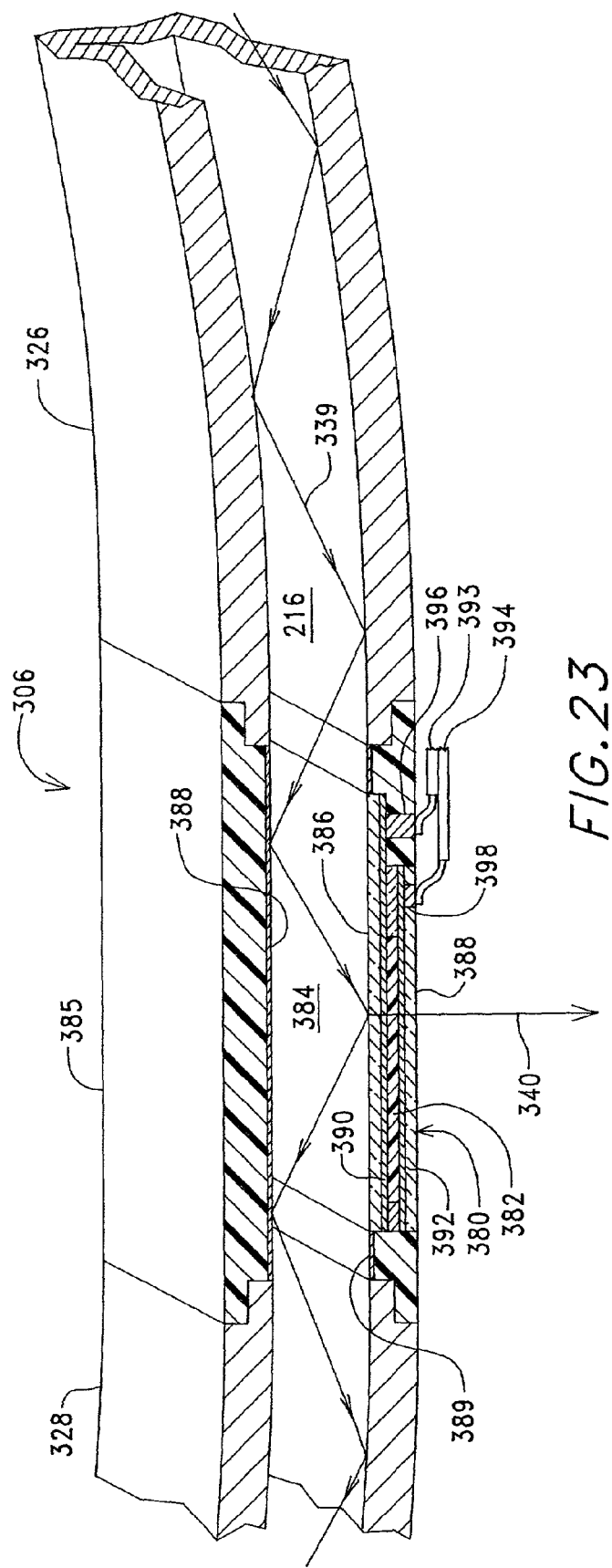
FIG. 23 is a longitudinal cross-section of a perspective view of a diffractive coupler, e.g., liquid crystal, sidewall launch aperture, sometimes called a wall out-coupler, mounted in a rectangular, multi-mode, self-imaging, waveguides for high power beam launching according to this invention.
Figure 25:
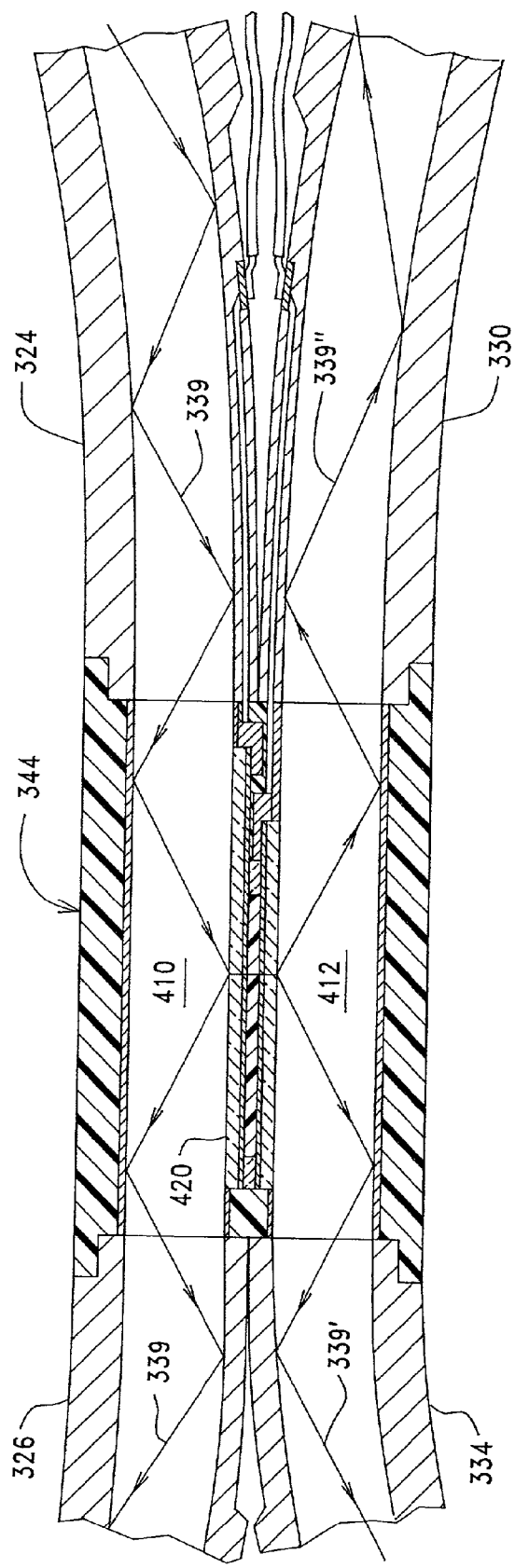
FIG. 25 is a longitudinal cross-section view of a diffractive coupler, e.g., liquid crystal, aperture/switch for coupling light energy from one rectangular, multi-mode, self-imaging, waveguide to another according to this invention.
Figure 26:
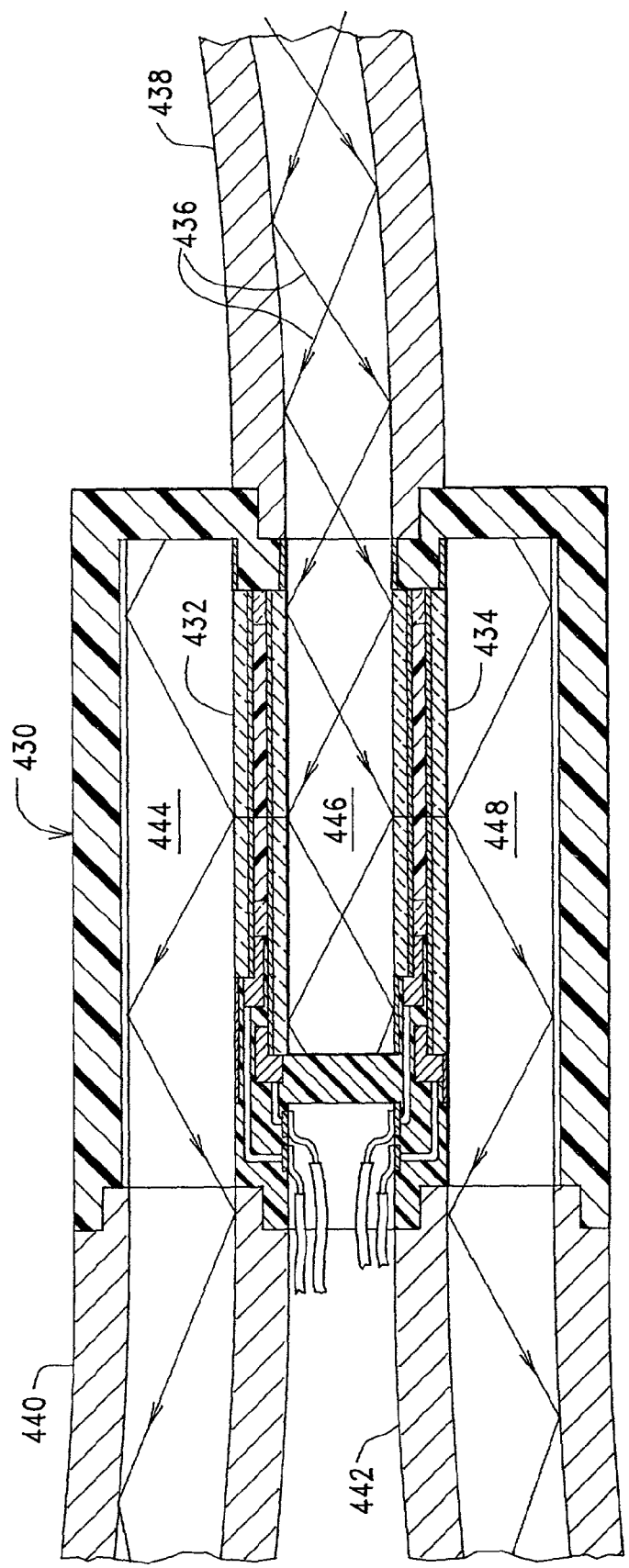
FIG. 26 is a longitudinal cross-section of another liquid crystal coupler/switch for rectangular, multi-mode, self-imaging, waveguides according to this invention.

A liquid crystal window 420, illustrated in FIG. 25, which is similar to the window 380 shown in FIG. 23, is used in the junction aperture 344 to selectively couple light energy from the beam 339 in rectangular waveguide 324 into one or both juxtaposed rectangular, multi-mode, self-imaging, waveguides 330, 334. The liquid crystal window 420 is positioned between two juxtaposed, rectangular waveguide chambers 410, 412 of the junction aperture 344. The liquid crystal window is actuated to function essentially the same as the window 380 of FIG. 23, except that, instead of light energy leaking or escaping through the window 420 into free space, it is captured by the second waveguide chamber 412 for propagation either in waveguide 330 or in waveguide 334. Essentially, the light energy from beam 339 is coupled into, and captured by, the second waveguide chamber 412 and is then guided to propagate into one or both of the rectangular, multi-mode, self-imaging, waveguides 330, 334.

While it is not essential, it is preferred that the window 420 be positioned in a re-phasing or re-imaging plane, i.e., at an integral multiple of the waveguide self-imaging period (WSIP×i) from the input aperture 323, as shown in FIG. 21. Positioning the window 420 in other locations may cause some undesirable perturbations in the beam profile.

A switch aperture 430, shown in FIG. 25, illustrates diagrammatically the use of two liquid crystal windows 432, 434 for selectively switching light energy 436 from or to an input rectangular, multimode, self-imaging, waveguide 348 into or from one or the other or both of two output rectangular, multi-mode, self-imaging, waveguides 440, 442. The switch aperture 430 has three juxtaposed, rectangular, multi-mode, waveguide chambers 444, 446, 448, with central, input chamber 446 separated from one output chamber 444 by one liquid crystal window 432 and separated from the other output chamber 448 by the second liquid crystal window 434. The liquid crystal windows 432, 434 are substantially like the liquid crystal windows 380, 420 in FIGS. 22, 24 and are individually addressable, electronically, to couple light energy out of the central input chamber 446 into output chambers 444, 448, as desired.

While the beam sidewall launch and beam coupling from or between the rectangular multi-mode, self-imaging, waveguide, electronically, light transport systems of this invention are shown in FIGS. 22–25 as implemented by liquid crystal window apertures, other mechanisms and devices could be used to perform these functions within the scope of the invention. For example, other embodiments of sidewall launches and couplings into other waveguides consistent with the present invention include, inter alia: grating technologies; diffraction grating;; prism apertures; grisms (gratings and prisms, such as grating etched on face of prism); prism evanescent wave coupling; microelectromechanical apertures; aperture-window technology, generally, and arrays thereof. Sidewall launches may be particularly applicable to systems providing one or more potentially desirable features such as synthetic aperture, distributed aperture, beam forming, beam steering, and power sampling, among other features. Sidewall launches may be provided as coherent or incoherent sources, coherent sources particularly beneficial in imaging applications, for example, and incoherent sources particularly beneficial in laser medium pumping and radiometric applications.

Figure 27:
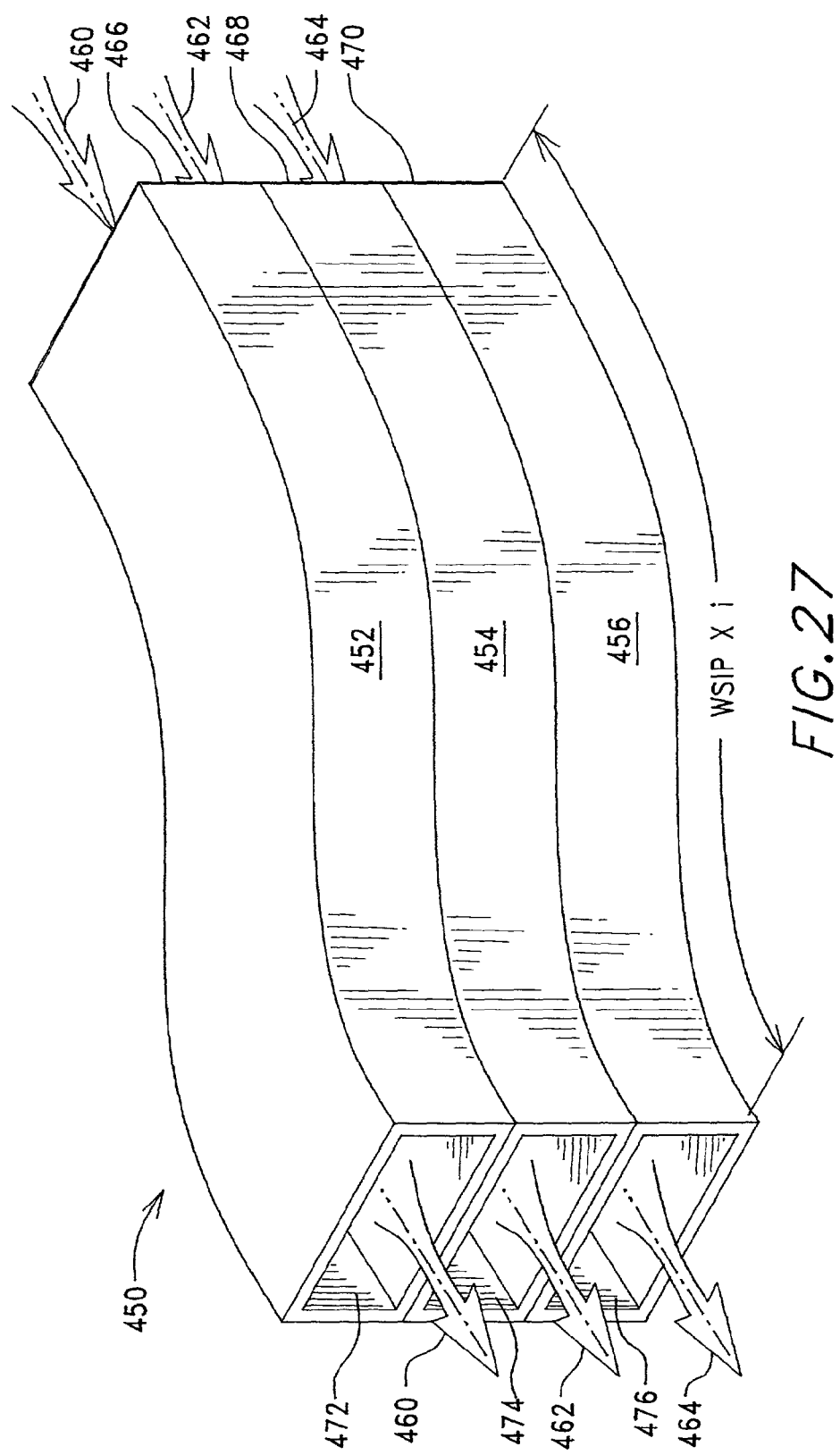
FIG. 27 is a perspective view of a stacked, phase-matched, array of rectangular, multi-mode, self-imaging, waveguides of this invention.

In applications where even more power is required than can be transported and delivered by one rectangular, multimode, self-imaging, waveguide, e.g., waveguide 214 in FIG. 22, two or more rectangular, multi-mode, self-imaging, waveguides can be stacked together in an array to transport and deliver two or more complimentary, phase-matched beams. For example, the stacked array 450 of three rectangular, multi-mode, self-imaging waveguides 452, 454, 456 shown in FIG. 27, can be used to transport and deliver three, phase-matched beams 460, 462, 464 to a common exit plane, i.e., the plane of the three exit apertures 472, 474, 476. If the beams 460, 462, 464 are phase-matched with each other and focused with a desired spatial profile, for example, lower order super-Gaussian, at the respective co-planar entrance apertures 466, 468, 470, the spatial profile of each beam 460, 462, 464 re-images at the respective exit apertures 472, 474, 476, provided that the exit apertures 472, 474, 476 are positioned at a distance of WSIP×i from the entrance apertures 466, 468, 470. The phase-matching of the beams 460, 462, 464 can be accomplished as described above with either in-line, electro-optic, phase modulators, or, in the case of hollow self-imaging waveguides, small piezo electric transducers producing small amounts of compression of the waveguide to introduce a uniform piston phase shift across the self-imaging waveguide aperture without appreciably altering the wavefront, or in other ways that are known to persons skilled in the art.

Figure 28:
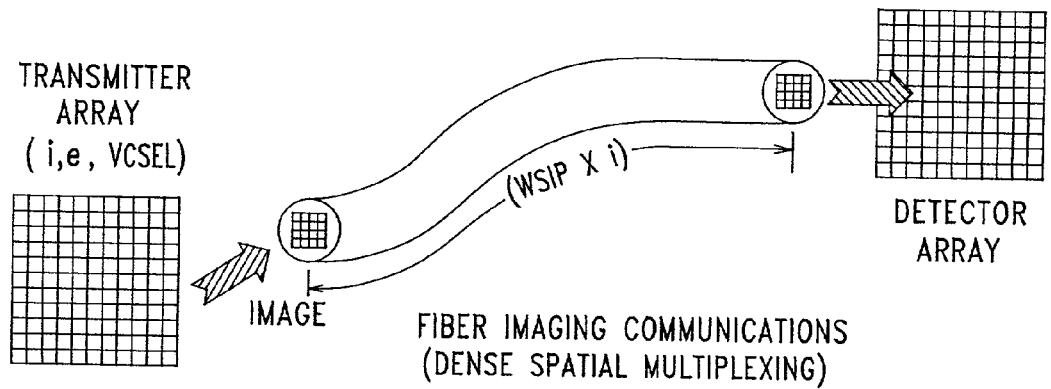
FIG. 28 is a fiber embodiment of a phase-matched beam transport array of rectangular, self-imaging, waveguides of this invention.

Any number of rectangular, multi-mode, self-imaging waveguides can be included in an array, as illustrated, for example, by the fiber-encased array 480 in FIG. 28. Such an array 480 can be used to transmit more power than can be transmitted in one of the waveguides in the array. However, as also illustrated in FIG. 28, such an array can be used in a lens spatial multiplexing application in which individual components of an image or other data are produced and optically coupled or transmitted simultaneously by a transmitter array 482 into the respective input apertures 484 for transmission to output apertures 486 aligned with a detector array 488, on which the image is reassembled.

Figure 29:
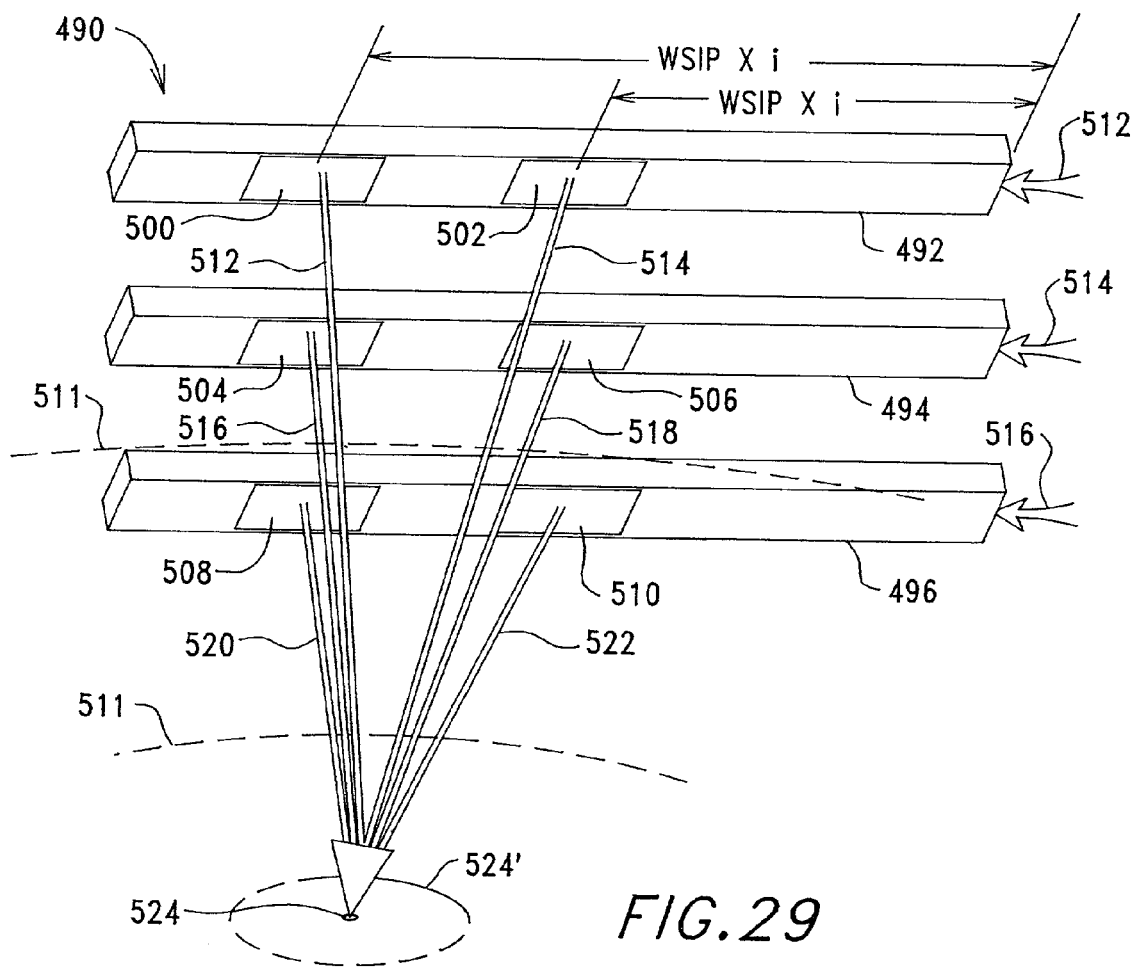
FIG. 29 is a perspective, underside view of an array of rectangular, multi-mode, self-imaging, waveguides with multiple sidewall launch apertures for synthesizing a high power beam at a point according to this invention.

A sparse and/or synthetic aperture system 490 comprising a plurality of rectangular, multi-mode, self-imaging, waveguides which has one or more beam launch apertures 500, 502, 504, 506, 508, 510, is shown in FIG. 29. Light energy from the respective beams 512, 514, 516 is coupled, selectively, out of the waveguides 492, 494, 496 by launch apertures 500, 502, 504, 506, 508, 510, which may utilize addressable, diffraction gratings 400, as described above in relation to FIGS. 24a–c. In other words, the launched beams 512, 514, 516, 518, 520, 522 can be steered and focused by the apertures 500, 502, 504, 506, 508, 510 to a common point 524 or in any other desired directions. With appropriate phase shifts between the wall in-couplers or out-coupler, synthetic aperture techniques may be particularly useful in providing, for example, multiple-meter class apertures from launch and recovery systems, providing high resolution target ranging, velocity, and imaging results, particularly from moving platforms, such as maybe applied in aeronautic and space applications, among others. In other wards, if the self-imaging waveguides are utilized in a ladar (laser radar) system, for example, back-scattered spherical or plane waves 511 for the scene 524' would be collected through micro-Doppler and range-tagged echos to allow image formation from the synthetic aperture over the full extent of the synthetic aperture baseline. For example, if the launched beams 512, 514, 516, 518, 520, 522, are co-phased, i.e., all in phase with each other, and if they are steered and/or focused to illuminate a larger area scene 524', the combination of the multiple apertures 500, 502, 504, 506, 508, 510 pick up the back-scattered waves 511, which are much higher energy, thus easier to detect and process for image content from the scene 524' than the back-scattered energy would be from only one of the beams 512, 514, 516, 518, 520, 522.

The sidewall launch beam forming and steering could also be provided by other diffractive or refractive techniques, gratings, prism apertures, and in some embodiments prism evanescent wave coupling, microelectro-mechanical apertures, aperture-window technology, generally, and arrays thereof, among other aperture technologies known in the art, once the principles of this invention are understood. Also, multiple grating periods for one or a plurality of exit surfaces, faces or apertures, could be used for special application such that multiple beam forming and steering from one exit surface, face, aperture or launch may occur either singly or in combination. Additionally, such beam forming may be applicable to systems wherein the diversion of power from the waveguide is desirable, as in power monitoring of the waveguide and in power splitting techniques, generally.

Figure 30:
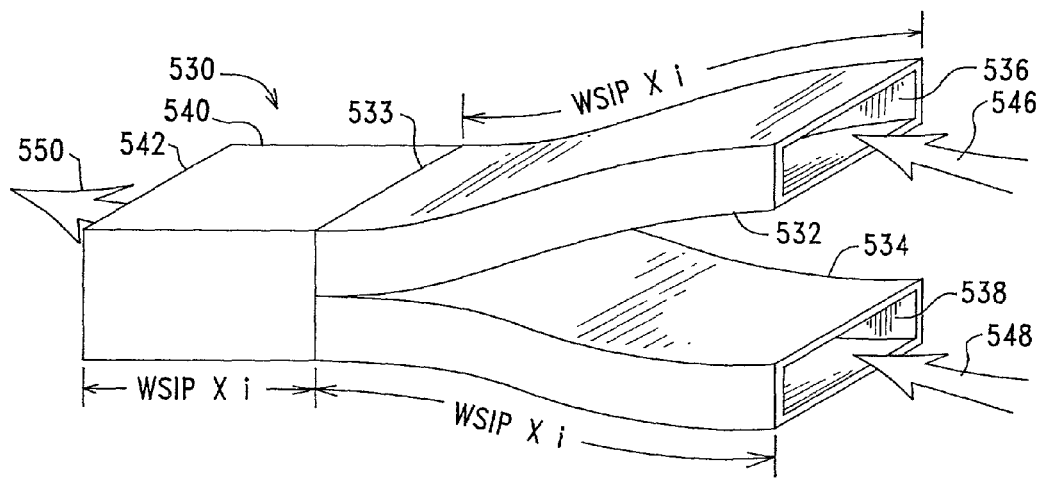
FIG. 30 is a perspective view of a high power beam combiner according to this invention.
Figure 31:
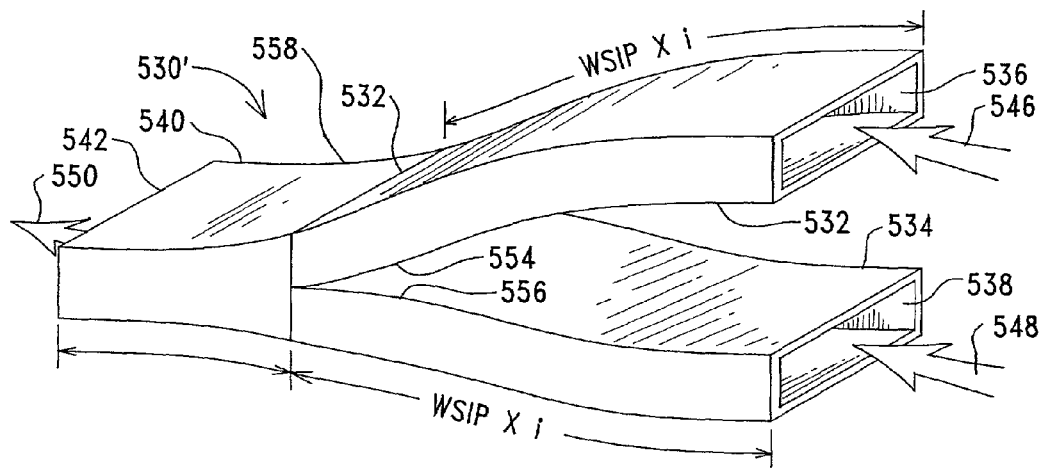
FIG. 31 is a perspective view of another variation of a high power beam combiner according to this invention.

Beam combining or power combining can also be implemented with rectangular, multi-mode, self-imaging, waveguides according to this invention, as illustrated in FIGS. 30 and 31. As shown in FIG. 30, multiple branches of such rectangular input waveguides 532, 534 can be coupled into an input aperture of an output or combiner rectangular waveguide 540 to form a beam combiner 530. To avoid an unnecessarily cumbersome description, this explanation has only two beams 546, 548, and two corresponding waveguides 352, 354 being combined, but any number of beams and waveguides can be combined in this manner at a common plane 533. A first light beam 546 is focused into the input aperture 536 with a desired spatial profile, e.g., lower order super-Gaussian, to be propagated through the first rectangular waveguide 532 to a beam combining phase 532, which is at the entrance aperture of the output waveguide 540. At the same time, a second light beam 548, which is preferably the same wavelength and phase-matched to the first beam 546, is focused into the input aperture 538 with a desired spatial profile. The length of each input waveguide is preferably WSIP×i, as explained above, so that both input beams re-phase or re-image at the beam combining plane 533. The respective spatial profiles of the input beams can, but do not have to, be identical. It is preferred to provide beams 546, 548 with respective spatial profiles that will combine at plane 532 to form a desired spatial profile, e.g., lower order super-Gaussian, for the combined output beam 550, which will re-phase or re-image at the output aperture 542 if the length of the output waveguide 540 is WSIP×i, as explained above. (Of course, because the output or combiner waveguide 540 has a larger cross-sectional area and waveguiding width than the inlet waveguides 532, 534, the WSIP for the combiner waveguide 540 is different than the WSIP for the inlet waveguides 532,534.) Therefore, the output beam 550 has the combined power of input beams 546, 548 with the desired spatial profile.

In a modified beam combiner embodiment 530', shown in FIG. 31, the input waveguides 532, 534 and output waveguide 540 are joined at plane 532 by respective, adiabatically tapered portions 554, 556, 558. However, when there are such tapered portions 554, 556, 558, the WSIP varies, and there is no integer multiple i that describes where re-phasing or self-imaging occurs. Therefore, to place a re-phasing or self-imaging plane at the outlet aperture 542, the self-imaging period distance $D_w$ may have to be determined empirically.

The following table illustrates the various combinations of structures, features and attributes of waveguides (WG) that can be used in various embodiments of this invention:

| Invention aspect | Claim Options | Specific examples |
| --- | --- | --- |
| WG Aperture Geometry | Rectangular | Quasi-One-dimensional |
|  |  | Square |
| WG Core Medium | Gas | $SF_6$ |
|  | Liquid* | Laser dye in solution |
|  | Doped and Undoped | Crystalline |
|  | Dielectric Solids, semiconductors | Poly-crystalline |
|  |  | Amorphous (Glass) |
| WG Cladding Medium | Metal (conductor) | Solid metal |
|  |  | Metal coated |
|  | Dielectric with index of refraction lower than core | Liquid crystal grating arrays, homogeneous index slabs, gradient index slabs, photorefractive materials, doped gain media, nonlinear optical materials |
|  | Dielectric coatings | Fluoride and oxide single/multilayer dielectric coatings |
| WG Structure | Stiff | Wafer |
|  | Flexible | Optical Fiber |
| WG Length | Optical path length is an integer multiple of the imaging period or fractional re-phasing distances for beam splitting |  |
| Active Operation (passive options plus beam modification) | Optical amplifier | (see options below) |
|  | Electro-optical modulator, degenerate and non- | Phase modulator Polarization modulator |

-continued

| | | |
|---|---|---|
| | degenerate wave-mixing for phase or amplitude modulation, beam combination and energy transfer | Communications encoding for wavelength division multiplexing, PSK, ASK, QSK, etc. formats |
| Optical Amplifier | General Example | Specific Example |
| Core Host Medium (any laser gain medium) | Glasses | Phosphate Silicate |
| | Crystalline, quantum wells | Garnet (YAG, . . . ) Fluoride (YLF, . . . ) Sapphire Oxides Germanites Chalcogenides Chlorides Apatites Elemental semiconductors and compound stoichiometric and non-stoichiometric semiconductors, quantum wells, quantum cascades, and all forms of heterojunctions |
| | Gas | $CO_2$ |
| Solid Core Active Ion (any laser active ion) | Rare Earth | Nd Er Yb |
| | Transition Metal | Cr Ti |
| Pumping Scheme (any laser pump scheme) | Optical | Flashlamp Laser Laser diode array Solar illumination |
| | Electrical | Semiconductor diode WG amplifier/laser |
| Optical/Electrical Pumping Geometry | Longitudinal | Preferable for any WG aperture geometry |
| | Transverse | Preferable for one-dimensional WG along wide transverse axis Face pumping may be useful for semiconductor lasers and control beams for dynamic wave mixing and gratings. |
| Application specific | Component of laser | WG comprises entire laser WG amplifier is component of laser system |
| | Image Amplifier | Endoscope, ladar preamplifier |

*Not a common configuration

Since these and numerous other modifications and combinations of the above-described method and embodiments will readily occur to those skilled in the art, it is not desired to limit the invention to the exact construction and process shown and described above. For example, Accordingly, resort may be made to all suitable modifications and equivalents that fall within the scope of the invention as defined by the claims which follow. The words "comprise," "comprises," "comprising," "include," "including," and "includes" when used in this specification and in the following claims are intended to specify the presence of stated features or steps, but they do not preclude the presence or addition of one or more other features, steps, or groups thereof.

The invention claimed is:

1. A power scalable optical system for a high power laser beam, comprising:
   means for producing a high power, super-Gaussian laser beam; and
   a multi-mode, self-imaging waveguide coupled optically to receive and transmit said high power, super-Gaussian laser beam to at least one output aperture that is positioned in a re-imaging plane in the waveguide.

2. A power scalable optical system for a high power, super-Gaussian laser beam comprising:
   an amplifier for a laser beam that has a wavelength ($\lambda$), comprising:
      a multi-mode, self-imaging waveguide having a core comprising a gain or mixing medium with an index of refraction (n) and a core length extending between a core entrance face and a core exit face, said core also having a rectangular cross-section that provides a waveguide width (a), which is large enough to support and propagate multiple modes of the laser beam and a waveguide self-imaging period (WSIP) defined as a distance in the multi-mode waveguide in which a profile or image of the laser beam is periodically re-imaged, wherein WSIP=$4na^2/\lambda$ in general for the laser beam propagating through the core and WSIP=$na^2/\lambda$ when the laser beam is symmetric with respect to the center of the waveguide, and wherein said core is such that the laser beam propagating through the core from the core entrance face to the core exit face has an optical path length with a numerical aperture and an exit face that is a non-zero integer multiple of the waveguide self-imaging period (WISP);

means for modifying phase and/or amplitude profile of a beam to provide an input laser beam with a super-Gaussian profile and for focusing the input laser beam at the core entrance face within the numerical aperture of the core entrance face to propagate the laser beam into and through the waveguide to the exit face; and a pump light source coupled into the waveguide core medium to propagate pump light energy into the core medium to be extracted by the laser beam.

3. The amplifier of claim 2, including a reflector capable of reflecting the laser beam positioned to reflect the laser beam back through the waveguide core.

4. The amplifier of claim 3, wherein the reflector is positioned at the exit face.

5. The amplifier of claim 3, wherein the reflector is positioned outside the waveguide at a distance from the exit face.

6. The amplifier of claim 5, wherein the reflector is shaped to re-focus the reflected laser beam onto the exit face for propagation back through the waveguide core.

7. The amplifier of claim 5, including an optical imaging system between the exit face and the reflector that is capable of re-imaging the reflected laser beam on the exit face for propagation back through the waveguide core.

8. The amplifier of claim 3, including an extraction optical coupling system capable of coupling the reflected laser beam out of the entrance face of the waveguide and separating the reflected laser beam from the pre-amplified laser beam.

9. The amplifier of claim 8, wherein the extraction optical coupling system includes a polarizing beam splitter positioned in the pre-amplified beam and a ¼-λ birefringent retarder positioned between the polarizing beam splitter and the entrance face of the waveguide core.

10. The amplifier of claim 3, wherein the pump light source is coupled into the waveguide core medium through the exit face.

11. The amplifier of claim 10, wherein the reflector is transparent to the pump light.

12. The amplifier of claim 2, wherein the pump light source is coupled into the waveguide core medium through a lateral side of the waveguide core medium.

13. The amplifier of claim 12, wherein the pump light source is a laser diode.

14. The amplifier of claim 13, wherein the pump light source produces pump light with a wavelength that is smaller than the wavelength λ of the laser beam.

15. The amplifier of claim 12, including multiple pump light sources coupled into lateral sides of the waveguide core medium.

16. The amplifier of claim 2, wherein the gain medium is a semiconductor material.

17. The amplifier of claim 16, wherein the semiconductor medium comprises AlGaAs.

18. The amplifier of claim 2, wherein the gain medium is a ion-doped, glassy material.

19. The amplifier of claim 2, wherein the gain medium is a crystalline material.

20. The amplifier of claim 2, wherein the gain medium is a refractory material.

21. The amplifier of claim 2, wherein the gain medium comprises sapphire.

22. The amplifier of claim 2, wherein the gain medium comprises at least one oxide.

23. The amplifier of claim 2, wherein the gain medium comprises at least one germanite.

24. The amplifier of claim 2, wherein the gain medium comprises at least one fluoride.

25. The amplifier of claim 2, wherein the gain medium comprises at least one chloride.

26. The amplifier of claim 2, wherein the gain medium comprises at least one chalcogenide.

27. The amplifier of claim 2, wherein the gain medium comprises at least one apatite.

28. The amplifier of claim 2, wherein the gain medium comprises doped YAG.

29. The amplifier of claim 28, wherein the gain medium comprises Yb:YAG.

30. The amplifier of claim 2, wherein the gain medium comprises Nd dopant.

31. The amplifier of claim 2, wherein the gain medium comprises a liquid.

32. The amplifier of claim 31, wherein the gain medium comprises an optically nonlinear liquid.

33. The amplifier of claim 31, wherein the gain medium comprises $CS_2$.

34. The amplifier of claim 2, wherein the core is rectangular and is clad with a cladding material that has a lower index of refraction than the core.

35. The amplifier of claim 2, wherein the core is rectangular, has no cladding, but has an index of refraction that is sufficiently greater than a surrounding atmosphere to confine the light beam in the core.

36. The amplifier of claim 35, wherein the core comprises Nd-doped, phosphate glass.

37. The amplifier of claim 34, including a heat sink positioned adjacent and in contact with the cladding material.

38. The amplifier of claim 34, wherein the cladding material has at least one flat side and the heat sink is positioned in contact with the flat side.

39. The amplifier of claim 38, wherein the pump light source also has at least one flat side that is positioned in thermally conductive contact with a flat side of the sink.

40. The amplifier of claim 39, wherein the heat sink has a uniform thickness.

41. The amplifier of claim 39, wherein the heat sink has a varying thickness.

42. The amplifier of claim 35, including an intervening heat conductor layer on a surface of the core and a heat sink positioned on the intervening heat conductor layer.

43. The amplifier of claim 40, wherein the intervening layer comprises a fluoropolymer material.

44. The amplifier of claim 40, wherein the intervening layer comprises a silico-oxide material.

45. A power scalable optical system for a high power, super-Gaussian laser beam, comprising:

includes a laser resonator for producing a laser beam, comprising:

a multi-mode, self-imaging waveguide positioned in an optical resonator cavity and having a core medium, which, when excited, emits light with a wavelength (λ), said core medium having a core length extending between a first core face and a second core face and also having an index of refraction (n) and a rectangular cross-section that provides a waveguide width (a), which is large enough to support and propagate multiple modes of a laser beam and a waveguide self-imaging period (WSIP) defined as a distance in the multi-mode waveguide in which a laser beam profile or image is periodically re-imaged, wherein WSIP=4na²/λ in general for the laser beam propagating through the core and WSIP=na²/λ when the laser beam is perfectly symmetric with respect to the center of the waveguide, and wherein said core length is such that the laser beam propagating through the core from the first face to the second face has an optical path length that is a non-zero integer multiple of the waveguide self-imaging period (WSIP); and means adjacent the first face and/or the second face for conditioning the laser beam to have a super-Gaussian profile.

46. The laser resonator of claim 45, including a pump light source coupled optically to the waveguide core medium to propagate pump light energy into the core medium at a wavelength that optically excites the core medium to emit the λ wavelength light.

47. The laser resonator of claim 45, wherein the core medium is a optoelectronic semiconductor material and the laser resonator includes electrical contacts positioned adjacent the core medium in a manner that facilitates application of an electric current to excite the semiconductor material to produce the laser light.

48. The laser resonator of claim 45, wherein either the first core face or the second core face includes a rectangular aperture for the laser light to exit and enter the core medium, and wherein the optical resonator cavity includes a reflective surface positioned a distance apart from the core medium and in alignment with the rectangular aperture to reflect laser light that emanates from the core medium back into the rectangular aperture to reflect laser light that emanates from the core medium back into the rectangular aperture with a super-Gaussian profile of a selected order at the rectangular aperture.

49. The laser resonator of claim 48, wherein the selected order is a lower order.

50. The laser resonator of claim 49, wherein the reflective surface is curved to focus the reflected laser light on the rectangular aperture with the lower order super-Gaussian profile.

51. The laser resonator of claim 45, wherein the means for conditioning the laser beam to have a super-Gaussian profile includes a phase modification plate.

52. The laser resonator of claim 45, wherein the means for conditioning the laser beam to have a super-Gaussian profile includes an amplitude modification plate.

53. The laser resonator of claim 48, wherein the reflective surface is fully reflective.

54. The laser resonator of claim 48, wherein the reflective surface is partially reflective.

55. The laser resonator of claim 48, wherein the reflective surface is a first reflective surface and the optical resonator cavity includes a second reflective surface with the core medium positioned between the first reflective surface and the second reflective surface.

56. The laser resonator of claim 55, wherein the second reflective surface is fully reflective.

57. The laser resonator of claim 55, wherein the second reflective surface is partially reflective.

58. The laser resonator of claim 55, wherein the second reflective surface is positioned at either the first core face or the second core face.

59. The laser resonator of claim 45, wherein the self-imaging waveguide is rectangular in cross-section.

60. The laser resonator of claim 59, wherein the rectangular waveguide comprises:

a rectangular core medium with flat external surfaces;

cladding on the external surfaces, said cladding also having at least one flat external surface; and a heat sink positioned in contact with the flat external surface of the cladding.

61. The amplifier of claim 2, including cladding material with an index of refraction less than the index of refraction of the core medium.

62. The amplifier of claim 61, wherein said cladding material is a first cladding material, and wherein the amplifier includes:

a second cladding material surrounding the first cladding material and having an index of refraction that is less than the index of refraction of the first cladding material; and wherein the pump light source is coupled optically to the core medium via an optical coupling to the first cladding material.

63. The amplifier of claim 61, wherein the core medium and the first cladding material comprise a longitudinally elongated, optical fiber.

64. The amplifier of claim 62, wherein the core medium, the first cladding material, and the second cladding material comprise a longitudinally elongated, optical fiber.

65. The amplifier of claim 63, wherein optical fiber has a circular cross-section.

66. An optical system for delivering a beam with a desired spatial profile to an application, comprising:

an elongated, twistable and bendable, multi-mode, self-imaging, beam transport waveguide that has at least one inlet aperture and at least one outlet aperture spaced a distance of WSIP×i from the inlet aperture; and a laser amplifier with optical components that are capable of producing a laser beam with the desired spatial profile coupled to the inlet aperture of the beam transport waveguide.

67. The optical system of claim 66, including a plurality of outlet apertures distributed in different locations along the beam transport waveguide, wherein each outlet aperture is a distance of WSIP×i from the inlet aperture, and where i is different for at least some of the outlet apertures.

68. The optical system of claim 67, including an addressable outlet coupler at each outlet aperture.

69. The optical system of claim 68, wherein the outlet coupler comprises a diffraction grating.

70. The optical system of claim 66, including a liquid crystal outlet coupler at the outlet aperture, said liquid crystal having a variable index of refraction that varies, in response to voltage changes across the liquid crystal, in a range between an index of refraction that confines all light in the waveguide and an index of refraction that couples at least some of the light out of the waveguide.

71. The optical system of claim 66, including an array of individually addressable, electric contacts adjacent the liquid crystal that can be addressed with different voltages to vary indices of refraction of a plurality of different portions of the liquid crystal, and which contacts are small enough and positioned closely enough together such that different portions of the liquid crystal can be actuated to change indices of refraction in a manner that functions as a grid to launch light coupled out of the waveguide in a desired direction.

72. The optical system of claim 70, including a second multi-mode, self-imaging, waveguide with at least one inlet aperture and at least one outlet aperture, wherein the inlet aperture of the second waveguide is positioned adjacent the outlet aperture of the first waveguide such that light coupled by the liquid crystal out of the waveguide is coupled into the second waveguide, and wherein the outlet aperture of the second waveguide is positioned at a distance equal to WSIP×i from the inlet aperture of the second waveguide.

73. The optical system of claim 72, wherein the liquid crystal in the outlet aperture of the first waveguide is actuateable to couple out of the waveguide no more than ten percent of the light in the waveguide per ¼-Talbot period.

74. The optical system of claim 73, wherein the second waveguide is elongated, twistable, and bendable and has a plurality of outlet apertures distributed in different locations along its length, and wherein each outlet aperture in the second waveguide is positioned at respective distances from the inlet aperture equal to WSIP×i, where i is different for at least some of the outlet apertures in the second waveguide.

75. The optical system of claim 73, including a liquid crystal outlet coupler at the outlet aperture of the second waveguide, said liquid crystal having a variable index of refraction that varies, in response to voltage changes across the liquid crystal, in a range between an index of refraction that confines all light in the second waveguide and an index of refraction that couples at least some of the light out of the second waveguide.

76. The optical system of claim 66, including:
two outlet apertures positioned in a common plane, but on opposite sides of the beam transport waveguide and at a distance of WSIP×i from the inlet aperture;
a first branch waveguide with a first branch inlet aperture and at least one first branch outlet aperture, said first branch waveguide being positioned so that the first branch inlet aperture is adjacent and coupled optically to one of the outlet apertures of the beam transport waveguide, and wherein the first branch outlet aperture is positioned at a distance of WSIP×i from the first branch inlet aperture;
a second branch waveguide with a second branch inlet aperture and at least one second branch outlet aperture, said second branch waveguide being positioned so that the second branch inlet aperture is adjacent and coupled optically to the other one of the outlet apertures of the beam transport waveguide, and wherein the second branch outlet aperture is positioned at a distance of WSIP×i from the second branch inlet aperture.

77. The optical system of claim 76, wherein i is not necessarily the same for each of the distances WSIP×i.

78. The optical system of claim 77, including a first liquid crystal modulator positioned in one of the outlet apertures and a second liquid crystal modulator positioned in the other one of the outlet apertures.

79. The optical system of claim 66, wherein the beam transport waveguide has a hollow core for high power beam transport without nonlinear thermally-induced optical distortions.

80. An optical beam combiner, comprising:
a first multi-mode, rectangular, self-imaging, input waveguide that has a first input waveguide inlet aperture and a first input waveguide outlet aperture, wherein the first input waveguide outlet aperture is positioned a distance of WSIP×i from the first input waveguide inlet aperture;
a second multi-mode, rectangular, self-imaging, input waveguide that has a second input waveguide inlet aperture and a second input waveguide outlet aperture, wherein the second input waveguide outlet aperture is positioned adjacent and in a common plane with the first input waveguide outlet aperture and at a distance of WSIP×i from the second input waveguide inlet aperture;
a multi-mode, rectangular, self-imaging combiner waveguide that has a combiner waveguide inlet aperture sized and shaped to match a composite of the first input waveguide outlet aperture and the second input waveguide outlet aperture positioned in the common plane, said combiner waveguide inlet aperture also being positioned in the common plane and coupled optically to receive light from both the first and second input waveguide outlet apertures, and said combiner waveguide also having a combiner waveguide outlet aperture that is positioned at a self-imaging plane of the combiner waveguide.

81. The optical beam combiner of claim 80, wherein the combiner has a constant size rectangular cross-section from the combiner waveguide inlet aperture to the combiner waveguide outlet aperture.

82. The optical beam combiner of claim 80, wherein the combiner waveguide is tapered to have a decreasing size rectangular cross-section from the combiner waveguide inlet aperture to the combiner waveguide outlet aperture.

83. The optical beam combiner of claim 82, wherein the combiner waveguide is adiabatically tapered.

84. A laser beam transport system, comprising:
a plurality of multi-mode, rectangular, self-imaging, waveguides stacked together in an array, wherein all of the waveguides in the array are of equal cross-sectional shape and size and of equal length and have input apertures all in a common input aperture plane and output apertures all in a common output aperture plane, said length between the input aperture plane and the output aperture plane being equal to WSIP×i.

85. The laser beam transport system of claim 84, including means for producing a plurality of phase-matched laser beams that have a common spatial profile and for coupling each of the plurality of laser beams into respective inlet apertures of the waveguides in the array so that the laser beams propagate in multiple modes through the respective waveguides in the array and re-phase at the respective outlet apertures to combine together in a composite laser beam with the common spatial profile.

86. The laser beam transport system of claim 84, including:
a transmitter array that produces a plurality of beams in an array, each of said beams being an integral part of a composite image, and optically couples such beams into respective ones of the waveguides; and
a detector array with individual photo detector elements that correspond to respective ones of the waveguides positioned and aligned to detect the respective beams propagated through the waveguides to the outlet apertures.

87. A laser beam synthesizer, comprising:
a plurality of multi-mode, rectangular, self-imaging waveguides, each of which has an inlet aperture and at least one outlet aperture positioned at a distance of WSIP×i from the input aperture;
means for producing a plurality of phase-matched beams with a common spatial profile and for coupling such beams into the inlet apertures of respective ones of said waveguides; and
a beam director positioned at each of the outlet apertures, the beam director at each of the outlet apertures being set to direct all of the beams to a common point.

88. The laser beam synthesizer of claim 87, wherein each beam director includes an electrically addressable, diffractive coupler.

89. A method of providing a high power, diffraction limited, laser beam to a desired application, comprising:
producing a high power laser beam with a spatial profile;
coupling said beam into an input aperture of an elongated, multi-mode, self-imaging, waveguide that extends to an output aperture positioned both at a desired point of delivery for the beam and at a self-imaging plane where the beam re-phases into the desired spatial profile; and
coupling said beam out of said output aperture for the desired application.

90. The method of claim 89 including producing the high power laser beam with a super-Gaussian profile.

91. The method of claim 90, including producing the high power laser beam with a super-Gaussian profile by:
conditioning an input laser beam to have a super-Gaussian profile;
coupling the conditioned beam with its super-Gaussian profile into a core entrance face of a laser amplifier comprising a multi-mode, self-imaging waveguide having a core comprising a gain or mixing medium with a core length extending between the core entrance face and a core exit face, which is positioned in a self-imaging plane where the input laser beam, after separating into multiple modes for propagation through the core, re-phases into the super-Gaussian profile;
pumping the gain or mixing medium of the core with additional light energy; and
extracting such additional light energy from the gain or mixing medium with the input beam as it propagates in multiple modes through the core so that said input beam re-phases as an output beam at said exit face with the super-Gaussian profile and the additional energy extracted from the gain or mixing medium.

92. The method of claim 91, including in-coupling a free space spherical and/or plane wavefront into a wall coupling of a rectangular, multi-mode, self-imaging, waveguide.

93. The method of claim 91, including pumping and extracting sufficient light energy so that the re-phased, super-Gaussian profile, beam at said exit face is a high power beam.

94. The method of claim 93, including dissipating enough heat from the core to prevent optical distortions in the beam from thermal gradients in the core.

95. The method of claim 94, including dissipating heat from the core by placing at least one flat side of the waveguide in contact with a flat surface of a heat sink.

96. The method of claim 91, including conditioning the input laser beam to have a super-Gaussian profile by modifying phases and/or amplitudes across the beam to a desired super-Gaussian order.

97. The method of claim 96, including conditioning the input laser beam to have a lower order super-Gaussian profile.

98. The method of claim 89, wherein the beam is Gaussian.

99. The method of claim 91, including propagating the beam in a zig-zag path through the core.

100. The method of claim 99, including propagating the beam a second time through the core in a second zig-zag path.

101. The method of claim 89, including coupling said beam out of said output aperture with a diffraction grating.

102. The method of claim 89, including coupling said beam out of said output aperture by actuating a liquid crystal material positioned at the aperture to increase index of refraction of the liquid crystal enough to disable waveguiding effect of the aperture to a sufficient extent to outcouple a desired amount of the light beam from the waveguide.

103. The method of claim 102, including steering the outcoupled portion of the beam to propagate in a desired direction in relation to the output aperture by selectively actuating spaced-apart portions of the liquid crystal in a manner that creates an optical grating with a desired density to refract the outcoupled beam to the desired direction.

104. The method of claim 102, including capturing the outcoupled beam into a second waveguide that has an input aperture positioned adjacent said liquid crystal material.

105. The method of claim 89, including extending the elongated, self-imaging waveguide to the point of delivery of the beam by twisting and bending the elongated, self-imaging, waveguide a sufficient amount to avoid any adjacent obstacles, but not so much as to cause optical distortion of the desired phase and amplitude profile at the output aperture.

106. The method of claim 89, including controlling phase of the beam as the beam propagates in the waveguide by positioning a diffractive material in a wall of the waveguide and applying a voltage across the diffractive material in a manner that changes index of refraction of the diffractive material to an extent needed to modify phase of the propagating beam to a desired phase.

107. The method of claim 106, wherein the diffractive material is liquid crystal.

108. The method of claim 89 including controlling wavelength of the beam as the beam propagates in the waveguide by positioning a diffractive material in a wall of the waveguide and applying a voltage across the diffractive material in a manner that changes index of refraction of the diffractive material to an extent needed to couple light of undesired wavelengths out of the waveguide through the diffractive material.

109. The method of claim 108, wherein the diffractive material is liquid crystal.

110. The method of claim 89, including controlling the phase of the beam propagating in the waveguide by squeezing the waveguide to deform the waveguide a sufficient amount to shift the phase of the beam.

111. The method of claim 89, including splitting the beam by:
positioning two outlet apertures in a common plane on opposite waveguiding sides of the waveguide and at a distance of WSIP×i from the inlet aperture;
positioning a multi-mode, rectangular, self-imaging, first branch waveguide, which has a first branch inlet aperture and a first branch outlet aperture spaced from each other by a distance of WSIP×i, adjacent one of the two outlet apertures of the waveguide and coupling a first portion of the beam from said one of the two outlet apertures into the first branch inlet aperture; and
positioning a multi-mode, rectangular, self-imaging, second branch waveguide, which has a second branch inlet aperture and a second branch outlet aperture spaced from each other by a distance of WSIP×i, adjacent the other one of the two outlet apertures of the waveguide and coupling a second portion of the beam from said one of the two outlet apertures into the second branch inlet aperture.

112. The method of claim 111, including:
coupling said first portion of the beam out of said first branch outlet; and coupling said second portion of the beam out of said second branch outlet.

113. The method of claim 111, including:
positioning a diffractive window in each of the two outlets of the waveguide; and
actuating the diffractive windows to couple desired amounts of light out of the waveguide in the first portion of the beam and in the second portion of the beam.

114. The method of claim 113, wherein the diffractive window comprises liquid crystal.

115. The method of claim 114, including actuating the respective liquid crystal windows by varying voltages across them.

116. A method of delivering a high power, composite beam with a desired spatial profile to an application, comprising:
assembling a plurality of multi-mode, rectangular, self-imaging, waveguides of equal cross-sectional dimensions and of equal length between respective inlet and outlet apertures of the waveguides into an array with the outlet apertures of all of the waveguides in a common plane;
producing a plurality of high power laser beams that are phase-matched to each other and that have the desired spatial profile;
coupling the plurality of laser beams into respective input apertures of the plurality of waveguides so that the laser beams propagate through separate waveguides to the outlet apertures in the common plane; and
coupling the laser beams out of the waveguides in a composite high power laser beam that has the desired spatial profile.

117. The method of claim 116, including producing the high power laser beams with a super-Gaussian spatial profile.

118. The method of claim 117, including producing the high power laser beams with a low order super-Gaussian spatial profile.

119. A method of transporting an image, comprising:
producing a plurality of phase-matched laser beams each of which comprises an integral portion of a composite image; and
coupling each of the beams into a respective one of an array of rectangular, multi-mode, self-imaging waveguides and maintaining respective positions of the waveguides in relation to each other at respective outlet apertures of the waveguides in a common outlet plane.

120. The method of claim 119, including coupling each of the laser beams from the respective outlet apertures to a photodetector array.

121. A method of delivering a synthesized, high power, laser beam with a desired spatial profile, comprising:
producing a plurality of phase-matched, high power laser beams with the desired spatial profile;
coupling the laser beams into input apertures of respective ones of a plurality of elongated, multi-mode, rectangular, self-imaging; waveguides, each waveguide having at least one outlet aperture spaced at a distance of $WSIP \times i$ from the inlet aperture of such waveguide; and
coupling the laser beams out of said outlet apertures and directing them to a common point.

122. The power scalable optical system for a high power, super-Gaussian laser beam of claim 2, including a multi-mode, self-imaging transport waveguide coupled optically to said amplifier to receive and transmit said high power, super-Gaussian laser beam to at least one output aperture that is positioned in a re-imaging plane of the transport waveguide.

123. The power scalable optical system for a high power, super-Gaussian laser beam of claim 45, including a multi-mode, self-imaging transport waveguide coupled optically to said laser resonator to receive and transmit said high power, super-Gaussian laser beam to at least one output aperture that is positioned in a re-imaging plane of the transport waveguide.

* * * * *

UNITED STATES PATENT AND TRADEMARK OFFICE
CERTIFICATE OF CORRECTION

| | | |
|---|---|---|
| PATENT NO. | : 7,042,631 B2 | Page 1 of 1 |
| APPLICATION NO. | : 10/117445 | |
| DATED | : May 9, 2006 | |
| INVENTOR(S) | : Duane D. Smith et al. | |

It is certified that error appears in the above-identified patent and that said Letters Patent is hereby corrected as shown below:

Column 13, line 26, Replace Circular distribution figure (1) with:

$$I(x,y) \propto \exp\left[-\left[\frac{x^2+y^2}{w_0^2}\right]^{S_{exp}}\right]$$

Column 13, line 29, Replace Square distribution figure (2) with:

$$I(x,y) \propto \exp\left[-\left[\frac{x^2}{W_x^2}\right]^{S_{exp}} -\left[\frac{y^2}{W_x^2}\right]^{S_{exp}}\right]$$

Column 13, line 35, Replace Rectangular distribution figure (4) with:

$$I(x,y) \propto \exp\left[-\left[\frac{x^2}{W_x^2}\right]^{S_{exp}} -\left[\frac{y^2}{W_y^2}\right]^{S_{exp}}\right]$$

Signed and Sealed this

Twenty-sixth Day of December, 2006

JON W. DUDAS
*Director of the United States Patent and Trademark Office*